United States Patent
Kim et al.

(10) Patent No.: US 12,514,052 B2
(45) Date of Patent: Dec. 30, 2025

(54) LIGHT EMITTING ELEMENT AND DISPLAY DEVICE INCLUDING THE SAME

(71) Applicant: Samsung Display Co., LTD., Yongin-si (KR)

(72) Inventors: Buem Joon Kim, Hwaseong-si (KR); Jong Hyuk Kang, Suwon-si (KR); Won Ho Lee, Suwon-si (KR); Hyun Deok Im, Seoul (KR); Eun A Cho, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1087 days.

(21) Appl. No.: 17/522,373

(22) Filed: Nov. 9, 2021

(65) Prior Publication Data

US 2022/0328558 A1    Oct. 13, 2022

(30) Foreign Application Priority Data

Apr. 8, 2021    (KR) ......................... 10-2021-0045665

(51) Int. Cl.
   *H10H 20/00*      (2025.01)
   *H10H 20/01*      (2025.01)
   (Continued)

(52) U.S. Cl.
   CPC ........ *H10H 29/142* (2025.01); *H10H 20/018* (2025.01); *H10H 20/821* (2025.01);
   (Continued)

(58) Field of Classification Search
   CPC ........... H10H 20/8131; H10H 20/8132; H10H 20/813; H10H 20/8133; H10H 20/819;
   (Continued)

(56) References Cited

U.S. PATENT DOCUMENTS

| 10,784,240 B2 | 9/2020 | Jang et al. |
| 10,886,327 B2 | 1/2021 | Chae et al. |

(Continued)

FOREIGN PATENT DOCUMENTS

| KR | 10-2012-0064838 | 6/2012 |
| KR | 10-2016-0059576 | 5/2016 |

(Continued)

OTHER PUBLICATIONS

International Search Report corresponding to International Application No. PCT/KR2021/015380 dated Feb. 7, 2022.

(Continued)

*Primary Examiner* — Reema Patel
(74) *Attorney, Agent, or Firm* — Womble Bond Dickinson (US) LLP

(57) ABSTRACT

A light emitting element includes a core structure, which includes a first light emitting element core, a second light emitting element core spaced apart from the first light emitting element core, and a first bonding layer between the first light emitting element core and the second light emitting element core, each of the first light emitting element core and the second light emitting element core includes a first semiconductor layer, a second semiconductor layer spaced apart from the first semiconductor layer, and an element active layer between the first semiconductor layer and the second semiconductor layer, and a stacking direction of the first semiconductor layer, the element active layer, and the second semiconductor layer of the first light emitting element core is opposite to a stacking direction of the first semiconductor layer, the element active layer and the second semiconductor layer of the second light emitting element core.

24 Claims, 30 Drawing Sheets

(51) Int. Cl.
- *H10H 20/821* (2025.01)
- *H10H 20/832* (2025.01)
- *H10H 20/84* (2025.01)
- *H10H 29/14* (2025.01)

(52) U.S. Cl.
CPC .......... *H10H 20/835* (2025.01); *H10H 20/84* (2025.01); *H10H 20/034* (2025.01)

(58) Field of Classification Search
CPC .... H10H 20/821; H10H 29/14; H10H 29/142; H01L 25/0753; H01L 25/0756
See application file for complete search history.

(56) References Cited

U.S. PATENT DOCUMENTS

| | | |
|---|---|---|
| 2020/0365568 A1 | 11/2020 | Jang et al. |
| 2020/0373284 A1 | 11/2020 | Jang et al. |
| 2021/0126044 A1 | 4/2021 | Chae et al. |
| 2022/0085247 A1* | 3/2022 | Do ................ H10H 20/857 |

FOREIGN PATENT DOCUMENTS

| | | | |
|---|---|---|---|
| KR | 10-2020-0088822 | 7/2020 | |
| KR | 10-2020-0088934 | 7/2020 | |
| KR | 10-2020-0088959 | 7/2020 | |
| KR | 10-2020-0096546 | 8/2020 | |
| WO | WO-2020149474 A1 * | 7/2020 | ......... H01L 25/0753 |
| WO | 2020/231108 | 11/2020 | |

OTHER PUBLICATIONS

Written Opinion corresponding to International Application No. PCT/KR2021/015380 dated Feb. 7, 2022.

* cited by examiner

DR2 ↑ → DR1, DR3

AA_3: AA1_3, AA2_3, AA3, AA4
ED: 30, 38_1
ED: ED_A, ED_B, ED_C, ED_D
30: 30A, 30B, 39

200_2: 210, 220, 230
400_2: 410, 420, 430
700_3: 710_1, 720_3, 730_3, 740, 750
710_1: 711_1, 712
720_3: 721_3, 722_3, 723_3, 724_3
730_2: 731_2, 732_2, 733_2, 734_2
740: 741, 742, 743, 744
750: 751, 752, 753, 754

ED_2: 30_1, 38
30_1: 30A_1, 30B_1, 39
37A, 37B: 371, 372, 373, 374

OP1_1: OP1_A, OP1_B
OP2_1: OP2_A, OP2_B, OP2_C
ED_3: 30_3, 38_3
30_3: 30A, 30B, 30C, 30D, 39_3
39_3: 39A, 39B, 39C
700_4: 710_4, 720_4
400: 410, 420
200: 210, 220
520_1: 521, 522, 523, 524, 525

LIGHT EMITTING ELEMENT AND DISPLAY DEVICE INCLUDING THE SAME

CROSS-REFERENCE TO RELATED APPLICATION(S)

This application claims priority to and benefits of Korean Patent Application No. 10-2021-0045665 under 35 U.S.C. § 119 filed on Apr. 8, 2021 in the Korean Intellectual Property Office, the entire contents of which are incorporated herein by reference.

BACKGROUND

1. Technical Field

The disclosure relates to a light emitting element and a display device including the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a light emitting element capable of omitting a deflection alignment process by fixing light emitting element cores, each including a first semiconductor layer, an element active layer disposed on the first semiconductor layer, and a second semiconductor layer disposed on the element active layer, such that they are symmetrical to each other with respect to a bonding layer.

Aspects of the disclosure also provide a display device including the light emitting element.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, the light emitting element may include a core structure extending in a first direction, wherein the core structure may include a first light emitting element core extending in the first direction; a second light emitting element core spaced apart from the first light emitting element core and extending in the first direction; and a first bonding layer disposed between the first light emitting element core and the second light emitting element core, each of the first light emitting element core and the second light emitting element core may include a first semiconductor layer; a second semiconductor layer spaced apart from the first semiconductor layer; and an element active layer disposed between the first semiconductor layer and the second semiconductor layer, and a stacking direction of the first semiconductor layer, the element active layer, and the second semiconductor layer of the first light emitting element core may be opposite to a stacking direction of the first semiconductor layer, the element active layer and the second semiconductor layer of the second light emitting element core.

In an embodiment, the first semiconductor layer, the element active layer in the first light emitting element core, and the second semiconductor layer may be sequentially disposed in the first direction, and the first semiconductor layer, the element active layer, and the second semiconductor layer in the second light emitting element core may be sequentially disposed in a direction opposite to the first direction.

In an embodiment, the second light emitting element core may be spaced apart from the first light emitting element core in the first direction.

In an embodiment, the first semiconductor layer of each of the first light emitting element core and the second light emitting element core may be doped with a first conductivity type dopant, and the second semiconductor layer of each of the first light emitting element core and the second light emitting element core may be doped with a second conductivity type dopant.

In an embodiment, the first conductivity type may be an n type, and the second conductivity type may be a p type.

In an embodiment, the first semiconductor layer of the first light emitting element core may be disposed at a first end of the light emitting element, and the first semiconductor layer of the second light emitting element core may be disposed at a second end of the light emitting element.

In an embodiment, the core structure may have a symmetrical structure with respect to a reference line passing through a center of the core structure in a second direction intersecting the first direction.

In an embodiment, the light emitting element may further include an element insulating film surrounding a side surface of the core structure.

In an embodiment, each of the first light emitting element core and the second light emitting element core may further include a reflective electrode layer, the reflective electrode layer of the first light emitting element core may be disposed between the second semiconductor layer of the first light emitting element core and the first bonding layer, and the reflective electrode layer of the second light emitting element core may be disposed between the second semiconductor layer of the second light emitting element core and the first bonding layer.

In an embodiment, the reflective electrode layer may include a high reflectivity metal material or a distributed Bragg reflector (DBR) layer.

In an embodiment, the first bonding layer may include a eutectic metal alloy or a fusible metal alloy.

In an embodiment, the first bonding layer may electrically connect the first light emitting element core to the second light emitting element core.

In an embodiment, the core structure further may include a third light emitting element core disposed between the first light emitting element core and the first bonding layer; a fourth light emitting element core disposed between the second light emitting element core and the first bonding layer; a second bonding layer disposed between the first light emitting element core and the third light emitting element core; and a third bonding layer disposed between the second light emitting element core and the fourth light emitting element core.

In an embodiment, each of the third light emitting element core and the fourth light emitting element core may include a first semiconductor layer; a second semiconductor layer spaced apart from the first semiconductor layer; and an element active layer disposed between the first semiconductor layer and the second semiconductor layer.

In an embodiment, a stacking direction of the first semiconductor layer, the element active layer, and the second semiconductor layer of the third light emitting element core may be same as a stacking direction of the second light emitting element core, and a stacking direction of the first semiconductor layer, the element active layer, and the second semiconductor layer of the fourth light emitting element core may be same as a stacking direction of the first light emitting element core.

In an embodiment, a length of the first semiconductor layer of the first light emitting element core may be greater than a length of the second semiconductor layer of the first light emitting element core, a length of the first semiconductor layer of the second light emitting element core may be greater than a length of the second semiconductor layer of the second light emitting element core, and the first semiconductor layer of the first light emitting element core and the first semiconductor layer of the second light emitting element core may be disposed at both ends of the light emitting element, respectively According to an embodiment, the display device may include a first electrode and a second electrode disposed on the substrate and spaced apart from each other; and a light emitting element disposed between the first electrode and the second electrode and including a core structure extending in a first direction, wherein the core structure may include a first light emitting element core extending in the first direction; a second light emitting element core spaced apart from the first light emitting element core and extending in the first direction; and a bonding layer disposed between the first light emitting element core and the second light emitting element core, wherein each of the first light emitting element core and the second light emitting element core may include a first semiconductor layer; a second semiconductor layer spaced apart from the first semiconductor layer; and an element active layer disposed between the first semiconductor layer and the second semiconductor layer; and a stacking direction of the first semiconductor layer, the element active layer, and the second semiconductor layer of the first light emitting element core may be opposite to a stacking direction of the first semiconductor layer, the element active layer and the second semiconductor layer of the second light emitting element core.

In an embodiment, the first semiconductor layer, the element active layer, and the second semiconductor layer in the first light emitting element core may be sequentially disposed in the first direction, and the first semiconductor layer, the element active layer, and the second semiconductor layer in the second light emitting element core may be sequentially disposed in a direction opposite to the first direction.

In an embodiment, the first semiconductor layer of the first light emitting element core may be disposed at a first end of the light emitting element, and the first semiconductor layer of the second light emitting element core may be disposed at a second end of the light emitting element.

In an embodiment, the display device may further include a first connection electrode electrically connected to the first electrode and the bonding layer; and a second connection electrode electrically connected to the second electrode and ends of the light emitting element.

In an embodiment, the first connection electrode may electrically contact a portion of the first electrode and a portion of the bonding layer; and the second connection electrode may electrically contact a portion of the second electrode and ends of the light emitting element.

In an embodiment, the light emitting element may further include an element insulating film surrounding a side surface of the core structure.

In an embodiment, the element insulating film may expose at least a portion of the bonding layer.

In an embodiment, the first connection electrode may contact the bonding layer exposed by the element insulating film.

In the light emitting element, a first light emitting element core and a second light emitting element core in which semiconductor layers are stacked in opposite directions may be physically bonded by a bonding layer and electrically connected. Since the semiconductor layers of the first light emitting element core and the second light emitting element core are stacked in the opposite directions, the conductivity types of the semiconductor layers disposed at both ends of the light emitting element may be the same. For example, first conductivity type semiconductor layers (for example, n-type semiconductor layers) may be disposed at both ends of the light emitting element. Further, the light emitting element may have a symmetrical structure with respect to the reference line passing through the center of the light emitting element in the other direction intersecting one direction that is an extension direction.

Since the light emitting element has the symmetrical structure, the semiconductor layers having the same specific or given conductivity type (n-type semiconductor layers or p-type semiconductor layers) may be disposed at both ends of the light emitting element. Therefore, the deflection alignment process of aligning the semiconductor layers having the or given conductivity type (n-type semiconductor layers or p-type semiconductor layers) of the light emitting element in the same direction may be omitted in the manufacturing process of the display device. Further, since the additional deflection alignment process may be omitted, it is possible to improve the efficiency of the manufacturing process of the display device. Further, due to the symmetrical structure of the light emitting element, the semiconductor layers having the specific or given conductivity type (n-type semiconductor layers or p-type semiconductor layers) of the light emitting element are aligned in the same direction without the additional deflection alignment process, so that the luminous efficiency of the light emitting element can be improved.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
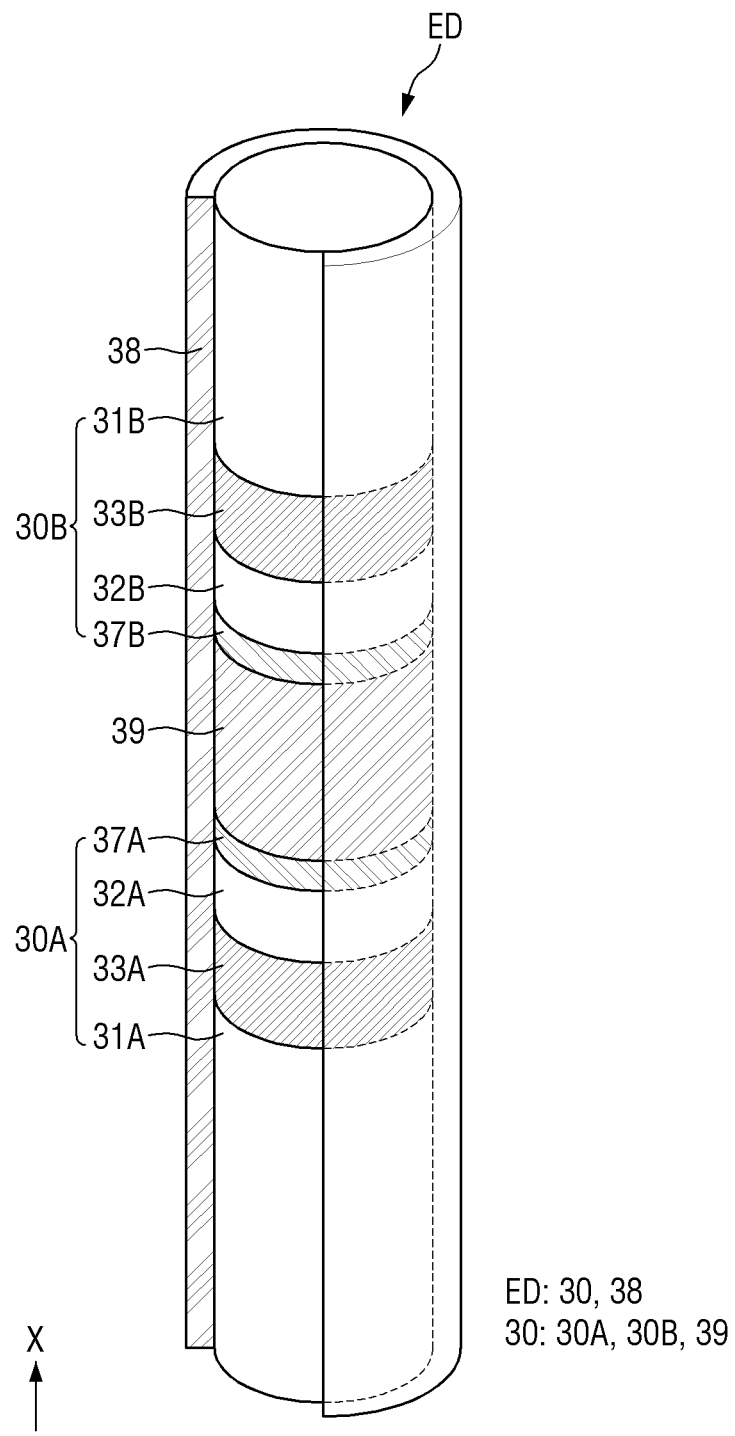
FIG. 1 is a schematic perspective view of a light emitting element according to one embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that in case that an element (or a region, a layer, a portion, or the like) is referred to as "being on", "connected to" or "coupled to" or "contacted" another element in the specification, it can be directly disposed on, connected or coupled or contacted to another element mentioned above, or intervening elements may be disposed therebetween.

It will be understood that the terms "connected to" or "coupled to" or "contact" may include a physical or electrical connection or coupling or contact.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In case that an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof in case that used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments may be combined or combined with each other, in part or in whole, and other variations are possible within the spirit sand the scope of the disclosure. Each embodiment may be implemented independently of each other or may be implemented together in an association.

Hereinafter, embodiments will be described with reference to the drawings.

Figure 2:
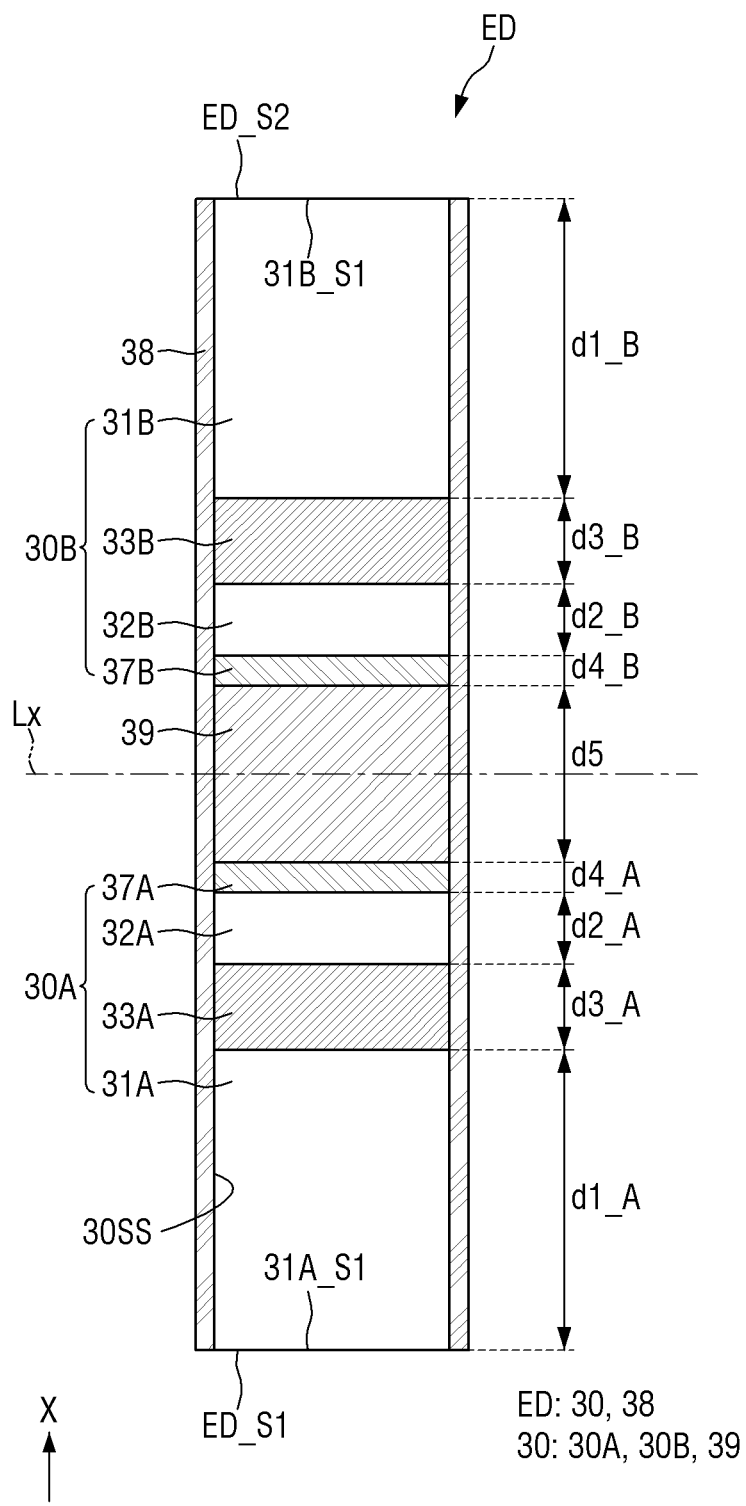
FIG. 2 is a schematic cross-sectional view of a light emitting element according to one embodiment.

FIG. 1 is a schematic perspective view of a light emitting element according to one embodiment. FIG. 2 is a schematic cross-sectional view of a light emitting element according to one embodiment.

Referring to FIGS. 1 and 2, a light emitting element ED according to one embodiment, which is a particulate element, may have a shape extending in one direction or in a direction. The light emitting element ED may have a rod, tube or cylindrical shape having an aspect ratio. The length of the light emitting element ED may be larger than the diameter of the light emitting element ED, and the aspect ratio may be in a range of about 6:5 to about 100:1, but the disclosure is not limited thereto. Shapes described in the specification also include shapes substantial to the described shapes.

The light emitting element ED may have a size of a nanometer scale (equal to or greater than about 1 nm and less than about 1 μm) to a micrometer scale (equal to or greater than 1 about μm and less than about 1 mm). In one embodiment, both the diameter and the length of the light emitting element ED may be on a nanometer scale, or on a micrometer scale. In embodiments, the diameter of the light emitting element ED may be on a nanometer scale, while the length of the light emitting element ED may be on a micrometer scale. In an embodiment, some or a number of the light emitting elements ED may have a diameter and/or length on a nanometer scale, while some others or a number of the light emitting elements ED may have a diameter and/or length on a micrometer scale.

The light emitting element ED may include an inorganic light emitting diode. The inorganic light emitting diode may include semiconductor layers. For example, the inorganic light emitting diode may include a first conductivity type (for example, n-type) semiconductor layer (or a first semiconductor layer), a second conductivity type (for example, a p-type) semiconductor layer (or a second semiconductor layer, and an active semiconductor layer (or an element active layer) interposed therebetween. The active semiconductor layer may receive holes and electrons from the first conductivity type semiconductor layer and the second conductivity type semiconductor layer, respectively, and the holes and electrons that have reached the active semiconductor layer may be coupled to emit light.

The light emitting element ED according to one embodiment may include a core structure 30 including the semiconductor layers and an element insulating film 38 surrounding the outer peripheral surface of the core structure 30.

The core structure 30 may have a shape extending in one direction X. The shape of the core structure 30 may follow the shape of the light emitting element ED. The shape of the core structure 30 may a rod or cylindrical shape, similar to the shape of the light emitting element ED.

Hereinafter, in embodiments describing the light emitting element ED, unless otherwise noted, the term "upward" refers to one side or a side in the one direction X where a second light emitting element core 30B is disposed with respect to a bonding layer 39 to be described later, and the term "top surface" refers to a surface toward one side or a side in the one direction X. In addition, "downward" refers to the other side in the opposite direction to the one direction X, and "bottom surface" refers to a surface toward the other side in the one direction X.

The core structure 30 may include at least two light emitting element cores and the bonding layer 39 disposed between the light emitting element cores. Each of the at least two light emitting element cores may include the semiconductor layers. For example, each of the at least two light emitting element cores may include the first conductivity type (for example, n-type) semiconductor layer, the second conductivity type (for example, a p-type) semiconductor layer, and the active semiconductor layer interposed therebetween. Each of the at least two light emitting element cores may further include a reflective electrode layer disposed on the second conductivity type (for example, p-type) semiconductor layer.

In one embodiment, the core structure 30 may include a first light emitting element core 30A, the second light emitting element core 30B, and the bonding layer 39.

The first light emitting element core 30A may have a shape extending in the one direction X. The first light emitting element core 30A may have a rod or cylindrical shape, similar to the shape of the light emitting element ED. The first light emitting element core 30A may have a shape similar to the shape of the core structure 30. The length of the first light emitting element core 30A may be smaller than the length of the core structure 30, and the diameter of the first light emitting element core 30A may be the same as the diameter of the core structure 30.

The second light emitting element core 30B may be spaced apart from the first light emitting element core 30A in the one direction X. The second light emitting element core 30B may have a shape extending in the one direction X, similar to the first light emitting element core 30A. The second light emitting element core 30B may have a rod or cylindrical shape, similar to the shape of the light emitting element ED. The second light emitting element core 30B may have a shape similar to the shape of the core structure 30. The length of the second light emitting element core 30B may be smaller than the length of the core structure 30, and the diameter of the second light emitting element core 30B may be the same as the diameter of the core structure 30.

The shape of the second light emitting element core 30B may be substantially the same as the shape of the first light emitting element core 30A. Although not limited to the following, the length of the first light emitting element core 30A and the length of the second light emitting element core 30B may be the same. Further, the diameter of the first light emitting element core 30A and the diameter of the second light emitting element core 30B may be the same. The side surface of the first light emitting element core 30A and the side surface of the second light emitting element core 30B may be aligned side by side.

The first light emitting element core 30A may include a first semiconductor layer 31A, a second semiconductor layer 32A, and an element active layer 33A disposed therebetween. The first light emitting element core 30A may further include a reflective electrode layer 37A disposed on the second semiconductor layer 32A. The second semiconductor layer 32A of the first light emitting element core 30A may be disposed between the element active layer 33A of the first light emitting element core 30A and the reflective electrode layer 37A of the first light emitting element core 30A. On the other hand, the first semiconductor layer may be the first conductivity type (for example, n-type) semiconductor layer, and the second semiconductor layer may be the second conductivity type (for example, p-type) semiconductor layer. Therefore, hereinafter, the first semiconductor layer 31A of the first light emitting element core 30A may also be referred to as a first n semiconductor layer 31A, the second semiconductor layer 32A of the first light emitting element core 30A may also be referred to as a first p semiconductor layer 32A, the element active layer 33A of the first element semiconductor core 30A may also be referred to as a first element active layer 33A, and the reflective electrode layer 37A of the first light emitting element core 30A may also be referred to as a first reflective electrode layer 37A.

The first n semiconductor layer 31A may be doped with a first conductivity type dopant. The first conductivity type dopant may be Si, Ge, Sn, or the like within the spirit and the scope of the disclosure. In an embodiment, the first n semiconductor layer 31A may be n-GaN doped with n-type Si.

The first p semiconductor layer 32A may be spaced apart from the first n semiconductor layer 31A with the first element active layer 33A interposed therebetween. The first p semiconductor layer 32A may be doped with a second conductivity type dopant such as Mg, Zn, Ca, Se, Ba, or the like within the spirit and the scope of the disclosure. In an embodiment, the first p semiconductor layer 32A may be p-GaN doped with p-type Mg.

The first element active layer 33A may include a material having a single or multiple quantum well structure. As described above, the first element active layer 33A may emit the light due to coupling of electron-hole pairs in response to the electrical signal applied through the first n semiconductor layer 31A and the first p semiconductor layer 32A.

In an embodiment, the first element active layer 33A may have a structure in which semiconductor materials having large band gap energy and semiconductor materials having small band gap energy may be alternately stacked each other, and may include other group III to V semiconductor materials according to the wavelength band of the emitted light.

The first reflective electrode layer 37A may be disposed on the first p semiconductor layer 32A. The first p semiconductor layer 32A may be disposed between the first reflective electrode layer 37A and the first element active layer 33A. The first reflective electrode layer 37A may be in contact with each of the first p semiconductor layer 32A and the bonding layer 39.

The first reflective electrode layer 37A may serve to change the traveling direction of the light emitted from the first element active layer 33A of the first light emitting element core 30A to the center of the core structure 30 toward a first end ED_S1 of the light emitting element ED.

Further, the first reflective electrode layer 37A may be an ohmic contact electrode, and may be a Schottky contact electrode without being limited thereto. In case that both ends of the first light emitting element core 30A are electrically connected to a connection electrode to apply an electrical signal to the first n semiconductor layer 31A and the first p semiconductor layer 32A, the first reflective electrode layer 37A may be disposed between the first p semiconductor layer 32A and the connection electrode to reduce resistance. In one embodiment, the first reflective electrode layer 37A may contain a metal material having high reflectivity. For example, the first reflective electrode layer 37A may contain at least one of aluminum (Al) or silver (Ag), but the disclosure is not limited thereto.

By using the ohmic electrode having high reflectivity as the first reflective electrode layer 37A, in case that the light emitting element ED is disposed in the display device 10, it is possible to reduce a driving voltage and improve light extraction from the light emitting element ED.

The second light emitting element core 30B may have a shape extending in the one direction X. Similar to the first light emitting element core 30A, the second light emitting element core 30B may include a first semiconductor layer 31B, a second semiconductor layer 32B, and an element active layer 33B disposed between the first semiconductor layer 31B and the second semiconductor layer 32B. The second light emitting element core 30B may further include a reflective electrode layer 37B disposed on the second semiconductor layer 32B. The second semiconductor layer 32B of the second light emitting element core 30B may be disposed between the reflective electrode layer 37B of the second light emitting element core 30B and the active element layer 33B of the second light emitting element core 30B. Hereinafter, the first semiconductor layer 31B of the second light emitting element core 30B may also be referred to as a second n semiconductor layer 31B, the second semiconductor layer 32B of the second light emitting element core 30B may also be referred to as a second p semiconductor layer 32B, the element active layer 33B of the second light emitting element core 30B may also be referred to as a second element active layer 33B, and the reflective electrode layer 37B of the second light emitting element core 30B may also be referred to as a second reflective electrode layer 37B.

The second n semiconductor layer 31B may be doped with the first conductivity type dopant. The first conductivity type dopant may be Si, Ge, Sn, or the like within the spirit and the scope of the disclosure. The second n semiconductor layer 31B may contain the same material or a similar material as that of the first n semiconductor layer 31A, and may have substantially the same structure as that of the first n semiconductor layer 31A. In an embodiment, the second n semiconductor layer 31B may be n-GaN doped with n-type Si.

The second p semiconductor layer 32B may be spaced apart from the second n semiconductor layer 31B with the second element active layer 33B interposed therebetween. The second p semiconductor layer 32B may be doped with a second conductivity type dopant such as Mg, Zn, Ca, Se, Ba, or the like within the spirit and the scope of the disclosure. The second p semiconductor layer 32B may contain the same material or a similar material as that of the first p semiconductor layer 32A, may have substantially the same structure as that of the first p semiconductor layer 32A. In an embodiment, the second p semiconductor layer 32B may be p-GaN doped with p-type Mg.

The second element active layer 33B may include a material having a single or multiple quantum well structure. As described above, the second element active layer 33B may emit the light due to coupling of electron-hole pairs in response to the electrical signal applied through the second n semiconductor layer 31B and the second p semiconductor layer 32B. The second element active layer 33B may contain the same material or a similar material as that of the first element active layer 33A, and may have substantially the same structure as that of the first element active layer 33A.

The second reflective electrode layer 37B may be disposed on the second p semiconductor layer 32B. The second p semiconductor layer 32B may be disposed between the second reflective electrode layer 37B and the second element active layer 33B. The second reflective electrode layer 37B may be in contact with each of the second p semiconductor layer 32B and the bonding layer 39. The second reflective electrode layer 37B may contain the same material or a similar material as that of the first reflective electrode layer 37A, and may have substantially the same structure as that of the first reflective electrode layer 37A.

The second reflective electrode layer 37B may serve to change the traveling direction of the light emitted from the second element active layer 33B of the second light emitting element core 30B to the center of the core structure 30 toward a second end ED_S2 of the light emitting element ED.

Further, the second reflective electrode layer 37B may be an ohmic contact electrode, and may be a Schottky contact electrode without being limited thereto. In case that both ends of the second light emitting element core 30B are electrically connected to a connection electrode to apply an electrical signal to the second n semiconductor layer 31B and the second p semiconductor layer 32B, the second reflective electrode layer 37B may be disposed between the second p semiconductor layer 32B and the connection electrode to reduce resistance. In one embodiment, the second reflective electrode layer 37B may contain a metal material having high reflectivity. For example, the first reflective electrode layer 37A may include at least one of aluminum (Al) or silver (Ag), but the disclosure is not limited thereto.

The stacking direction of the first n semiconductor layer 31A, the first element active layer 33A, the first p semiconductor layer 32A, and the first reflective electrode layer 37A of the first light emitting element core 30A may be opposite to the stacking direction of the second n semiconductor layer 31B, the second element active layer 33B, the second p semiconductor layer 32B, and the second reflective electrode layer 37B of the second light emitting element core 30B. For example, the first n semiconductor layer 31A, the first element active layer 33A, the first p semiconductor layer 32A, and the first reflective electrode layer 37A of the first light emitting element core 30A may be sequentially arranged or disposed along the one direction X, and the second n semiconductor layer 31B, the second element active layer 33B, the second p semiconductor layer 32B, and the second reflective electrode layer 37B of the second light emitting element core 30B may be sequentially arranged or disposed along the opposite direction to the one direction X.

The first light emitting element core 30A and the second light emitting element core 30B may be arranged or disposed such that the first conductivity type semiconductor layers (or the first semiconductor layers or the n-type semiconductor layers) face both ends of the light emitting element ED. For example, the first n semiconductor layer 31A of the first light emitting element core 30A may be located (or arranged or disposed) at the first end ED_S1 of the light emitting element ED, and the second n semiconductor layer 31B of the second light emitting element core 30B may be located (or arranged or disposed) at the second end ED_S2 of the light emitting element ED. For example, the first end ED_S1 of the light emitting element ED may be one end 31A_S1 of the first n semiconductor layer 31A, and the second end ED_S2 of the light emitting element ED may be one end 31B_S1 of the second n semiconductor layer 31B. For example, the first conductivity type semiconductor layers (or the first semiconductor layers or the n-type semiconductor layers) may be disposed at both ends ED_S1 and ED_S2 of the core structure 30. On the other hand, the length of the first conductivity type semiconductor layers (or the first semiconductor layers or the n-type semiconductor layers) of the first light emitting element core 30A and the second light emitting element core 30B may be longer than the length of the second conductivity type semiconductor layers (or the second semiconductor layers or the p-type semiconductor layers) of the first light emitting element core 30A and the second light emitting element core 30B.

The bonding layer 39 may be disposed between the first light emitting element core 30A and the second light emitting element core 30B. The bonding layer 39 may be disposed between the first light emitting element core 30A and the second light emitting element core 30B to physically fix the first light emitting element core 30A and the second light emitting element core 30B, and also may electrically connect the first light emitting element core 30A to the second light emitting element core 30B. For example, the bonding layer 39 may be disposed between the first reflective electrode layer 37A of the first light emitting element core 30A and the second reflective electrode layer 37B of the second light emitting element core 30B to fix and electrically connect them. The bonding layer 39 may be in contact with each of the first reflective electrode layer 37A and the second reflective electrode layer 37B.

The bonding layer 39 may be used to bond a first semiconductor stacked structure WS1 and a second semiconductor stacked structure WS2 in the process of manufacturing the light emitting element ED, as will be described later. The bonding layer 39 may contain a conductive material having a low melting point so that the first semiconductor stacked structure WS1 and the second semiconductor stacked structure WS2 may be readily bonded to each other. For example, the bonding layer 39 may contain a metal material having a melting point at a temperature of about 350° C. or lower, but the disclosure is not limited thereto. In one example, the bonding layer 39 may contain a eutectic alloy, a fusible alloy, or the like within the spirit and the scope of the disclosure.

Further, the bonding layer 39 may be the region in contact with the connection electrode in case that the light emitting element ED is disposed in the display device 10 (see FIG. 11) to be described later. The electrical signal may be applied to the first p semiconductor layer 32A of the first light emitting element core 30A and the second p semiconductor layer 32B of the second light emitting element core 30B through the bonding layer 39.

On the other hand, the side surfaces of the first light emitting element core 30A, the second light emitting element core 30B, and the bonding layer 39 may be aligned side by side.

The core structure 30 may have the symmetrical structure with respect to a reference line Lx passing through the center of the core structure 30 in the other direction intersecting the one direction X. Therefore, in the light emitting element ED, the first n semiconductor layer 31A, the first element active layer 33A, the first p semiconductor layer 32A, the first reflective electrode layer 37A, the bonding layer 39, the second reflective electrode layer 37B, the second p semiconductor layer 32B, the second element active layer 33B, and the second n semiconductor layer 31B may be sequentially stacked each other along the one direction X. Further, since the core structure 30 has the symmetrical structure with respect to the reference line Lx, a thickness $d1\_A$ of the first n semiconductor layer 31A and a thickness $d1\_B$ of the second n semiconductor layer 31B may be substantially the same. A thickness $d2\_A$ of the first p semiconductor layer 32A and a thickness $d2\_B$ of the second p semiconductor layer 32B may be substantially the same. A thickness $d3\_A$ of the first element active layer 33A and a thickness $d3\_B$ of the second element active layer 33B may be substantially the same. Further, a thickness $d4\_A$ of the first reflective electrode layer 37A and a thickness $d4\_B$ of the second reflective electrode layer 37B may be substantially the same.

The bonding layer 39 may have a thickness d5 that is large enough to make the contact with the connection electrode to be described later easier. For example, the thickness d5 of the bonding layer 39 may be greater than the thickness $d4\_A$ of the first reflective electrode layer 37A and the thickness $d4\_B$ of the second reflective electrode layer 37B.

The element insulating film 38 may be disposed to surround a side surface 30SS of the core structure 30. The element insulating film 38 may be disposed to surround at least the side surfaces of the first and second element active layers 33A and 33B, and may extend in the one direction X in which the core structure 30 extends. The element insulating film 38 may perform the function of protecting the semiconductor layers and the element active layers of the first and second light emitting element cores 30A and 30B. Since the element insulating film 38 contains a material having insulating properties, it is possible to prevent an electrical short circuit that may occur in case that an electrode through which an electrical signal is transmitted to the light emitting element ED is in direct contact with the first and second element active layers 33A and 33B. Further, since the element insulating film 38 protects the side surfaces of the semiconductor layers including the first and second element active layers 33A and 33B, it is possible to prevent a decrease in luminous efficiency.

Although it is illustrated in the drawing that the element insulating film 38 extends in the one direction X on the side surface of the core structure 30 to completely cover or overlap the portion from the side surface of the first light emitting element core 30A to the side surface of the second light emitting element core 30B, the disclosure is not limited thereto. For example, the element insulating film 38 may cover or overlap only side surfaces of some or a number of semiconductor layers including the first and second element active layers 33A and 33B, or may cover or overlap a portion of the side surface of the second n semiconductor layer 31B and expose another portion of the side surface of the second n semiconductor layer 31B. Further, although it is illustrated in the drawing that the element insulating film 38 is formed as a single layer, the disclosure is not limited thereto. For example, the element insulating film 38 may have a structure in which insulating layers containing an insulating material may be stacked each other.

In the light emitting element ED according to an embodiment, the first light emitting element core 30A and the second light emitting element core 30B in which the semiconductor layers may be stacked each other in the opposite directions may be physically bonded by the bonding layer 39 and electrically connected. Since the semiconductor layers of the first light emitting element core 30A and the second light emitting element core 30B may be stacked each other in the opposite directions, the conductivity types of the semiconductor layers disposed at both ends of the light emitting element ED may be the same. For example, the first conductivity type semiconductor layers (for example, the n-type semiconductor layers) may be disposed at both ends of the light emitting element ED. Further, the light emitting element ED may have the structure symmetrical with respect to the reference line Lx passing through the center of the light emitting element ED in the other direction intersecting the one direction X.

Since the light emitting element ED has the symmetrical structure, the semiconductor layers having the same specific or given conductivity type (n-type semiconductor layers or p-type semiconductor layers) may be disposed at both ends of the light emitting element ED. Therefore, the deflection alignment process of aligning the semiconductor layers having the specific or given conductivity type (n-type semiconductor layers or p-type semiconductor layers) of the light emitting element ED in the same direction may be omitted in the manufacturing process of the display device 10 (see FIG. 11). Further, since the additional deflection alignment process may be omitted, it is possible to improve the efficiency of the manufacturing process of the display device 10. Further, due to the symmetrical structure of the light emitting element ED, the specific or given conductivity type semiconductor layers (n-type semiconductor layers or p-type semiconductor layers) of the light emitting element ED are aligned in the same direction without the additional deflection alignment process, so that the luminous efficiency of the light emitting element ED can be improved.

FIGS. 3 to 10 are schematic cross-sectional views showing a manufacturing process of a light emitting element according to one embodiment.

In the following, a first direction DD1 and a second direction DD2 are defined in the drawings of an embodiment illustrating the manufacturing process of the light emitting element ED. The first direction DD1 and the second direction DD2 may be perpendicular to each other. In FIGS. 3 to 10, the second direction DD2 may be the direction in which material layers formed on a first base substrate 1000A may be stacked each other.

In an embodiment describing the manufacturing process of the light emitting element ED, unless otherwise noted, the term "upward" refers to one side or a side in the second direction DD2 in which the semiconductor layers of the light emitting element ED may be stacked each other from one surface (or top surface) of the first base substrate 1000A, and the term "top surface" refers to a surface toward the one side or a side in the second direction DD2. Further, the term "downward" refers to the other side in the second direction DD2, and the term "bottom surface" refers to a surface toward the other side in the second direction DD2.

Figure 3:
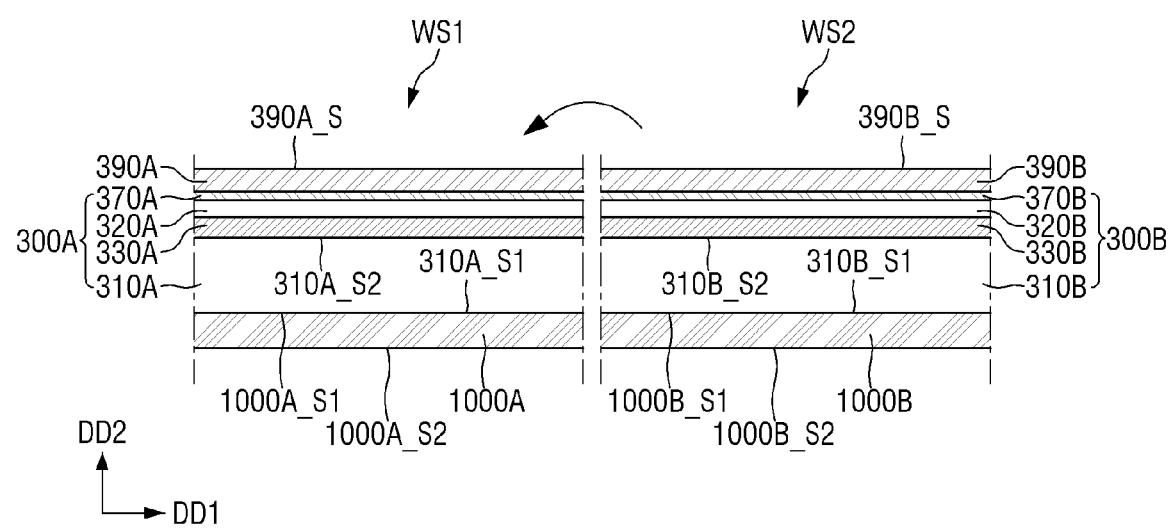
FIGS. 3 to 10 are schematic cross-sectional views showing a manufacturing process of a light emitting element according to one embodiment.

First, referring to FIG. 3, the first semiconductor stacked structure WS1 and the second semiconductor stacked structure WS2 are prepared.

The first semiconductor stacked structure WS1 and the second semiconductor stacked structure WS2 may have substantially the same structure. Hereinafter, the structure of the first semiconductor stacked structure WS1 will be described, and the differences between the second semiconductor stacked structure WS2 and the first semiconductor stacked structure WS1 will be described.

For example, the first semiconductor stacked structure WS1 may include the first base substrate 1000A, a first stacked structure 300A disposed on the first base substrate 1000A, and a first bonding material layer 390A disposed on the first stacked structure 300A.

The first base substrate 1000A may include a transparent substrate such as glass or a sapphire substrate ($Al_xO_y$). In an embodiment, the base substrate 1000A may be a sapphire substrate ($Al_xO_y$).

Although not shown in the drawings, a buffer material layer may be further disposed on one surface or a surface 1000A_S1 of the first base substrate 1000A. The buffer material layer may serve to reduce the difference in the lattice constant between the first base substrate 1100A and a first semiconductor material layer 310A to be described later. The buffer material layer may include an undoped semiconductor. The buffer material layer may contain the same material or a similar material as that of the first semiconductor material layer 310A to be described later, and may contain the first conductivity type dopant or the second conductivity type dopant, for example, a material that is not doped with an n-type or p-type dopant. The buffer material layer may be omitted depending on the type of the first base substrate 1000A.

The first base substrate 1000A may have a first surface 1000A_S1 and a second surface 1000A_S2 that is the opposite surface of the first surface 1000A_S1. The first surface 1000A_S1 of the first base substrate 1000A may be the top surface in FIG. 3, and the second surface 1000A_S2 of the first base substrate 1000A may be the bottom surface in FIG. 3.

The first stacked structure 300A may be disposed on the first surface 1000A_S1 of the first base substrate 1000A. The first surface 1000A_S1 of the first base substrate 1000A on which the first stacked structure 300A is formed may be the top surface of the first base substrate 1000A.

The first stacked structure 300A may include the first semiconductor material layer 310A, an element active material layer 330A, a second semiconductor material layer 320A, and a reflective electrode material layer 370A. The first semiconductor material layer 310A, the element active material layer 330A, the second semiconductor material layer 320A, and the reflective electrode material layer 370A may be sequentially stacked each other on the first surface 1000A_S1 of the first base substrate 1000A. The material layers included in the first stacked structure 300A may be formed by performing a process within the spirit and the scope of the disclosure. A first surface 310A_S1 of the first semiconductor material layer 310A of the first stacked structure 300A disposed on the first base substrate 1000A may face downward, and a second surface 310A_S2 of the first semiconductor material layer 310A of the first stacked structure 300A on which the element active material layer 330A of the first stacked structure 300A is disposed may face upward.

The layers included in the first stacked structure 300A may correspond to the respective layers included in the first light emitting element core 30A according to one embodiment. For example, the first semiconductor material layer 310A, the element active material layer 330A, the second semiconductor material layer 320A, and the reflective electrode material layer 370A of the first stacked structure 300A may correspond to the first semiconductor layer 31A, the element active layer 33A, the second semiconductor layer 32A, and the reflective electrode layer 37A of the first light emitting element core 30A, respectively, and may contain the same material or a similar material as the materials of the respective layers.

The first bonding material layer 390A may be disposed on the first stacked structure 300A. The first bonding material layer 390A may be the layer for bonding the first semiconductor stacked structure WS1 to the second semiconductor stacked structure WS2. The first bonding material layer 390A may contain a conductive material having a low melting point. For example, the first bonding material layer 390A may contain a metal material having a melting point at a temperature of about 350° C. or lower, but the disclosure is not limited thereto. In one example, the first bonding material layer 390A may contain a eutectic alloy, a fusible alloy, or the like within the spirit and the scope of the disclosure.

Similarly, the second semiconductor stacked structure WS2 may include a second base substrate 1000B, a second stacked structure 300B disposed on the second base substrate 1000B, and a second bonding material layer 390B disposed on the second stacked structure 300B.

The second base substrate 1000B may be substantially the same as the first base substrate 1000A. For example, the second base substrate 1000B may include a transparent substrate such as glass or a sapphire substrate ($Al_xO_y$).

The second base substrate 1000B may have a first surface 1000B_S1 and a second surface 1000B_S2 that is the opposite surface of the first surface 1000B_S1. The first surface 1000B_S1 of the second base substrate 1000B may be the top surface in FIG. 3, and the second surface 1000B_S2 of the second base substrate 1000B may be the bottom surface in FIG. 3.

The second stacked structure 300B may be disposed on the first surface 1000B_S1 of the second base substrate 1000B. The first surface 1000B_S1 of the second base substrate 1000B on which the second stacked structure 300B is formed may be the top surface of the second base substrate 1000B.

The second stacked structure 300B may include a first semiconductor material layer 310B, an element active material layer 330B, a second semiconductor material layer 320B, and a reflective electrode material layer 370B. A first surface 310B_S1 of the first semiconductor material layer 310B of the second stacked structure 300B disposed on the second base substrate 1000B may face downward, and a second surface 310B_S2 of the first semiconductor material layer 310B of the second stacked structure 300B on which the element active material layer 330B of the second stacked structure 300B is disposed may face upward.

The layers included in the second stacked structure 300B may correspond to the respective layers included in the second light emitting element core 30B according to one embodiment. For example, the first semiconductor material layer 310B, the element active material layer 330B, the second semiconductor material layer 320B, and the reflective electrode material layer 370B of the second stacked structure 300B may correspond to the first semiconductor layer 31B, the element active layer 33B, the second semiconductor layer 32B, and the reflective electrode layer 37B of the second light emitting element core 30B, respectively, and may contain the same material or a similar material as the materials of the respective layers.

The second bonding material layer 390B may be disposed on the second stacked structure 300B. The second bonding material layer 390B may be the layer for bonding the first semiconductor stacked structure WS1 to the second semiconductor stacked structure WS2. The second bonding material layer 390B may contain the same material or a similar material as that of the first bonding material layer 390A. For example, the second bonding material layer 390B may contain a conductive material having a melting point at a relatively low temperature. The second bonding material layer 390B may contain a metal material having a melting point at a temperature of about 350° C. or lower, but the disclosure is not limited thereto. In one example, the second bonding material layer 390B may include a eutectic alloy, a fusible alloy, or the like within the spirit and the scope of the disclosure.

Figure 4:
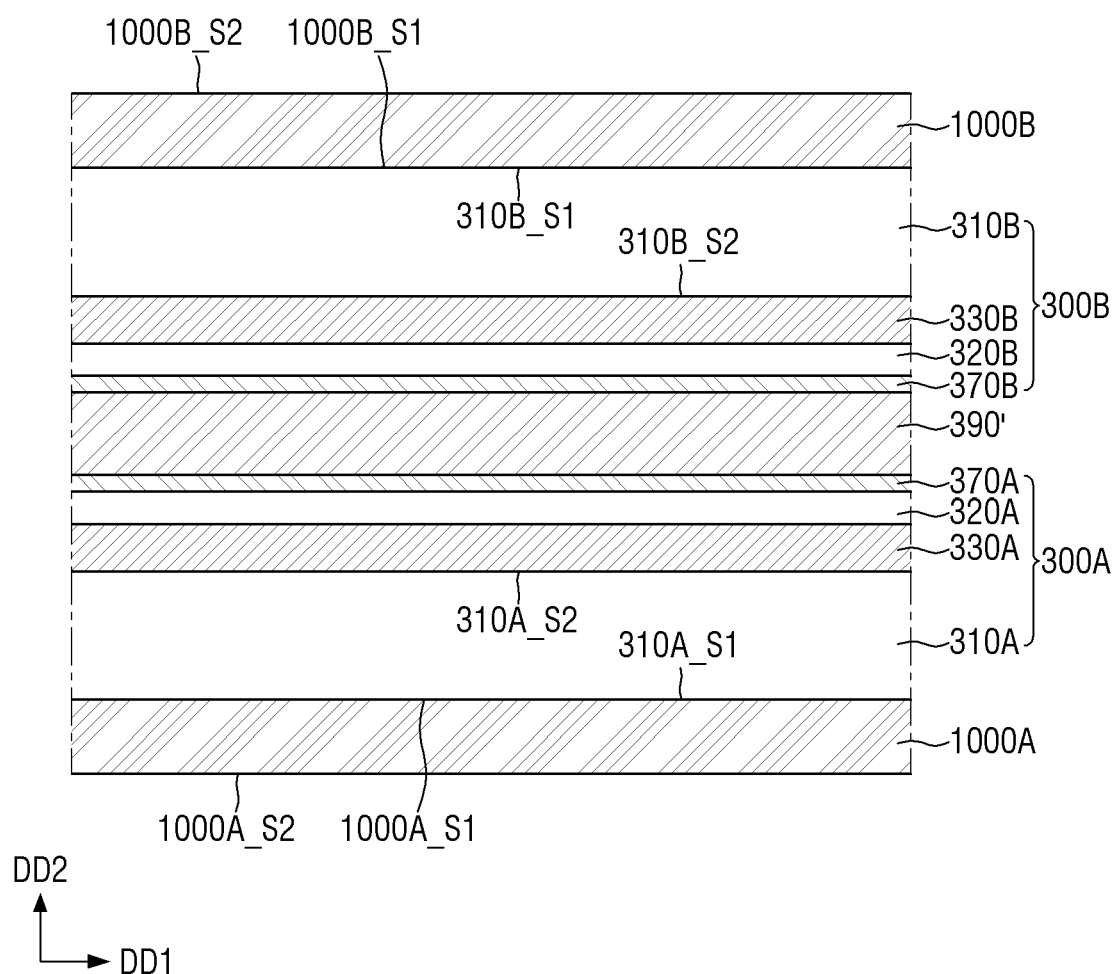

Referring to FIGS. 3 and 4, the first semiconductor stacked structure WS1 and the second semiconductor stacked structure WS2 are bonded.

For example, the first semiconductor stacked structure WS1 and the second semiconductor stacked structure WS2 are bonded. The first semiconductor stacked structure WS1 and the second semiconductor stacked structure WS2 may be bonded using the first bonding material layer 390A of the first semiconductor stacked structure WS1 and the second bonding material layer 390B of the second semiconductor stacked structure WS2. For example, as described above, each of the first bonding material layer 390A and the second bonding material layer 390B may contain a conductive material having a melting point at a relatively low temperature. Therefore, by fusion-bonding the first bonding material layer 390A and the second bonding material layer 390B (welding process), a third bonding material layer 390' in which the first bonding material layer 390A and the second bonding material layer 390B are physically bonded and integrated such that a first surface 390A_S of the first bonding material layer 390A and a first surface 390B_S of the second bonding material layer 390B are in contact with each other may be formed as shown in FIG. 4. The third bonding material layer 390' may correspond to the bonding layer 39 of the light emitting element ED. The first semiconductor stacked structure WS1 and the second semiconductor stacked structure WS2 may be bonded (or fixed) by the third bonding material layer 390' interposed therebetween.

Due to this process, the second semiconductor stacked structure WS2 is reversed upside down, so that the first surface 1000B_S1 of the second base substrate 1000B may face downward and the second surface 1000B_S2 of the second base substrate 1000B may face upward. Further, the first surface 310A_S1 of the first semiconductor material layer 310A of the first stacked structure 300A may face downward, and the first surface 310B_S1 of the first semiconductor material layer 310B of the second stacked structure 300B may face upward.

Figure 5:
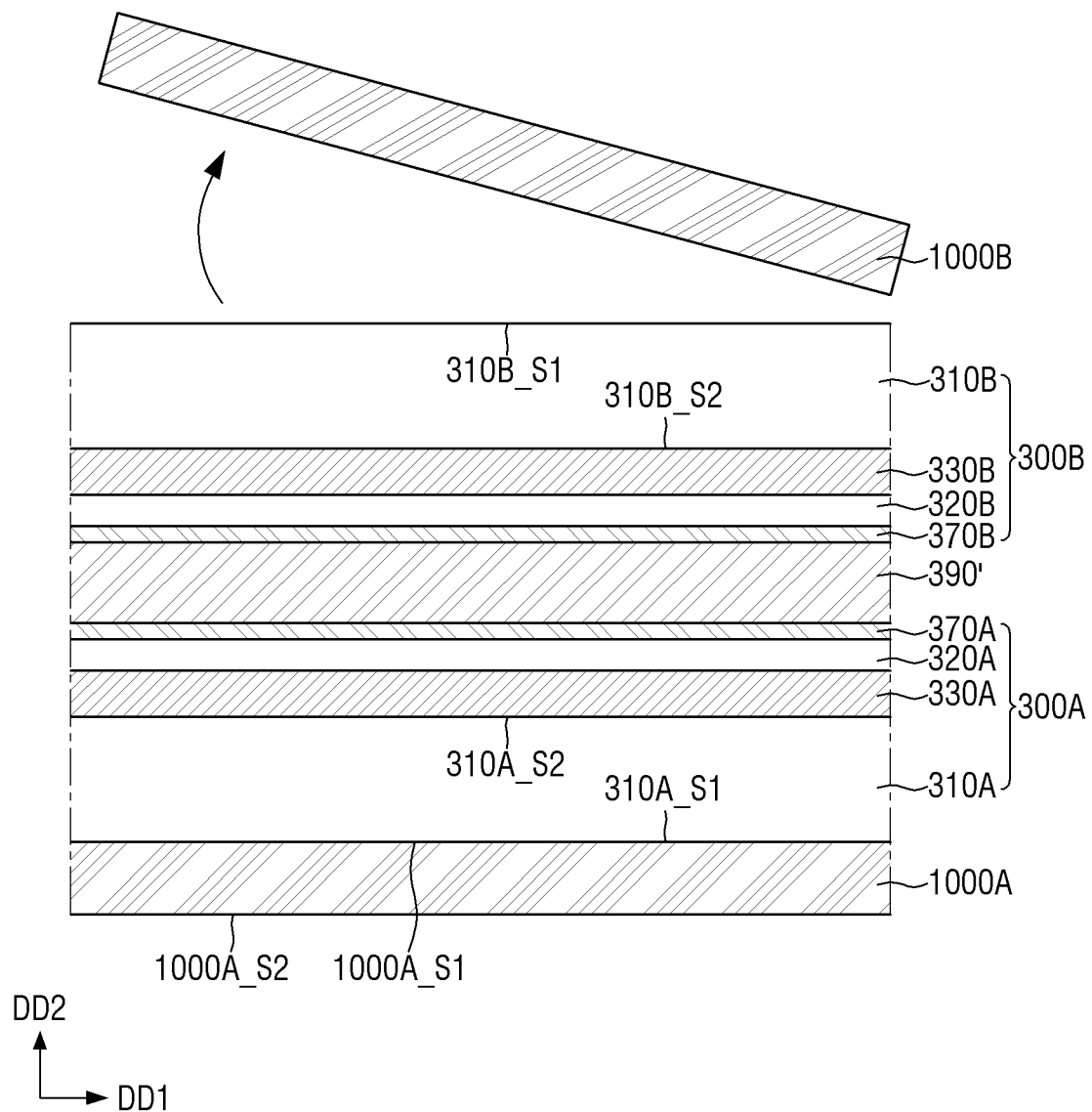

Referring to FIG. 5, the second base substrate 1000B is removed.

For example, the second base substrate 1000B disposed on the first semiconductor material layer 310B of the second stacked structure 300B is removed. The method for removing the second base substrate 1000B is not particularly limited. In an embodiment, the second base substrate 1000B may be removed by a laser lift-off method. Due to this process, the second base substrate 1000B may be removed, and the first surface 310B_S1 of the first semiconductor material layer 310B of the second stacked structure 300B may be exposed.

Figure 6:
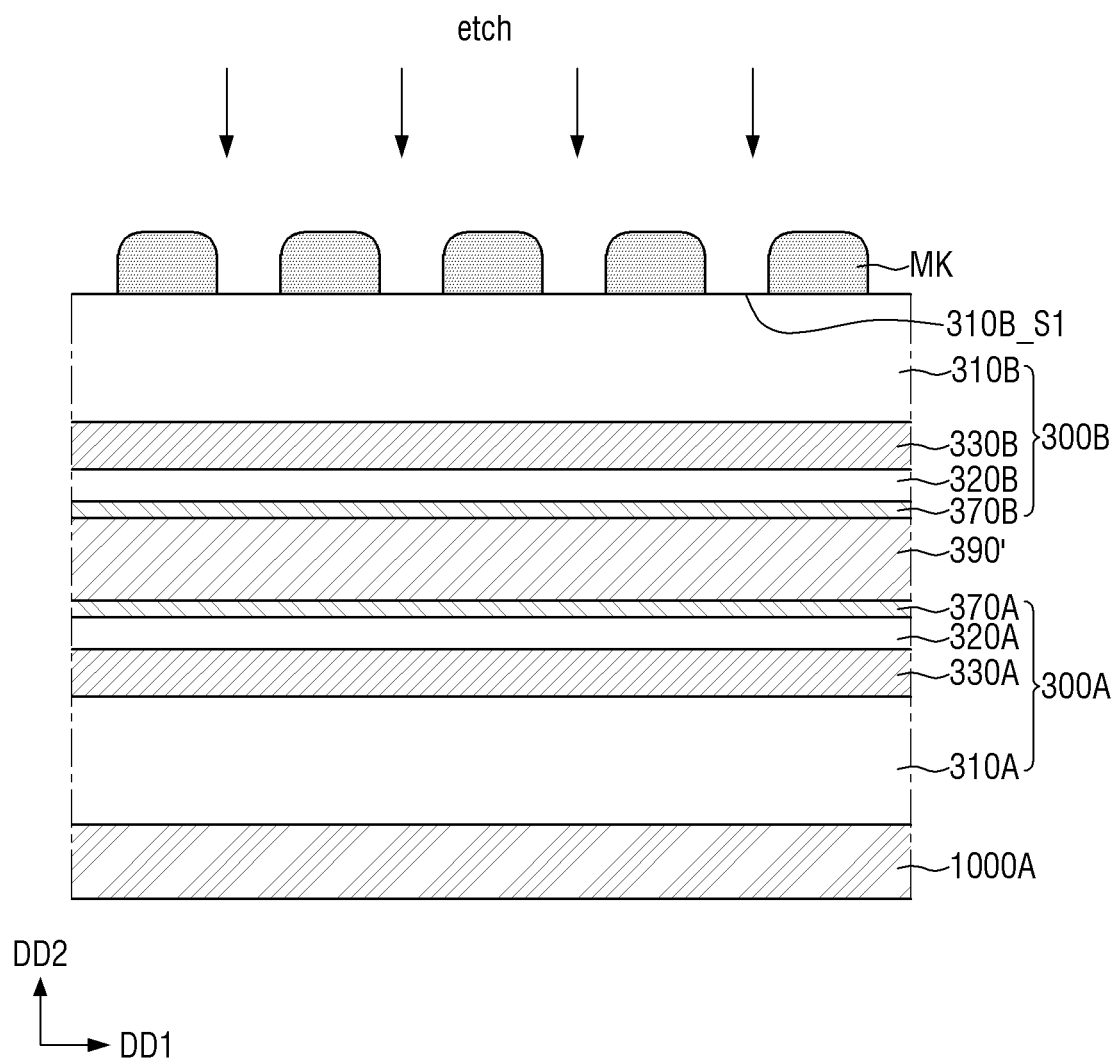
Figure 7:
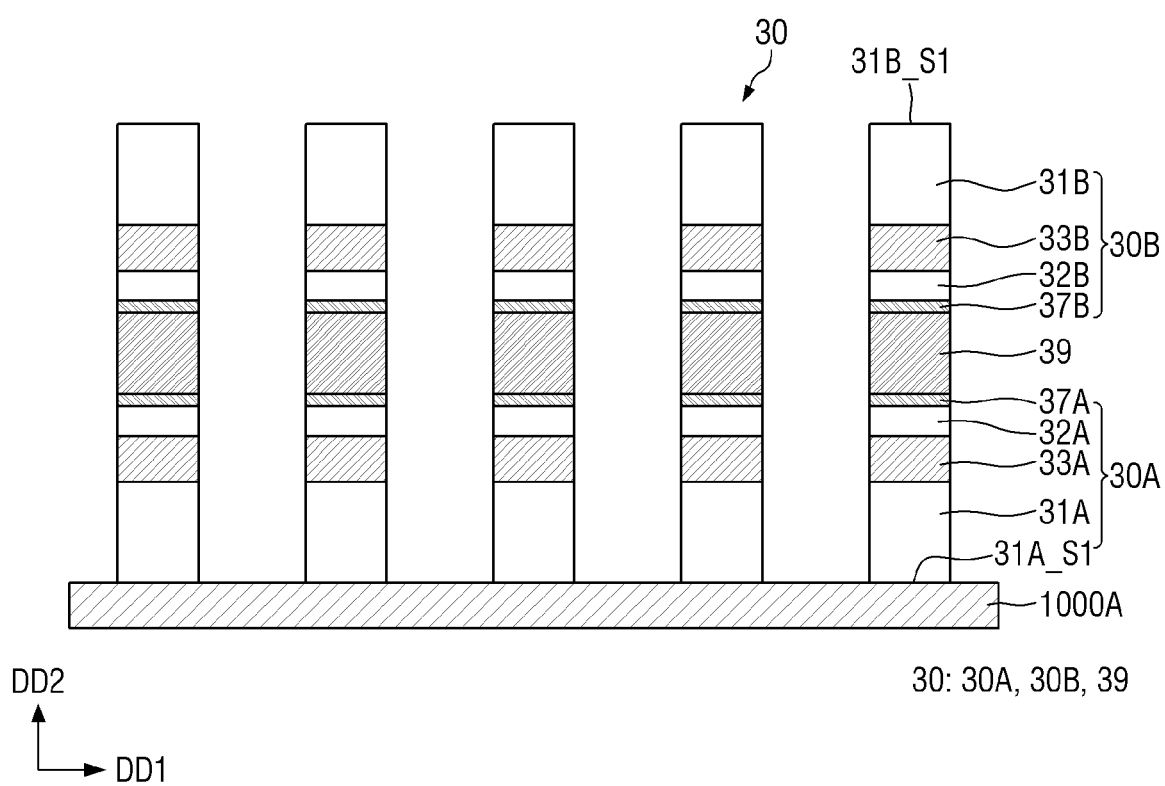

Referring to FIGS. 6 and 7, the stacked structure is etched vertically (or in the second direction DD2) to form core structures 30 spaced apart from each other.

For example, the stacked structure is etched vertically (or in the second direction DD2) to form the core structures 30 spaced apart from each other. The vertical direction for etching the first and second stacked structures 300A and 300B may be parallel to the stacking direction of the material layers included in the first and second stacked structures 300A and 300B. The first and second stacked structures 300A and 300B may be etched by a method within the spirit and the scope of the disclosure. For example, the etching process may be performed by the method for forming an etching mask MK on the first and second stacked structures 300A and 300B and etching the first and second stacked structures 300A and 300B in the direction perpendicular to the first base substrate 1000A while using the etching mask MK as a hard mask.

For example, the etching mask MK may be formed on the first surface 310B_S1 of the first semiconductor material layer 310B of the second stacked structure 300B. The first stacked structure 300A, the second stacked structure 300B, and the third bonding material layer 390' disposed between the first stacked structure 300A and the second stacked structure 300B may be etched together using the etching mask MK. Due to the etching process, the side surface of the first light emitting element core 30A, the side surface of the bonding layer 39, and the side surface of the second light emitting element core 30B included in the core structure 30 may be aligned side by side as shown in FIG. 7.

Figure 8:
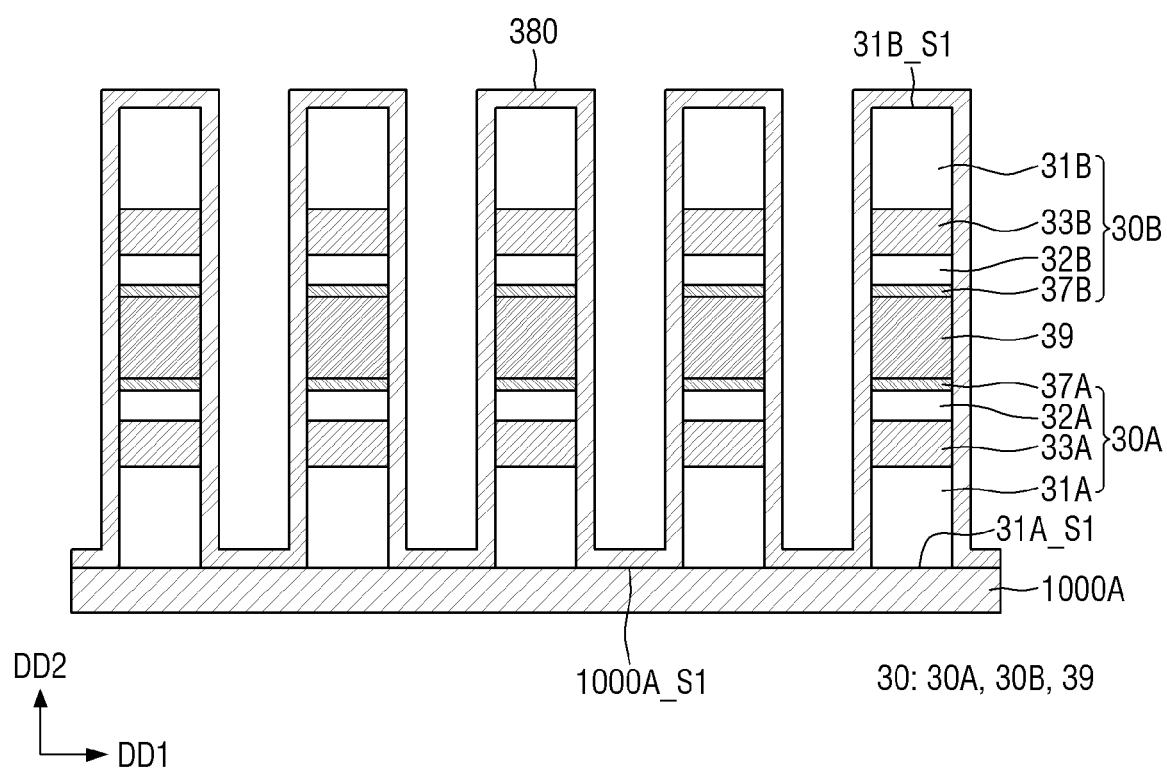

Referring to FIG. 8, an insulating material layer 380 is formed on the core structures 30.

For example, the insulating material layer 380 is formed on the outer surfaces of the core structures 30. The insulating material layer 380 may be formed on the entire surface of the first base substrate 1000A, and may be formed on the first surface 1000A_S1 of the first base substrate 1000A exposed by the core structure 30 as well as the outer surface of the core structure 30. The outer surface of the core structure 30 may include the side surface of the first light emitting element core 30A, the side surface of the bonding layer 39, and the side surface and the first surface 31B_S1 of the second light emitting element core 30B. The first surface 31B_S1 of the second light emitting element core 30B may be the first surface 31B_S1 of the first semiconductor layer 31B of the second light emitting element core 30B. The insulating material layer 380 may correspond to the element insulating film 38 of the light emitting element ED, and may contain the same material or a similar material as the material contained in the element insulating film 38.

Figure 9:
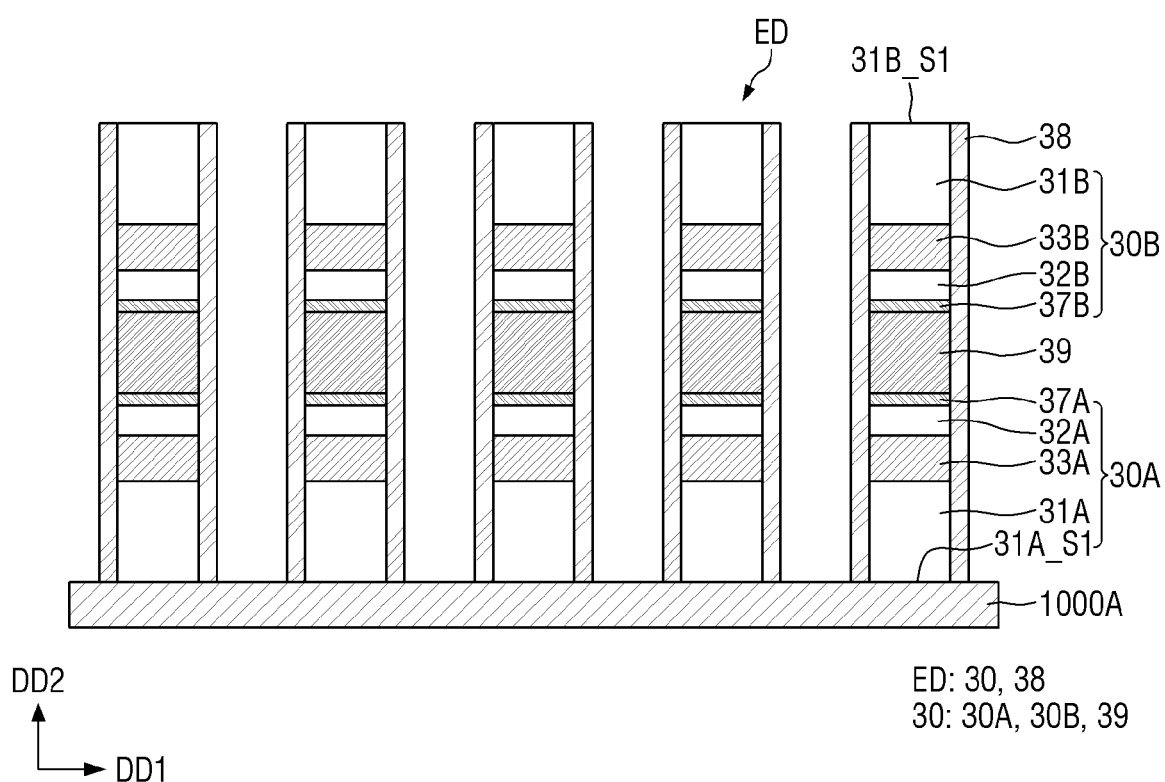

Referring to FIG. 9, a portion of the insulating material layer 380 is removed to form the element insulating film 38 exposing the top surface of the core structure 30.

For example, the etching process in which the insulating material layer 380 is partially removed to expose the top surface of the core structure 30 and surround the side surface of the core structure 30 may be performed. The process of partially removing the insulating material layer 380 may be performed by a process such as dry etching that is anisotropic etching, etchback, or the like within the spirit and the scope of the disclosure.

Due to this etching process, the first surface 31B_S1 of the first semiconductor layer 31B of the second light emitting element core 30B may be exposed by the element insulating film 38. In this etching process, the insulating material layer 380 disposed on the first surface 1000A_S1 of the first base substrate 1000A that is exposed in the region where the core structures 30 are spaced apart from each other may be partially removed. Due to this etching process, light emitting elements ED fixed on the first base substrate 1000A may be formed as shown in FIG. 9.

Figure 10:
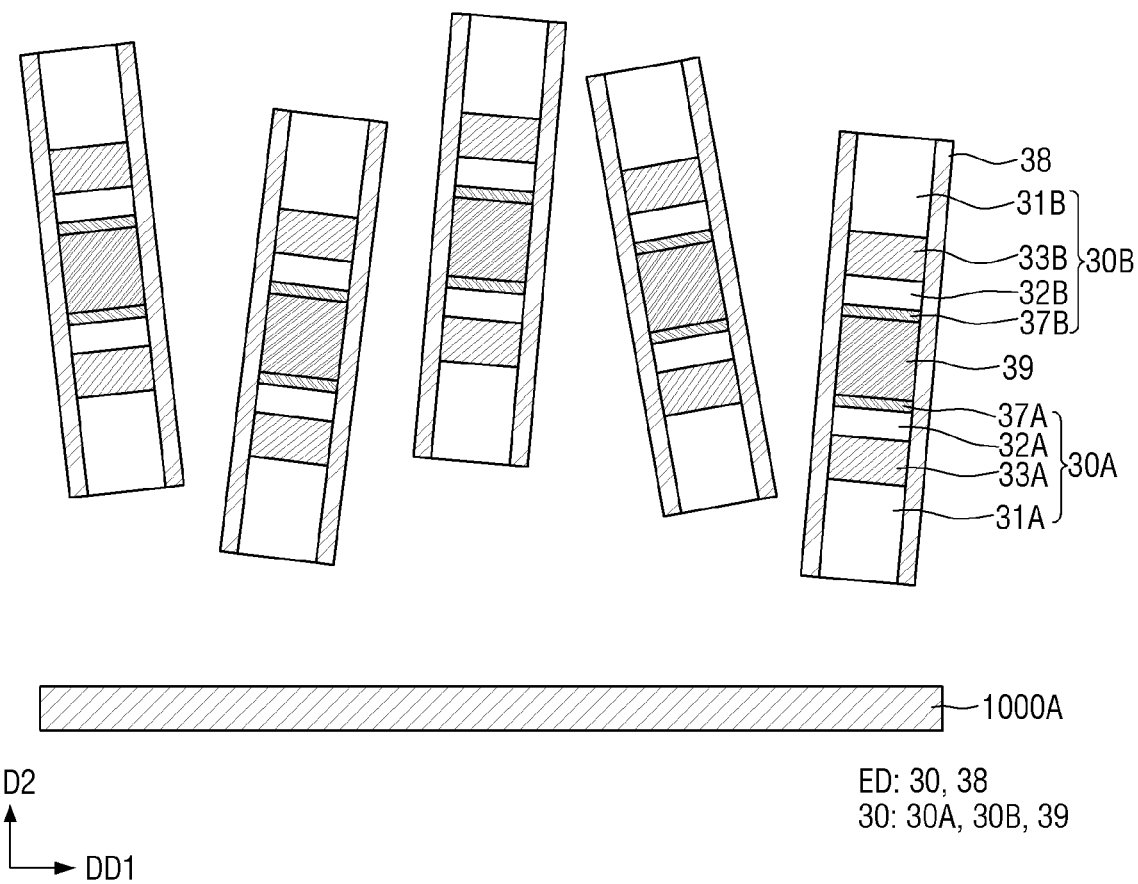

Referring to FIG. 10, the light emitting elements ED fixed on the first base substrate 1000A are separated from the first base substrate 1000A. The process of separating the light emitting elements ED is not particularly limited. For example, the process of separating the light emitting elements ED may be performed by a physical separation method, a chemical separation method, or the like within the spirit and the scope of the disclosure. Due to the separation process, the light emitting elements ED fixed on the first base substrate 1000A may be separated from the first base substrate 1000A.

Hereinafter, the display device including the light emitting element ED of FIGS. 1 and 2 will be described with reference to other drawings. In the following embodiment, a description of the same components as those of the above-described light emitting element ED will be omitted or simplified, and differences will be described.

Figure 11:
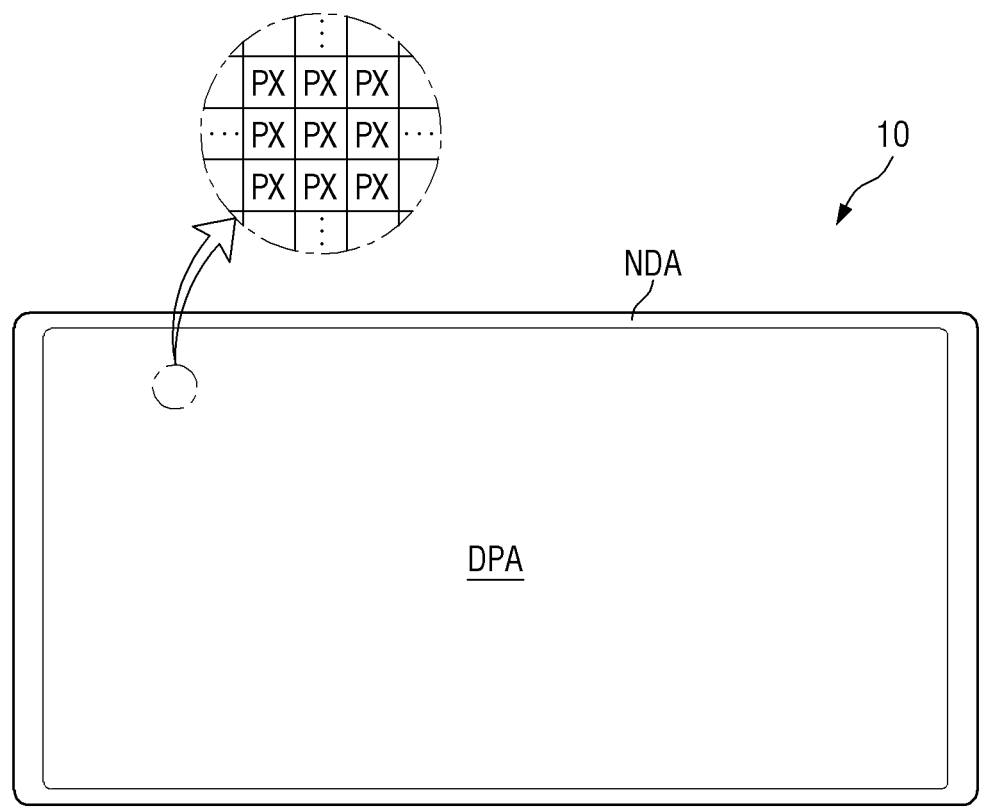
FIG. 11 is a schematic plan view of a display device according to one embodiment.

FIG. 11 is a schematic plan view of a display device according to one embodiment.

Referring to FIG. 11, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described as an example, but the disclosure is not limited thereto, and other display panels may be applied within the same scope of technical spirit.

Hereinafter, a third direction DR1, a fourth direction DR2, and a fifth direction DR3 are defined in drawings of an embodiment describing the display device 10. The third direction DR1 and the fourth direction DR2 may be directions perpendicular to each other in one plane. The fifth direction DR3 may be a direction perpendicular to a plane on which the third direction DR1 and the fourth direction DR2 may be located. The fifth direction DR3 is perpendicular to each of the third direction DR1 and the fourth direction DR2. In an embodiment describing the display device 10, the fifth direction DR3 indicates a thickness direction (or display direction) of the display device 10.

The display device 10 may have a rectangular shape including long and short sides such that the side in the third direction DR1 is longer than the side in the fourth direction DR2 in a plan view. A corner portion where the long side and the short side of the display device 10 meet may be right-angled in a plan view. However, the disclosure is not limited thereto, and it may be rounded to have a curved shape. The shape of the display device 10 is not limited to the illustrated one and may be variously modified. For example, the display device 10 may have other shapes such as a square shape, a quadrilateral shape with rounded corners (vertices), other polygonal shapes and a circular shape in a plan view.

A display surface of the display device 10 may be disposed on one side or on a side of the fifth direction DR3 which is the thickness direction. In embodiments describing the display device 10, unless otherwise noted, the term "upward" refers to one side or a side of the fifth direction DR3, which is the display direction, and the term "top surface" refers to a surface toward the one side or a side of the fifth direction DR3. Further, the term "downward" refers to the other side of the fifth direction DR3, which is an opposite direction to the display direction, and the term "bottom surface" refers to a surface toward the other side of the fifth direction DR3. Furthermore, "left", "right", "upper" and "lower" indicate directions in case that the display device 10 is viewed from above. For example, "right side" indicates one side or a side of the third direction DR1, "left side" indicates the other side of the third direction DR1, "upper side" indicates one side or a side of the fourth direction DR2, and "lower side" indicates the other side of the fourth direction DR2.

The display device 10 may include the display area DPA and a non-display area NDA. The display area DPA is an area where a screen can be displayed, and the non-display area NDA is an area where a screen is not displayed.

The shape of the display area DPA may follow the shape of the display device 10. For example, the shape of the display area DPA may have a rectangular shape similar to the overall shape of the display device 10 in a plan view. The display area DPA may substantially occupy the center of the display device 10.

The display area DPA may include pixels PX. The pixels PX may be arranged or disposed in a matrix. The shape of each pixel PX may be a rectangular or square shape in a plan view. In an embodiment, each pixel PX may include light emitting elements made of inorganic particles.

The non-display area NDA may be disposed around the display area DPA. The non-display area NDA may completely or partially surround or may be adjacent to the display area DPA. The non-display area NDA may form a bezel of the display device 10.

Figure 12:
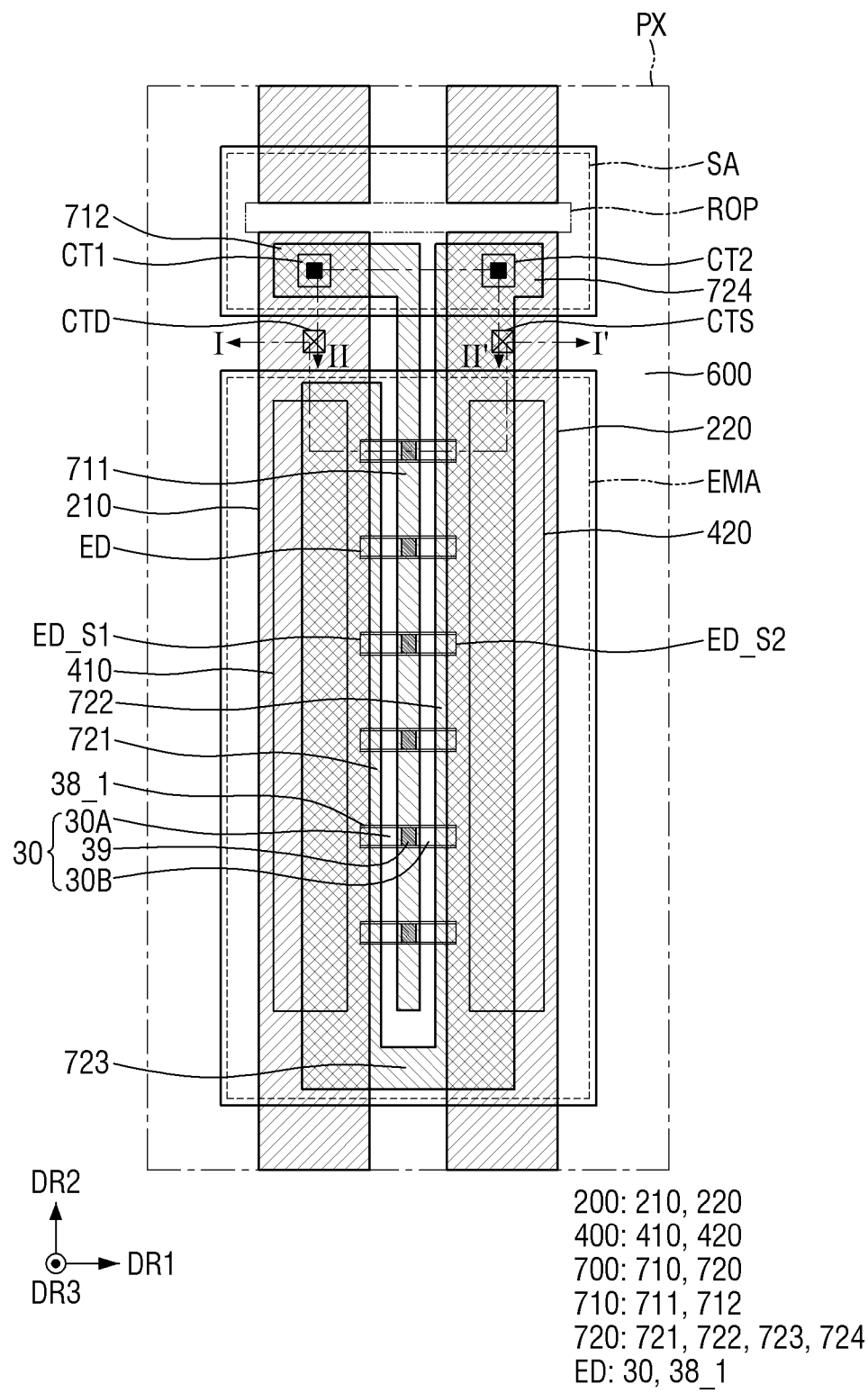
FIG. 12 is a schematic plan view illustrating an example of one pixel of a display device according to one embodiment.

FIG. 12 is a schematic plan view illustrating an example of one pixel of a display device according to one embodiment.

Referring to FIG. 12, each pixel PX of the display device 10 may include an emission area EMA and a non-emission area. The emission area EMA may be defined as an area in which light emitted from a light emitting element ED is emitted, and the non-emission area may be defined as an area in which light is not emitted because the light emitted from the light emitting element ED does not reach.

The emission area EMA may include an area in which the light emitting element ED is disposed and an area adjacent thereto. The emission area may further include a region in which the light emitted from the light emitting element ED is reflected or refracted by another member and emitted.

Each pixel PX may further include a sub-region SA disposed in the non-emission area. The light emitting element ED may not be provided in the sub-region SA. The sub-region SA may be disposed on the upper side (or the other side in the fourth direction DR2) of the emission area EMA in one pixel PX. The sub-region SA may be disposed between the emission areas EMA of the pixels PX disposed adjacent to each other in the fourth direction DR2. The sub-region SA may include the region where an electrode layer 200 and a connection electrode 700 are electrically connected through contact portions CT1 and CT2 to be described later.

The sub-region SA may include a separation portion ROP. The separation portion ROP of the sub-region SA may be the region where first electrodes 210 and second electrodes 220 of the electrode layers 200 included in different pixels PX adjacent to each other along the fourth direction DR2 are separated from each other.

Figure 13:
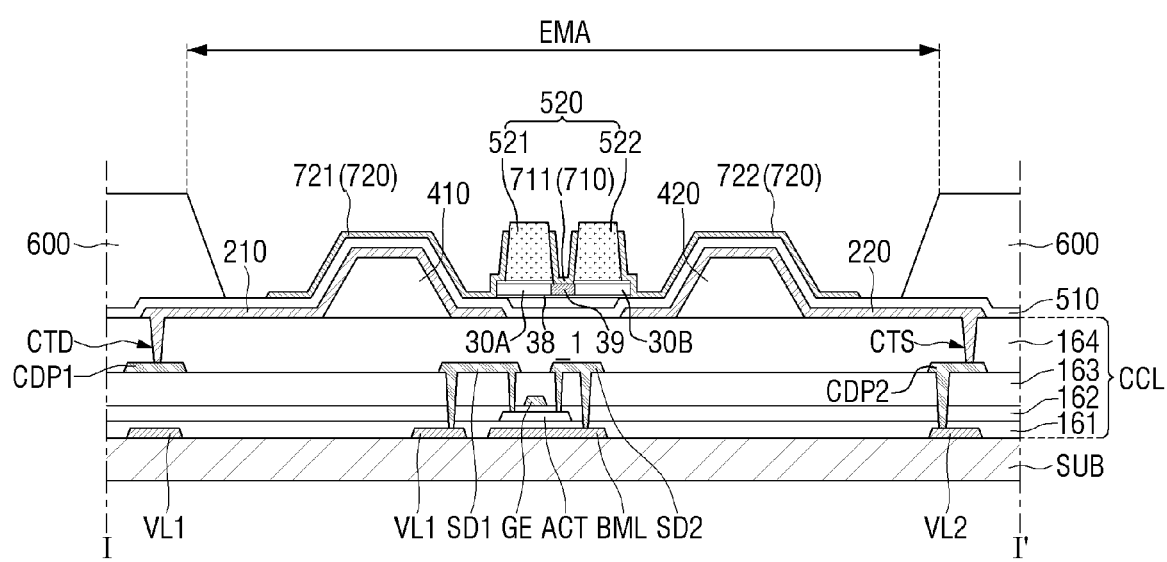
FIG. 13 is a schematic cross-sectional view illustrating an example taken along line I-I' of FIG. 12.
Figure 14:
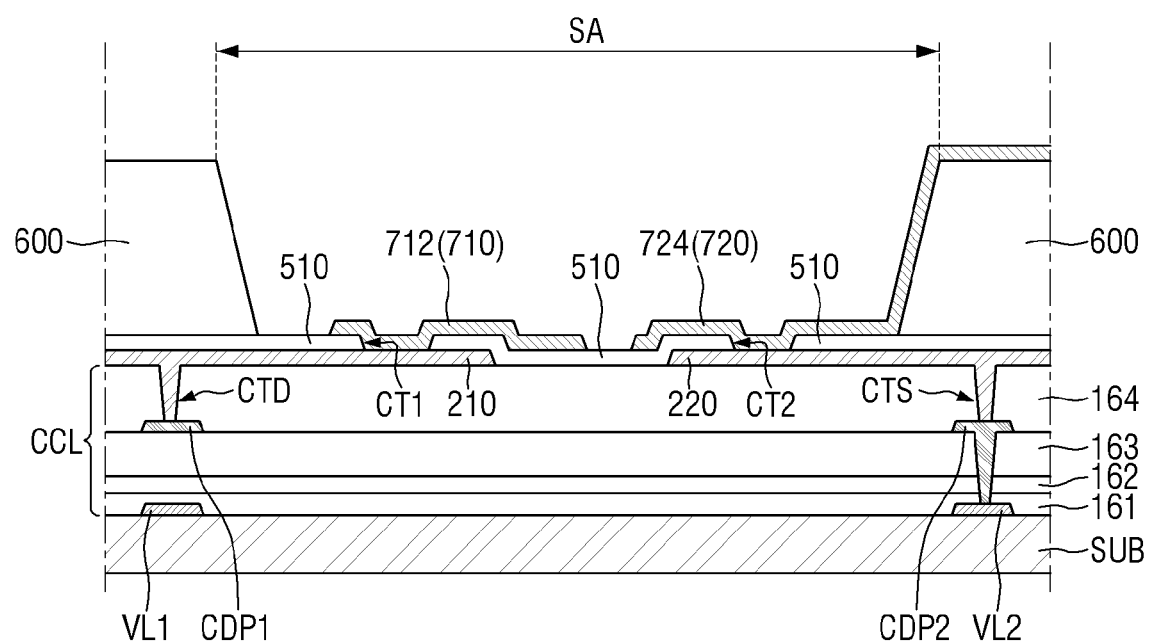
FIG. 14 is a schematic cross-sectional view illustrating an example taken along line II-II' of FIG. 12.

FIG. 13 is a schematic cross-sectional view illustrating an example taken along line I-I' of FIG. 12. FIG. 14 is a schematic cross-sectional view illustrating an example taken along line II-IP of FIG. 12.

Referring to FIG. 13, the display device 10 may include a substrate SUB, a circuit element layer CCL disposed on the substrate SUB, and a light emitting element layer disposed on the circuit element layer CCL.

The substrate SUB may be an insulating substrate. The substrate SUB may be made of an insulating material such as glass, quartz, or polymer resin. Further, the substrate SUB may be a rigid substrate, but may also be a flexible substrate which can be bent, folded or rolled.

The circuit element layer CCL may be disposed on the substrate SUB. The circuit element layer CCL may include a lower metal layer 110, a semiconductor layer 120, a first conductive layer 130, a second conductive layer 140, and insulating layers.

The lower metal layer 110 is disposed on the substrate SUB. The lower metal layer 110 may include a light blocking layer BML, a first voltage line VL1, and a second voltage line VL2.

The first voltage line VL1 may overlap at least a portion of a first electrode SD1 of a transistor TR in the thickness direction of the substrate SUB. A high potential voltage (or a first source voltage) supplied to the transistor TR may be applied to the first voltage line VL1.

The second voltage line VL2 may overlap a second conductive pattern CDP2 to be described later in the thickness direction of and the substrate SUB. A low potential voltage (or a second source voltage) lower than the high potential voltage supplied to the first voltage line VL1 may be applied to the second voltage line VL2. The second source voltage applied to the second voltage line VL2 may be supplied to the second electrode 220. An alignment signal for aligning the light emitting element ED during the manufacturing process of the display device 10 may be applied to the second voltage line VL2.

The high potential voltage (or the first power voltage) supplied to the transistor TR may be applied to the first voltage line VL1, and the low potential voltage (or the second power voltage) lower than the high potential voltage supplied to the first voltage line VL1 may be applied to the second voltage line VL2.

The light blocking layer BML, may be disposed to cover or overlap at least the channel region of an active layer ACT of the transistor TR from the bottom, and may be further disposed to cover or overlap the entire active layer ACT of the transistor TR from the bottom. However, the disclosure is not limited thereto, and the light blocking layer BML may be omitted.

The lower metal layer 110 may contain a material that blocks light. For example, the lower metal layer 110 may be made of an opaque metal material that blocks transmission of light.

A buffer layer 161 may be disposed on the lower metal layer 110. The buffer layer 161 may be disposed to cover or overlap the entire surface of the substrate SUB where the lower metal layer 110 is disposed. The buffer layer 161 may serve to protect transistors from moisture permeating through the substrate SUB that is susceptible to moisture permeation.

The semiconductor layer 120 is disposed on the buffer layer 161. The semiconductor layer 120 may include the active layer ACT of the transistor TR. The active layer ACT of the transistor TR may be disposed to overlap the light blocking layer BML of the lower metal layer 110 as described above.

The semiconductor layer 120 may include polycrystalline silicon, monocrystalline silicon, an oxide semiconductor, or the like within the spirit and the scope of the disclosure. In an embodiment, in case that the semiconductor layer 120 contains polycrystalline silicon, the polycrystalline silicon may be formed by crystallizing amorphous silicon. In case that the semiconductor layer 120 contains polycrystalline silicon, the active layer ACT of the transistor TR may include doping regions doped with impurities and channel regions disposed therebetween. In an embodiment, the semiconductor layer 120 may contain an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like within the spirit and the scope of the disclosure.

A gate insulating layer 162 may be disposed on the semiconductor layer 120. The gate insulating layer 162 may function as a gate insulating layer of each transistor. The gate insulating layer 162 may be formed as a multilayer in which inorganic layers including an inorganic material, for example, at least one of silicon oxide ($SiO_x$), silicon nitride ($SiN_x$) and silicon oxynitride ($SiO_xN_y$) may be alternately stacked each other.

The first conductive layer 130 may be disposed on the gate insulating layer 162. The first conductive layer 130 may include a gate electrode GE of the transistor TR. The gate electrode GE may be disposed to overlap the channel region of the active layer ACT in the fifth direction DR3 which is the thickness direction of the substrate SUB.

An interlayer insulating layer 163 may be disposed on the first conductive layer 130. The interlayer insulating layer 163 may be disposed to cover or overlap the gate electrode GE. The interlayer insulating layer 163 may function as an insulating layer between the first conductive layer 130 and other layers disposed thereon to protect the first conductive layer 130.

The second conductive layer 140 may be disposed on the interlayer insulating layer 163. The second conductive layer 140 may include the first electrode SD1 of the transistor TR, a second electrode SD2 of the transistor TR, a first conductive pattern CDP1, and the second conductive pattern CDP2.

The first electrode SD1 of the transistor TR and the second electrode SD2 of the transistor TR may be electrically connected with both ends of the active layer ACT of the transistor TR through contact holes penetrating the interlayer insulating layer 163 and the gate insulating layer 162, respectively. Further, the first electrode SD1 of the transistor TR may be electrically connected to the first voltage line VL1 of the lower metal layer 110 through another contact hole penetrating the interlayer insulating layer 163, the gate insulating layer 162, and the buffer layer 161. The second electrode SD2 of the transistor TR may be electrically connected to the light blocking layer BML, of the lower metal layer 110 through still another contact hole penetrating the interlayer insulating layer 163, the gate insulating layer 162, and the buffer layer 161.

Although not shown in the drawings, a portion of the first conductive pattern CDP1 may be electrically connected to the second electrode SD2 of the transistor TR. Further, the first conductive pattern CDP1 may be electrically connected to the first electrode 210 through a first electrode contact hole CT1 penetrating a via layer 164 to be described later. The transistor TR may transmit the first source voltage applied from the first voltage line VL1 to the first electrode 210 through the first conductive pattern CDP1.

The second conductive pattern CDP2 may be electrically connected to the second voltage line VL2. The second conductive pattern CDP2 may be connected to the second voltage line VL2 through the contact hole penetrating the interlayer insulating layer 163, the gate insulating layer 162, and the buffer layer 161. The second conductive pattern CDP2 may be electrically connected to the second electrode 220 through a second electrode contact hole CTS. The second conductive pattern CDP2 may transmit the second source voltage applied to the second voltage line VL2 to the second electrode 220.

On the other hand, although it is illustrated in the drawing that the first conductive pattern CDP1 and the second conductive pattern CDP2 are formed in a same layer, the disclosure is not limited thereto. In an embodiment, the second conductive pattern CDP2 may be formed as a third conductive layer disposed on the second conductive layer 140 with several insulating layers interposed between the first conductive pattern CDP1 and another conductive layer, for example, the second conductive layer 140. The first voltage line VL1 and the second voltage line VL2 may be formed not as the lower metal layer 110 but as the third conductive layer.

The via layer 164 may be disposed on the second conductive layer 140. The via layer 164 may be disposed on the interlayer insulating layer 163 where the second conductive layer 140 is disposed. The via layer 164 may include an organic insulating material, for example, an organic material such as polyimide (PI). The via layer 164 may function to flatten a surface. Although it is not illustrated in the drawing, a passivation layer for protecting the second conductive layer 140 may be further disposed on the second conductive layer 140, and the via layer 164 may be disposed on the passivation layer.

The buffer layer 161, the gate insulating layer 162, and the interlayer insulating layer 163 may be formed as inorganic layers that may be alternately stacked each other. For example, the buffer layer 161, the gate insulating layer 162, and the interlayer insulating layer 163 may be formed as a double layer in which inorganic layers containing at least one of silicon oxide ($SiO_x$), silicon nitride ($SiN_x$), or silicon oxynitride ($SiO_xN_y$) may be stacked each other, or a multi-layer in which such inorganic layers may be alternately stacked each other. However, the disclosure is not limited thereto, and the buffer layer 161, the gate insulating layer 162, and the interlayer insulating layer 163 may be formed as a single inorganic layer containing the above-described insulating material.

Hereinafter, the structure of the light emitting element layer disposed on the via layer 164 will be described with reference to FIGS. 12 to 14.

The light emitting element layer may be disposed on the via layer 164 of the circuit element layer CCL. The light emitting element layer may include the light emitting elements ED, a first bank 400, a second bank 600, the electrode layer 200, the connection electrode 700, and insulating layers 510 and 520.

The first bank 400 is disposed on the via layer 164. The first bank 400 may be disposed on or directly disposed on the via layer 164. The first bank 400 may be disposed in the emission area EMA.

The first bank 400 may have a shape extending in the fourth direction DR2 in the emission area EMA. The extension length of the first bank 400 in the fourth direction DR2 may be smaller than the length of the emission area EMA surrounded by the second bank 600 to be described later in the fourth direction DR2.

The first bank 400 may extend in the fourth direction DR2 in the emission area EMA, and may include sub-banks spaced apart from each other in the third direction DR1. In an embodiment, the first bank 400 may include a first sub-bank 410 and a second sub-bank 420.

The first sub-bank 410 and the second sub-bank 420 may be spaced apart from each other in the third direction DR1. For example, the first sub-bank 410 may be located on the left side in the emission area EMA in a plan view, and the second sub-bank 420 may be located on the right side in the emission area EMA in a plan view while being spaced apart from the first sub-bank 410 in the first direction DR1. The light emitting elements ED may be disposed between the first sub-bank 410 and the second sub-bank 420 spaced apart from each other.

The first bank 400 may have a structure in which at least a portion of the first bank 400 protrudes upward (for example, one side or a side in the s fifth direction DR3) with respect to the top surface of the via layer 164. The protruding portion of the first bank 400 may have an inclined side surface. The first bank 400 may serve to change the traveling direction of the light emitted from the light emitting element ED toward the inclined side surface of the first bank 400 to an upward direction (for example, a display direction). In other words, the first bank 400 may serve as a reflective partition wall that provides a space where the light emitting element ED is disposed and changes the traveling direction of the light emitted from the light emitting element ED to the display direction.

On the other hand, although it is illustrated in the drawing that the side surface of the first bank 400 is inclined in a linear shape, the disclosure is not limited thereto. However, the disclosure is not limited thereto. For example, the side surface (or outer surface) of the first bank 400 may have a curved semicircular or semi-elliptical shape. In an embodiment, the first bank 400 may include an organic insulating material such as polyimide (PI), but is not limited thereto.

The electrode layer 200 may be disposed on the first bank 400 and the via layer 164 exposed by the first bank 400. The electrode layer 200 may have a shape extending in one direction and may be disposed for each pixel PX. The electrode layer 200 may be disposed across the emission area EMA and the sub-region SA of each pixel PX while extending in the fourth direction DR2. The electrode layer 200 may be disposed on the first bank 400 and the via layer 164 exposed by the first bank 400 in the emission area EMA and may be disposed on the via layer 164 in the sub-region SA.

The electrode layer 200 may include the first electrode 210 and the second electrode 220 spaced apart from each other in the third direction DR1.

The first electrode 210 may be disposed on the first sub-bank 410 in the emission area EMA, and the second electrode 220 may be disposed on the second sub-bank 420 in the emission area EMA. The first electrode 210 and the second electrode 220 may be disposed at least on the inclined surfaces of the first sub-bank 410 and the second sub-bank 420, respectively. The first electrode 210 and the second electrode 220 may be disposed to cover or overlap at least one side surface or a side surface of the first sub-bank 410 and the second sub-bank 420 facing each other to reflect the light emitted from the light emitting element ED.

The gap in the third direction DR1 between the first electrode 210 and the second electrode 220 may be smaller than the gap in the third direction DR1 between the first sub-bank 410 and the second sub-back 420.

The electrode layer 200 may be electrically connected to the second conductive layer 140 through the first electrode contact hole CTD and the second electrode contact hole CTS penetrating the via layer 164. For example, the first electrode 210 may be in contact with the first conductive pattern CDP1 through the first electrode contact hole CTD penetrating the via layer 164, and the second electrode 220 may be in contact with the second conductive pattern CDP2 through the second electrode contact hole CTS penetrating the via layer 164. The first electrode 210 may be electrically connected to the transistor TR through the first conductive pattern CDP1. The second electrode 220 may be electrically connected to the power supply line VL2 through the second conductive pattern CDP2, so that the second source voltage may be transmitted. Although it is illustrated in the drawing that the first electrode contact hole CTD and the second electrode contact hole CTS are disposed to overlap the second bank 600 in the fifth direction DR3, the positions of the first electrode contact hole CTD and the second electrode contact hole CTS are not limited thereto.

The electrode layer 200 disposed in each pixel PX may extend in the fourth direction DR2 in a plan view, and may be separated from the electrode layer 200 of the pixel PX adjacent in the fourth direction DR2 at the separation portion ROP of the sub-region SA. The electrode layers 200 spaced apart from each other in the fourth direction DR2 may be arranged or disposed by extending an electrode line used in a step of aligning the light emitting elements ED in the fourth direction DR2, aligning the light emitting elements ED, and separating the electrode line from the separation portion ROP of the sub-region SA in a subsequent step. The electrode line may be used for generating an electric field in the pixel PX to align the light emitting elements ED during the manufacturing process of the display device 10.

The electrode layer 200 may be electrically connected to the light emitting element ED. The electrode layer 200 may be connected to both ends of the light emitting element ED through the connection electrode 700 to be described later, and may transmit the electrical signal applied from the second conductive layer 140 to the light emitting element ED.

Each of the first electrode 210 and the second electrode 220 may contain a conductive material having high reflectivity. For example, each of the first electrode 210 and the second electrode 220 may contain, as a material having high reflectivity, a metal such as silver (Ag), copper (Cu), aluminum (Al), molybdenum (Mo), titanium (Ti), or the like, or an alloy containing aluminum (Al), nickel (Ni), lanthanum (La), or the like within the spirit and the scope of the disclosure. Each of the first electrode 210 and the second electrode 220 may reflect the light emitted from the light emitting element ED and traveling toward the side surface of the first bank 400 in the upward direction of each pixel PX. However, the disclosure is not limited thereto, and each of the first electrode 210 and the second electrode 220 may further contain a transparent conductive material. For example, each of the first electrode 210 and the second electrode 220 may contain a material such as ITO, IZO, ITZO, or the like within the spirit and the scope of the disclosure. In an embodiment, each of the first electrode 210 and the second electrode 220 may have a structure in which at least one transparent conductive material and at least one metal layer having high reflectivity may be stacked each other, or may be formed as one layer or a layer including them. For example, each of the first electrode 210 and the second electrode 220 may have a stacked structure such as ITO/Ag/ITO, ITO/Ag/IZO, or ITO/Ag/ITZO/IZO.

The first insulating layer 510 may be disposed on the electrode layer 200, the via layer 164, and the first bank 400.

The first insulating layer 510 may be disposed to completely cover or overlap the via layer 164, the first bank 400, and the electrode layer 200 in the emission area EMA. Although not limited to the following, the first insulating layer 510 may be disposed to completely cover or overlap the electrode layer 200 in the emission area EMA. The first insulating layer 510 may be disposed on the electrode layer 200 and the via layer 164 in the sub-region SA, but may not be disposed at the separation portion ROP of the sub-region SA.

The first insulating layer 510 may include a contact portion exposing a portion of the top surface of the electrode layer 200. The contact portion may penetrate the first insulating layer 510, and may include a first contact portion CT1 exposing a portion of the top surface of the first electrode 210 and a second contact portion CT2 exposing a portion of the second electrode 220. In an embodiment, the first contact portion CT1 and the second contact portion CT2 may be disposed in the sub-region SA. However, the disclosure is not limited thereto, and at least one of the first contact portion CT1 and the second contact portion CT2 may be disposed in the emission area EMA.

The first insulating layer 510 may serve to protect the electrode layer 200 and to insulate the first electrode 210 and the second electrode 220 from each other. Further, the first insulating layer 510 may prevent the light emitting elements ED to be described later that are arranged or disposed on the first insulating layer 510 from being damaged due to direct contact with other members disposed therebelow. In an embodiment, the first insulating layer 510 may include an inorganic insulating material, but the disclosure is not limited thereto.

The second bank 600 may be disposed on the first insulating layer 510. The second bank 600 may be disposed in the form of a grid pattern including portions extending in the third and fourth directions DR1 and DR2 in a plan view.

The second bank 600 may be disposed across the boundary of adjacent pixels PX to divide the pixels PX and may divide the emission area EMA and the sub-region SA of each pixel PX. Further, the second bank 600 has a height greater than that of the first bank 400 and divides the emission area EMA and the sub-region SA. Accordingly, in an inkjet printing step for aligning the light emitting elements ED during the manufacturing process of the display device 10, ink in which the light emitting elements ED are dispersed can be sprayed into the emission area EMA without being mixed with an adjacent pixel PX. The second bank 600 may include an organic insulating material, for example, polyimide (PI), but is not limited thereto.

The light emitting elements ED may be disposed on the first insulating layer 510 in the emission area EMA. The light emitting element ED may be disposed between the first sub-bank 410 and the second sub-bank 420. The light emitting element ED may be disposed on the insulating layer 510 such that both ends thereof are located on the first electrode 210 and the second electrode 220, respectively.

The light emitting elements ED may be spaced apart from one another along the fourth direction DR2 in which the first and second electrodes 210 and 220 extend in a plan view. The light emitting elements ED may be aligned substantially parallel to each other. As described above, the light emitting element ED may have a shape extending in one direction, and the extension direction of the light emitting element ED may be substantially parallel to the third direction DR1. The extension length of the light emitting element ED may be greater than the minimum gap between the first electrode 210 and the second electrode 220 spaced apart from each other in the third direction DR1. Further, the extension length of the light emitting element ED may be greater than the minimum gap between the first sub-bank 410 and the second sub-bank 420 spaced apart from each other in the third direction DR1.

The light emitting element ED may be disposed such that at least one end thereof is located on any one of the first electrode 210 and the second electrode 220 or such that both ends thereof are located on the first electrode 210 and the second electrode 220, respectively. In one embodiment, the first end ED_S1 of the light emitting element ED may be disposed on the first electrode 210, and the second end ED_S2 of the light emitting element ED may be disposed on the second electrode 220. The first light emitting element core 30A located at the first end ED_S1 of the light emitting element ED may be disposed on the first electrode 210, and the second light emitting element core 30B located at the second end ED_S2 of the light emitting element ED may be disposed on the second electrode 220. The bonding layer 39 may be disposed between the first electrode 210 and the second electrode 220 in a plan view.

The second insulating layer 520 may be disposed on the light emitting element ED. The second insulating layer 520 may be disposed to partially surround the outer surface of the light emitting element ED, but not to cover or overlap the both ends of the light emitting element ED. Therefore, the width of the second insulating layer 520 in the third direction DR1 may be smaller than the length of the light emitting element ED in the third direction DR1 that is the extension direction of the light emitting element ED. The portion of the second insulating layer 520 disposed on the light emitting element ED may be arranged or disposed to extend in the fourth direction DR2 on the first insulating layer 510 in a plan view, so that it may form a linear or island-like or isolated pattern in each pixel PX.

The second insulating layer 520 may include a first fixing pattern 521 and a second fixing pattern 522.

The first fixing pattern 521 may be formed on the first light emitting element core 30A to surround the outer surface of the first light emitting element core 30A. The first fixing pattern 521 may be disposed on the first light emitting element core 30A, and one end (for example, the first end ED_S1 of the light emitting element ED) of the first light emitting element core 30A and a portion of the bonding layer 39 may be exposed.

The second fixing pattern 522 may be formed on the second light emitting element core 30B to surround the outer surface of the second light emitting element core 30B. The second fixing pattern 522 may be disposed on the second light emitting element core 30B, and one end (for example, the second end ED_S2 of the light emitting element ED) of the second light emitting element core 30B and a portion of the bonding layer 39 may be exposed.

The first fixing pattern 521 and the second fixing pattern 522 may be spaced apart from each other in the third direction DR1. Since the first fixing pattern 521 and the second fixing pattern 522 are spaced apart from each other in the third direction DR1, a portion of the light emitting element ED may be exposed. A portion of an element insulating film 38_1 of the light emitting element ED may be removed in the separation region between the first fixing pattern 521 and the second fixing pattern 522. Since a portion of an element insulating film 38_1 of the light emitting element ED is removed in the separation region between the first fixing pattern 521 and the second fixing pattern 522, a portion of the bonding layer 39 of the light emitting element ED may be exposed. The second insulating layer 520 may include an opening penetrating the second insulating layer 520 so that the first fixing pattern 521 and the second fixing pattern 522 are spaced apart from each other in the third direction DR1. The opening may overlap the bonding layer 39 of the light emitting element ED, as will be described later.

The connection electrode 700 may be disposed on the second insulating layer 520 and the light emitting element ED.

The connection electrode 700 may include a first connection electrode 710 and a second connection electrode 720 spaced apart from each other.

The first connection electrode 710 may include a first contact electrode 711 and a first electrode contact pattern 712. Although not limited to the following, the first contact electrode 711 and the first electrode contact pattern 712 of the first connection electrode 710 may be integrated to form one pattern. The first connection electrode 710 may serve to electrically connect the first electrode 210 to the second conductivity type (for example, p-type) semiconductor layer of the light emitting element ED.

For example, the first contact electrode 711 of the first connection electrode 710 may be disposed in the emission area EMA. The first contact electrode 711 of the first connection electrode 710 may be disposed between the first electrode 210 and the second electrode 220 in a plan view in the emission area EMA. The first contact electrode 711 of the first connection electrode 710 may extend along the fourth direction DR2 in the emission area EMA, and may overlap the bonding layers 39 of the light emitting elements ED. The first contact electrode 711 of the first connection electrode 710 may be in contact with the bonding layer 39 exposed by the element insulating film 38_1 of the light emitting element ED.

The first contact electrode 711 of the first connection electrode 710 may be disposed on the first fixing pattern 521 and the second fixing pattern 522 in the emission area EMA. The first contact electrode 711 of the first connection electrode 710 may be disposed on the sidewall of the first fixing pattern 521 and the sidewall of the second fixing pattern 522 spaced apart from each other.

The first electrode contact pattern 712 of the first connection electrode 710 may be disposed in the sub-region SA. The first electrode contact pattern 712 of the first connection electrode 710 may be disposed on the first electrode 210 in the sub-region SA. The first electrode contact pattern 712 of the first connection electrode 710 may be in contact with the top surface of the first electrode 210 through the first contact portion CT1 penetrating the first insulating layer 510.

The first connection electrode 710 may electrically connect the first electrode 210 to the central portion of the light emitting element ED. The first connection electrode 710 may be in contact with each of the first electrode 210 and the bonding layer 39 disposed at the center of the light emitting element ED to transmit the electrical signal applied to the first electrode 210 to the bonding layer 39.

The second connection electrode 720 may include a first sub-contact electrode 721, a second sub-contact electrode 722, a connection pattern 723, and a second electrode contact pattern 724. Although not limited to the following, the first sub-contact electrode 721, the second sub-contact electrode 722, the connection pattern 723, and the second electrode contact pattern 724 of the second connection electrode 720 may be integrated to form one pattern. The second connection electrode 720 may serve to electrically connect the second electrode 220 to the first conductivity type (for example, n-type) semiconductor layer of the light emitting element ED.

For example, the first sub-contact electrode 721 of the second connection electrode 720 may be disposed in the emission area EMA. The first sub-contact electrode 721 of the second connection electrode 720 may be disposed on the first electrode 210 in the emission area EMA. The first sub-contact electrode 721 of the second connection electrode 720 may extend along the fourth direction DR2, and may overlap the first ends ED_S1 of the light emitting elements ED. The first sub-contact electrode 721 of the second connection electrode 720 may be in contact with one end of the first light emitting element core 30A exposed by the first fixing pattern 521. The first sub-contact electrode 721 of the second connection electrode 720 may also be disposed on a portion of the sidewall of the first fixing pattern 521.

The second sub-contact electrode 722 of the second connection electrode 720 may be spaced apart from the first sub-contact electrode 721 of the second connection electrode 720 in the emission area EMA. The second sub-contact electrode 722 of the second connection electrode 720 may be disposed on the second electrode 220 in the emission area EMA. The second sub-contact electrode 722 of the second connection electrode 720 may extend along the fourth direction DR2, and may overlap the second ends ED_S2 of the light emitting elements ED. The second sub-contact electrode 722 of the second connection electrode 720 may be in contact with one end of the second light emitting element core 30B exposed by the second fixing pattern 522. The second sub-contact electrode 722 of the second connection electrode 720 may also be disposed on a portion of the sidewall of the second fixing pattern 522.

The connection pattern 723 of the second connection electrode 720 may be disposed between the first sub-contact electrode 721 and the second sub-contact electrode 722 of the second connection electrode 720. The connection pattern 723 of the second connection electrode 720 may be disposed between the first sub-contact electrode 721 and the second sub-contact electrode 722 of the second connection electrode 720 to connect them.

The second electrode contact pattern 724 of the second connection electrode 720 may be disposed in the sub-region SA. The second electrode contact pattern 724 of the second connection electrode 720 may be disposed on the second electrode 220 in the sub-region SA. The second electrode contact pattern 724 of the second connection electrode 720 may be in contact with the top surface of the second electrode 220 through the second contact portion CT2 penetrating the first insulating layer 510.

The second connection electrode 720 may electrically connect the second electrode 220 to both ends ED_S1 and ED_S2 of the light emitting element ED. The second connection electrode 720 may be in contact with the second electrode 220 and one ends of the first light emitting element core 30A and the second light emitting element core 30B respectively located at both ends ED_S1 and ED_S2 of the light emitting element ED to transmit the electrical signal applied to the second electrode 220 to one ends of the first and second light emitting element cores 30A and 30B.

In an embodiment, the first connection electrode 710 and the second connection electrode 720 may be formed as a same layer. The first connection electrode 710 and the second connection electrode 720 may be formed as a same layer and may contain the same material or a similar material. In one example, each of the first connection electrode 710 and the second connection electrode 720 may contain a transparent conductive material. Since each of the first connection electrode 710 and the second connection electrode 720 contains a transparent conductive material, although the first connection electrode 710 and the second connection electrode 720 contain the same material or a similar material, the light emitted from both ends ED_S1 and ED_S2 of the light emitting element ED may travel toward the first bank 400. Therefore, the light emitted from both ends ED_S1 and ED_S2 of the light emitting element ED may travel toward the electrode layer 200 while passing through the second connection electrode 720 and may be reflected from the outer surface of the electrode layer 200.

Figure 15:
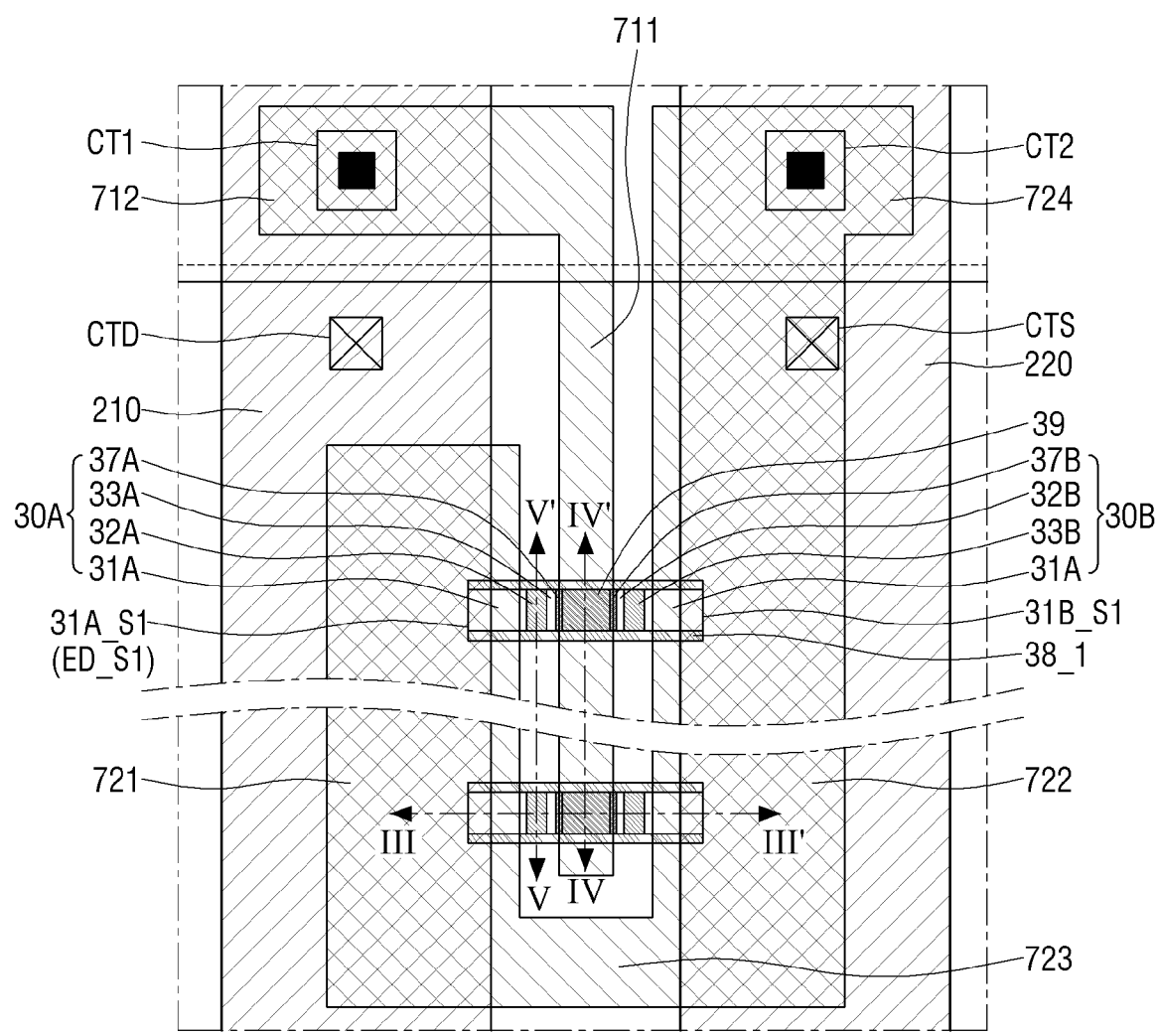
FIG. 15 is an enlarged schematic plan view showing a portion of one pixel of FIG. 12.
Figure 16:
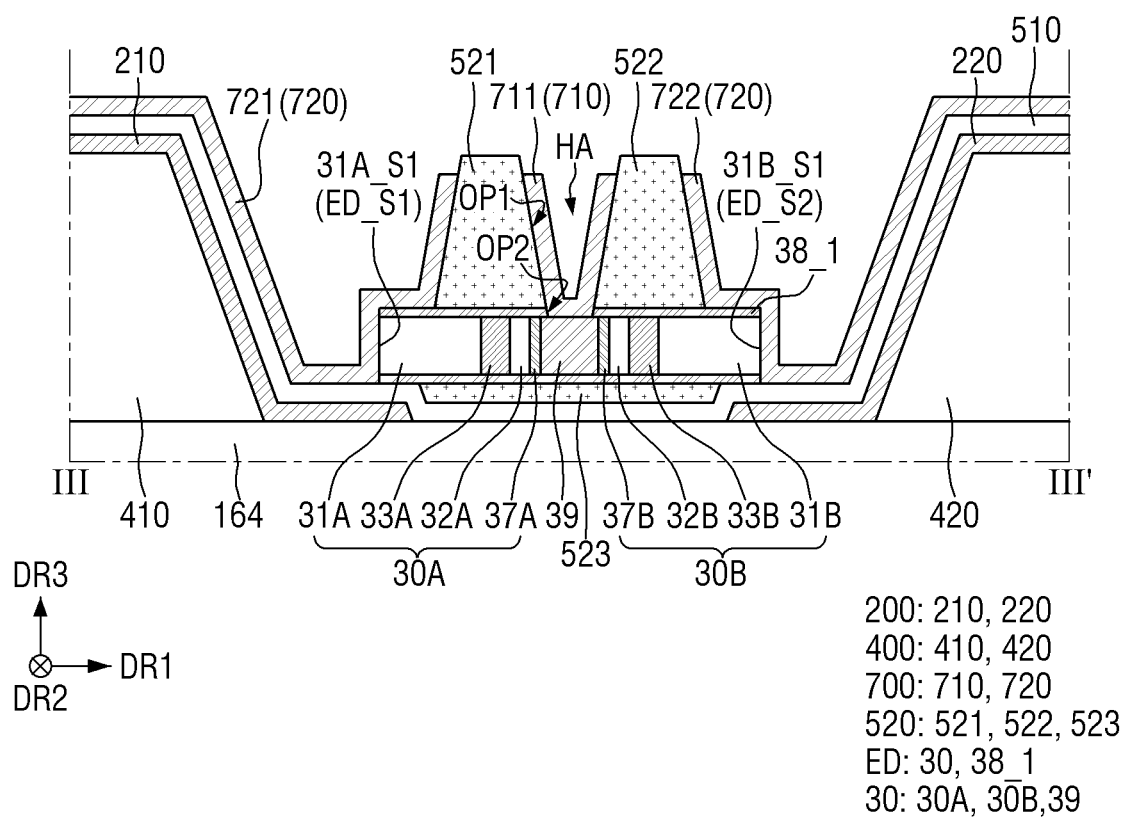
FIG. 16 is a schematic cross-sectional view illustrating an example taken along line of FIG. 15.
Figure 17:
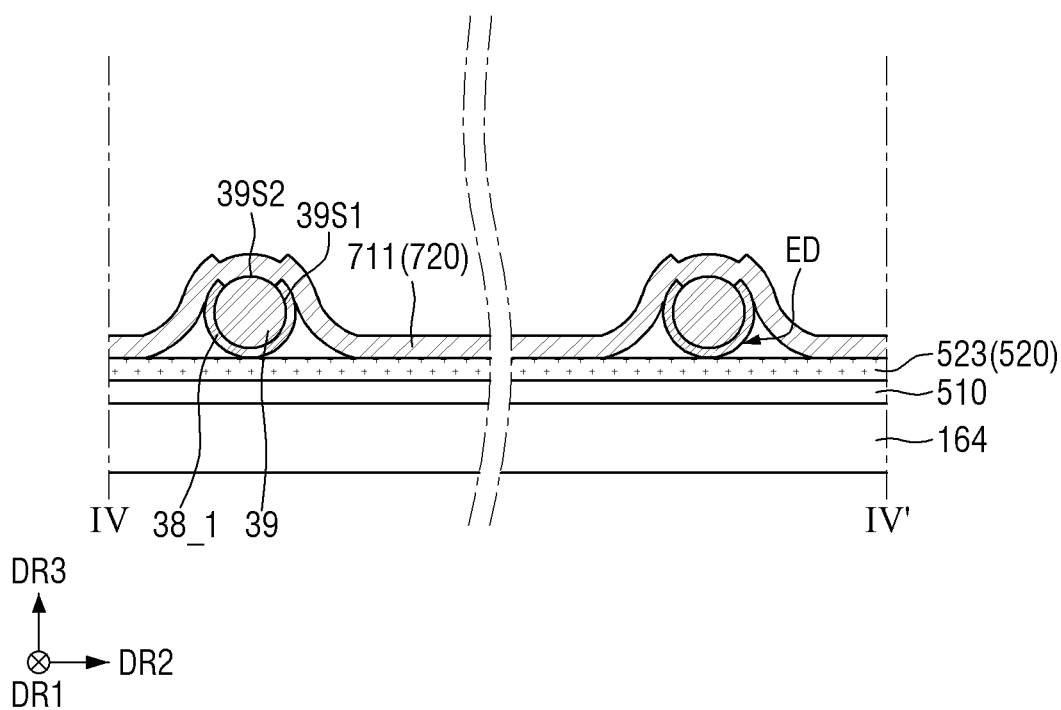
FIG. 17 is a schematic cross-sectional view illustrating an example taken along line IV-IV' of FIG. 15.
Figure 18:
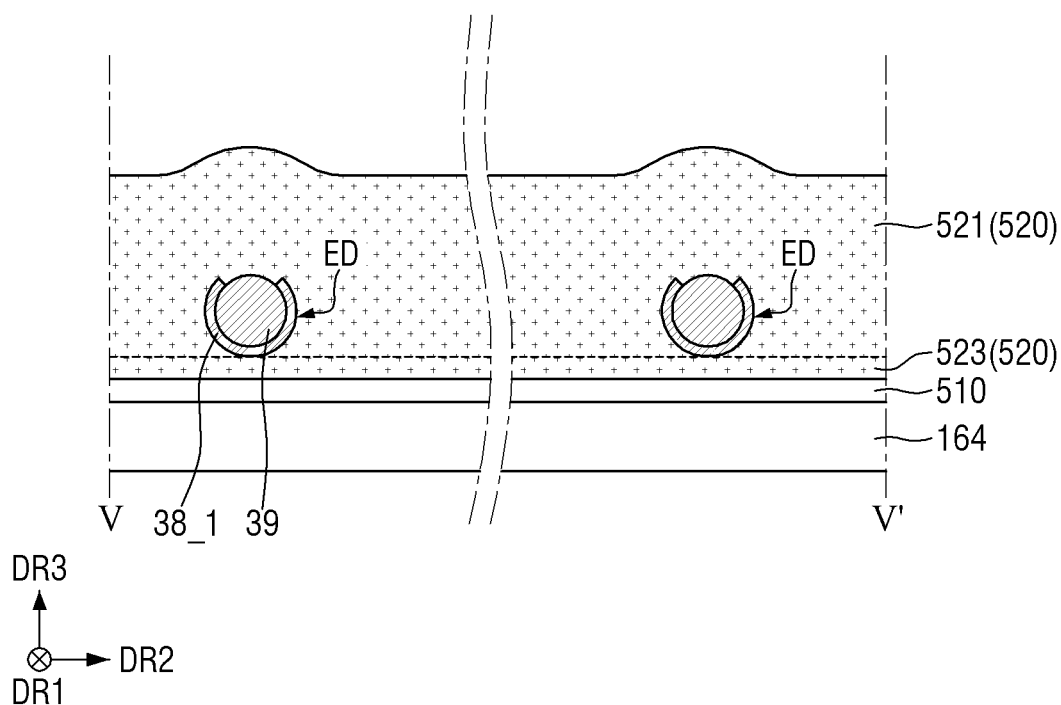
FIG. 18 is a schematic cross-sectional view illustrating an example taken along line V-V of FIG. 15.

FIG. 15 is an enlarged schematic plan view showing a portion of one pixel of FIG. 12. FIG. 16 is a schematic cross-sectional view illustrating an example taken along line of FIG. 15. FIG. 17 is a schematic cross-sectional view illustrating an example taken along line IV-IV' of FIG. 15. FIG. 18 is a schematic cross-sectional view illustrating an example taken along line V-V' of FIG. 15.

Referring to FIGS. 15 to 18, both ends of the light emitting element ED may be disposed on the first electrode 210 and the second electrode 220. For example, the extension direction of the light emitting element ED may be substantially parallel to the direction in which the first electrode 210 and the second electrode 220 are spaced apart from each other. Therefore, the first end ED_S1 of the light emitting element ED may be disposed on the first electrode 210, and the second end ED_S2 of the light emitting element ED may be disposed on the second electrode 220.

In the light emitting element ED, the direction in which the first light emitting element core 30A, the bonding layer 39, and the second light emitting element core 30B may be stacked each other may be parallel to one surface or a surface of the substrate SUB. In the light emitting element ED, the direction in which the first light emitting element core 30A, the bonding layer 39, and the second light emitting element core 30B may be stacked each other may be substantially parallel to the third direction DR1.

The light emitting element ED may be aligned such that the first light emitting element core 30A is disposed on the first electrode 210 side and the second light emitting element core 30B is disposed on the second electrode 220 side with the bonding layer 39 interposed therebetween. The bonding layer 39 may be disposed substantially at the central portion between the first electrode 210 and the second electrode 220.

In the first light emitting element core 30A, the first n semiconductor layer 31A, the first element active layer 33A, the first p semiconductor layer 32A, and the first reflective electrode layer 37A may be sequentially disposed along the third direction DR1. In the first light emitting element core 30A, the first reflective electrode layer 37A, the first p semiconductor layer 32A, the first element active layer 33A, and the first n semiconductor layer 31A may be sequentially disposed in the direction from the bonding layer 39 to the outer side of the core structure 30 with respect to the bonding layer 39. Therefore, the first n semiconductor layer 31A of the first light emitting element core 30A may be located at the first end ED_S1 of the light emitting element ED. One end 31A_S1 of the first n semiconductor layer 31A may be the first end ED_S1 of the light emitting element ED.

In the second light emitting element core 30B, the second n semiconductor layer 31B, the second element active layer 33B, the second p semiconductor layer 32B, and the second reflective electrode layer 37B may be sequentially disposed along a direction opposite to the third direction DR1. In the second light emitting element core 30B, the second reflective electrode layer 37B, the second p semiconductor layer 32B, the second element active layer 33B, and the second n semiconductor layer 31B may be sequentially disposed in the direction from the bonding layer 39 to the outer side of the core structure 30 with respect to the bonding layer 39. Therefore, the second n semiconductor layer 31B of the second light emitting element core 30B may be located at the second end ED_S2 of the light emitting element ED. One end 31B_S1 of the second n semiconductor layer 31B may be the second end ED_S2 of the light emitting element ED.

For example, the core structure 30 may have the symmetrical structure in the third direction DR1 with respect to the center of the bonding layer 39. Therefore, the first conductivity type semiconductor layers, for example, the first n semiconductor layer 31A of the first light emitting element core 30A and the second n semiconductor layer 31B of the second light emitting element core 30B, may be disposed at the first end ED_S1 and the second end ED_S2 of the light emitting element ED. Further, the bonding layer 39 may be disposed at the central portion of the light emitting element ED. The bonding layer 39 may be in contact with each of the first reflective electrode layer 37A of the first light emitting element core 30A and the second reflective electrode layer 37B of the second light emitting element core 30B. Therefore, the second conductivity type semiconductor layers, for example, the first p semiconductor layer 32A of the first light emitting element core 30A and the second p semiconductor layer 32B of the second light emitting element core 30B, may be disposed at the central portion of the light emitting element ED.

The element insulating films 38_1 of the light emitting elements ED disposed between the first electrode 210 and the second electrode 220 may expose a portion of the side surface of the core structure 30. For example, the element insulating film 38_1 may expose at least a portion of the side surface of the bonding layer 39. The side surface of the bonding layer 39 from which the element insulating film 38_1 is removed may be substantially located at the upper portion in cross-sectional view. Therefore, the bonding layer 39 may include a first portion 39S1 surrounded by the element insulating film 38_1 and a second portion 39S2 exposed by the element insulating film 38_1. The element insulating film 38_1 may have separated ends on the side surface of the bonding layer 39 in cross-sectional view taken along the fourth direction DR2 (see FIG. 17). The separated ends of the element insulating film 38_1 may form an opening OP2 exposing the second portion 39S2 of the bonding layer 39.

On the other hand, the first element active layers 33A of the first light emitting element cores 30A and the second element active layers 33B of the second light emitting element cores 30B of the light emitting elements ED aligned between the first electrode 210 and the second electrode 220 may be completely surrounded by the element insulating film 38_1. For example, as shown in FIG. 18, the side surface of the first element active layer 33A of the first light emitting element core 30A may be completely surrounded by the element insulating film 38_1.

The second insulating layer 520 may be disposed to surround the outer surface of the light emitting element ED. The second insulating layer 520 may include the first fixing pattern 521, the second fixing pattern 522, and a filling pattern 523.

The first fixing pattern 521 and the second fixing pattern 522 may be formed to surround the outer surface of the light emitting element ED, and may serve to fix the light emitting element ED so that the light emitting element ED is not separated between the first electrode 210 and the second electrode 220.

The filling pattern 523 may be formed by filling the materials contained in the first fixing pattern 521 and the second fixing pattern 522 in the separation space between the first insulating layer 510 and the light emitting element ED in the process of forming the first fixing pattern 521 and the second fixing pattern 522. However, the disclosure is not limited thereto, and the filling pattern 523 may be omitted.

The first fixing pattern 521 may be disposed on the first light emitting element core 30A. The first fixing pattern 521 may be disposed on the first light emitting element core 30A, and may expose one end 31A_S1 of the first light emitting element core 30A and the bonding layer 39. One end 31A_S1 of the first light emitting element core 30A exposed by the first fixing pattern 521 may be one end 31A_S1 of the first n semiconductor layer 31A.

The second fixing pattern 522 may be disposed on the second light emitting element core 30B. The second fixing pattern 522 may be spaced apart from the first fixing pattern 521 in the third direction DR1. The second fixing pattern 522 may be disposed on the second light emitting element core 30B, and may expose one end 31B_S1 of the second light emitting element core 30B and the bonding layer 39. One end 31B_S1 of the second light emitting element core 30B exposed by the second fixing pattern 522 may be one end 31B_S1 of the second n semiconductor layer 31B.

The first fixing pattern 521 and the second fixing pattern 522 may be spaced apart from each other. The sidewalls of the first fixing pattern 521 and the second fixing pattern 522 spaced apart from each other may form an opening OP1 exposing the bonding layer 39 of the light emitting element ED.

The opening OP1 formed by the second insulating layer 520 and the opening OP2 formed by the element insulating film 38_1 of the light emitting element ED may form a contact hole HA through which the first contact electrode 711 of the first connection electrode 710 and the bonding layer 39 are in contact with each other.

The first contact electrode 711 of the first connection electrode 710 may be in contact with the bonding layer 39 of the light emitting element ED through the contact hole HA penetrating the second insulating layer 520 and the element insulating film 38_1. The first contact electrode 711 of the first connection electrode 710 may be disposed on a portion of the sidewall of the first fixing pattern 521 and the sidewall of the second fixing pattern 522 spaced apart from each other.

The first contact electrode 711 of the first connection electrode 710 may extend in the fourth direction DR2 to be in contact with the second portions 39S2 of the bonding layers 39 of the light emitting elements ED.

The first sub-contact electrode 721 of the second connection electrode 720 may be in contact with the first n semiconductor layer 31A of the first light emitting element core 30A exposed by the first fixing pattern 521. The first sub-contact electrode 721 of the second connection electrode 720 may also be disposed on a portion of the sidewall of the first fixation pattern 521 facing the first electrode 210. The first sub-contact electrode 721 of the second connection electrode 720 and the first contact electrode 711 of the first connection electrode 710 may be spaced apart from each other with the first fixing pattern 521 interposed therebetween.

The second sub-contact electrode 722 of the second connection electrode 720 may be in contact with the second n semiconductor layer 31B of the second light emitting element core 30B exposed by the second fixing pattern 522. The second sub-contact electrode 722 of the second connection electrode 720 may also be disposed on a portion of the sidewall of the second fixing pattern 522 facing the second electrode 220. The second sub-contact electrode 722 of the second connection electrode 720 and the first contact electrode 711 of the first connection electrode 710 may be spaced apart from each other with the second fixing pattern 522 interposed therebetween.

The first sub-contact electrode 721 of the second connection electrode 720 and the second sub-contact electrode 722 of the second connection electrode 720 may be connected by the connection pattern 723. Therefore, the electrical signal applied from the second electrode 220 may be equally transmitted to the first sub-contact electrode 721 of the second connection electrode 720 and the second sub-contact electrode 722 of the second connection electrode 720 by the connection pattern 723.

For example, the signal applied from the first electrode 210 through the first electrode contact pattern 712 of the first connection electrode 710 may be transmitted to the bonding layer 39 of the light emitting element ED along the first contact electrode 711 of the first connection electrode 710, and may be transmitted to the first p semiconductor layer 32A of the first light emitting element core 30A and the second p semiconductor layer 32B of the second light emitting element core 30B. Further, the signal applied from the second electrode 220 through the second electrode contact pattern 724 of the second connection electrode 720 may be transmitted to both ends ED_S1 and ED_S2 of the light emitting element ED along the first and second sub-contact electrodes 721 and 722 of the second connection electrode 720, and may be transmitted to the first n semiconductor layer 31A of the first light emitting element core 30A and the second n semiconductor layer 31B of the second light emitting element core 30B. Therefore, the first light emitting element core 30A and the second light emitting element core 30B may be connected in parallel to each other.

The display device 10 according to an embodiment may include the light emitting element ED having the symmetrical structure with respect to the bonding layer 39. The light emitting element ED may include specific or given conductivity type semiconductor layers at both ends thereof. Therefore, since the light emitting element ED has the symmetrical structure, the same specific or given conductivity type semiconductor layers (n-type semiconductor layers or p-type semiconductor layers) may be disposed at both ends of the light emitting element ED. Therefore, the deflection alignment process of aligning the semiconductor layers having the specific or given conductivity type (n-type semiconductor layers or p-type semiconductor layers) of the light emitting element ED in the same direction may be omitted in the manufacturing process of the display device 10. Further, since the additional deflection alignment process may be omitted, it is possible to improve the efficiency of the manufacturing process of the display device 10. Further, due to the symmetrical structure of the light emitting element ED, the specific or given conductivity type semiconductor layers (n-type semiconductor layers or p-type semiconductor layers) of the light emitting element ED are aligned in the same direction without the additional deflection alignment process, so that the luminous efficiency of the light emitting element ED can be improved.

Figure 19:
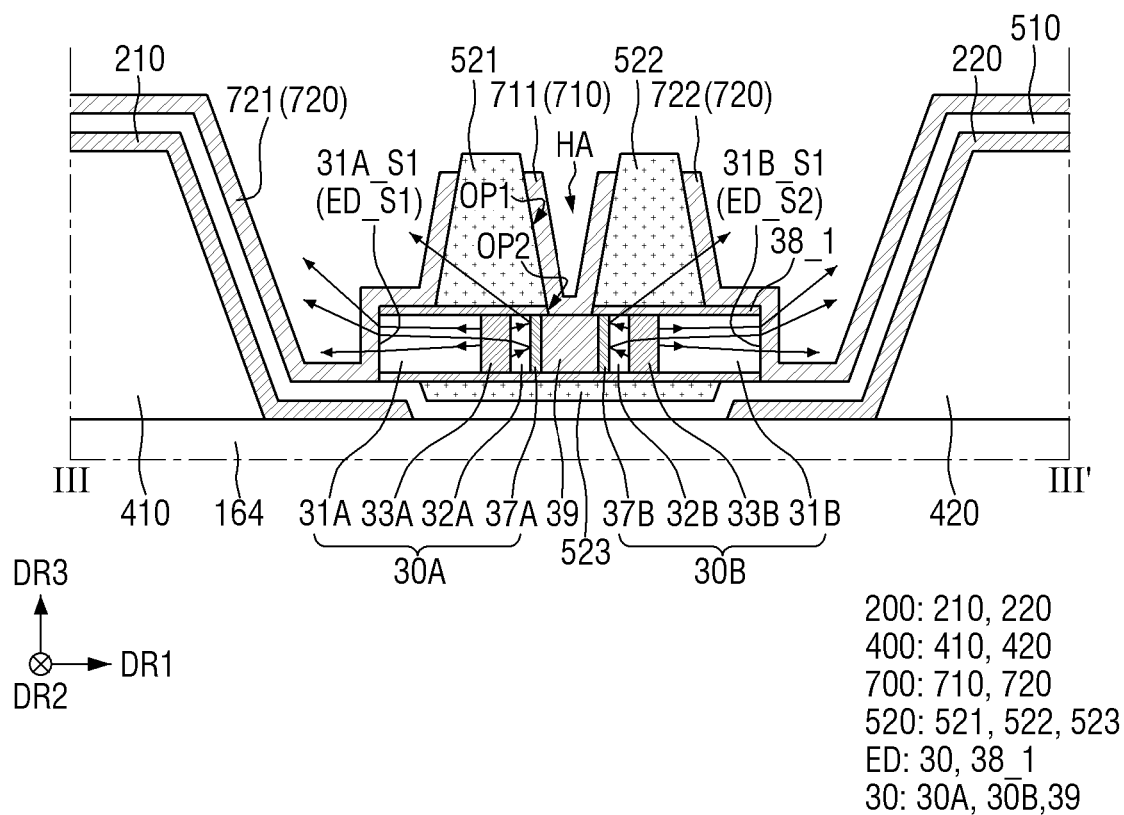
FIG. 19 is a schematic cross-sectional view illustrating the traveling direction of the light emitted from the light emitting element included in a display device according to one embodiment.

FIG. 19 is a schematic cross-sectional view illustrating the traveling direction of the light emitted from the light emitting element included in a display device according to one embodiment.

As shown in FIG. 19, the light generated from the first element active layer 33A of the first light emitting element core 30A may travel randomly. For example, a portion of the light generated from the first element active layer 33A of the first light emitting element core 30A may be emitted through one end 31A_S1 of the first light emitting element core 30A. Further, another portion of the light generated from the first element active layer 33A of the first light emitting element core 30A may be emitted through the side surface of the first light emitting element core 30A. Further, still another portion of the light generated from the first element active layer 33A of the first light emitting element core 30A may travel toward the bonding layer 39. The light traveling toward the bonding layer 39 among the light generated from the first element active layer 33A may be reflected from one surface or a surface of the first reflective electrode layer 37A and travel toward one end 31A_S1 of the first light emitting element core 30A. For example, by providing the first reflective electrode layer 37A at the central portion of the light emitting element ED, the amount of light emitted through the first end ED_S1 of the light emitting element ED may be increased.

Similarly, the light generated from the second element active layer 33B of the second light emitting element core 30B may travel randomly. For example, a portion of the light generated from the second element active layer 33B of the second light emitting element core 30B may be emitted through one end 31B_S1 of the second light emitting element core 30B. Further, another portion of the light generated from the second element active layer 33B of the second light emitting element core 30B may be emitted through the side surface of the second light emitting element core 30B. Further, still another portion of the light generated from the second element active layer 33B of the second light emitting element core 30B may travel toward the bonding layer 39. The light traveling toward the bonding layer 39 among the light generated from the second element active layer 33B may be reflected from one surface or a surface of the second reflective electrode layer 37B and travel toward one end 31B_S1 of the second light emitting element core 30B. For example, by providing the second reflective electrode layer 37B at the central portion of the light emitting element ED, the amount of light emitted through the second end ED_S2 of the light emitting element ED may be increased.

Figure 20:
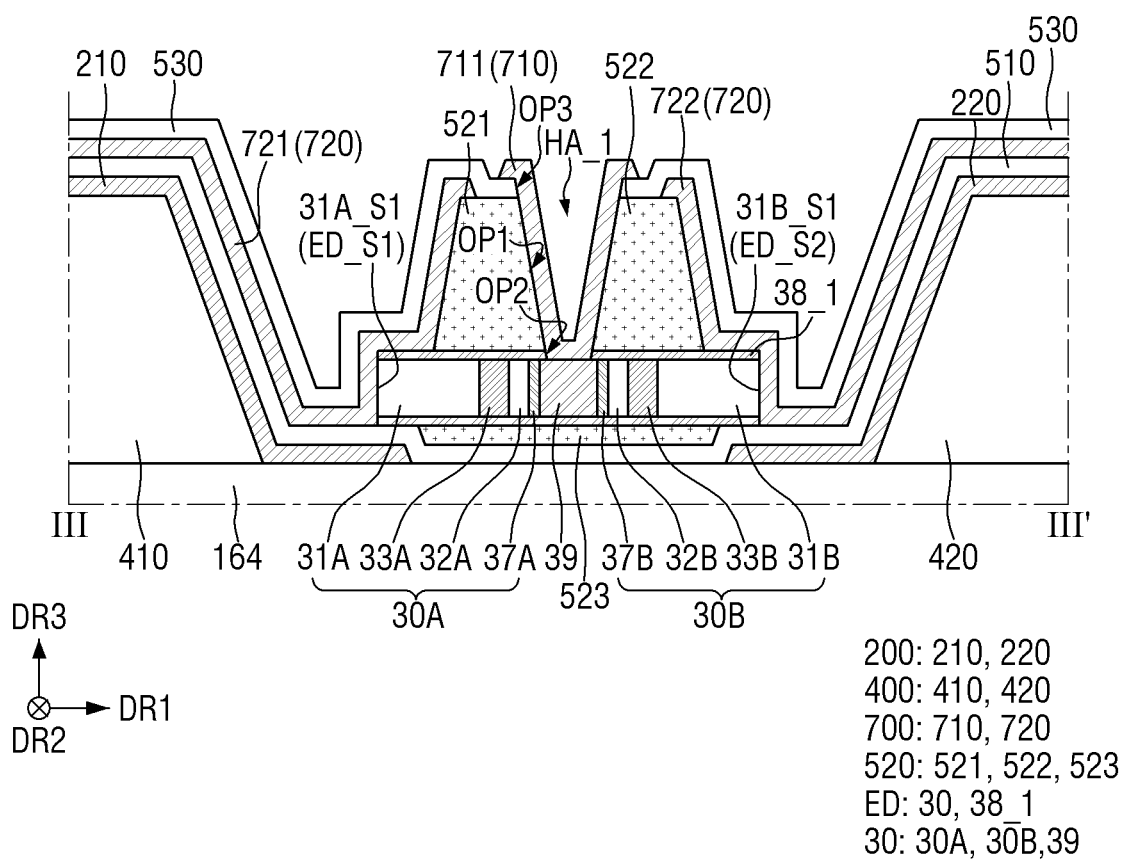
FIG. 20 is a schematic cross-sectional view illustrating an example taken along line of FIG. 15.

FIG. 20 is a schematic cross-sectional view illustrating an example taken along line of FIG. 15.

Referring to FIG. 20, the display device 10 according to an embodiment may be different from an embodiment of FIG. 16 in that the first connection electrode 710 and the second connection electrode 720 may be formed as different layers and a third insulating layer 530 disposed between the first connection electrode 710 and the second connection electrode 720 may be further included.

For example, the third insulating layer 530 may be disposed on the second connection electrode 720. The third insulating layer 530 may be disposed to completely cover or overlap the second connection electrode 720. The third insulating layer 530 may be disposed on the top surface of the first fixing pattern 521 and the top surface of the second fixing pattern 522 of the second insulating layer 520.

The third insulating layer 530 may include a third opening OP3 penetrating the third insulating layer 530. The third opening OP3 may overlap the opening OP1 and the opening OP2. The third opening OP3 may form, together with the opening OP1 and the opening OP2, a contact hole HA_1 through which the first connection electrode 710 and the bonding layer 39 of the light emitting element ED are in contact with each other.

The third opening OP3 may be formed by the side surface of the third insulating layer 530. The side surface of the third insulating layer 530 forming the third opening OP3 and the side surface of the second insulating layer 520 forming the opening OP1 may be aligned side by side. For example, each of the side surface of the first fixing pattern 521 and the side surface of the second fixing pattern 522 spaced apart from each other may be aligned side by side with the side surface of the third insulating layer 530.

The first connection electrode 710 may be disposed on the third insulating layer 530. The first connection electrode 710 may be electrically connected to the bonding layer 39 of the light emitting element ED through the contact hole HA_1 formed by the third opening OP3 penetrating the third insulating layer 530, the opening OP1 penetrating the second insulating layer 520, and the opening OP2 of the element insulating film 38_1 that exposes a portion of the bonding layer 39 of the light emitting element ED. For example, the first connection electrode 710 may be in contact with the side surface of the bonding layer 39 of the light emitting element ED through the contact hole HA_1 penetrating the third insulating layer 530, the second insulating layer 520, and the element insulating film 38_1.

As shown in the drawings, the first connection electrode 710 and the second connection electrode 720 may be formed as different layers.

In an embodiment, the first connection electrode 710 and the second connection electrode 720 may be formed as different layers, and may contain the same material or a similar material. In one example, each of the first connection electrode 710 and the second connection electrode 720 may contain a transparent conductive material. Since each of the first connection electrode 710 and the second connection electrode 720 contains a transparent conductive material or a similar material, although the first connection electrode 710 and the second connection electrode 720 contain the same material or a similar material, the light emitted from both ends ED_S1 and ED_S2 of the light emitting element ED may travel toward the first bank 400. Therefore, the light emitted from both ends ED_S1 and ED_S2 of the light emitting element ED may travel toward the electrode layer 200 while passing through the second connection electrode 720 and may be reflected from the outer surface of the electrode layer 200.

In embodiments, the first connection electrode 710 and the second connection electrode 720 may contain different materials. In one example, the first connection electrode 710 and the second connection electrode 720 may contain different transparent conductive materials. In another example, the first connection electrode 710 may contain a reflective material, and the second connection electrode 720 may contain a transparent conductive material. Since the first connection electrode 710 contains the reflective material and the second connection electrode 720 contains the transparent conductive material, the light emitted from both ends ED_S1 and ED_S2 of the light emitting element ED may transmit the second connection electrode 720 in contact with each of the first end ED_S1 and the second end ED_S2 of the light emitting element ED.

In an embodiment, since the process of additionally providing the third insulating layer 530 on the first connection electrode 710 and the process of providing the second connection electrode 720 on the third insulating layer 530 are added, the processing efficiency of the display device 10 may be decreased. However, it is possible to minimize a problem that the first connection electrode 710 and the second connection electrode 720 are short-circuited in the manufacturing process of the display device 10.

Hereinafter, other embodiments related to the display device including the light emitting element ED of FIGS. 1 and 2 will be described with reference to other drawings. In the following embodiments, a description of the same components as those of the display device according to the above-described embodiment will be omitted or simplified, and differences will be described.

Figure 21:
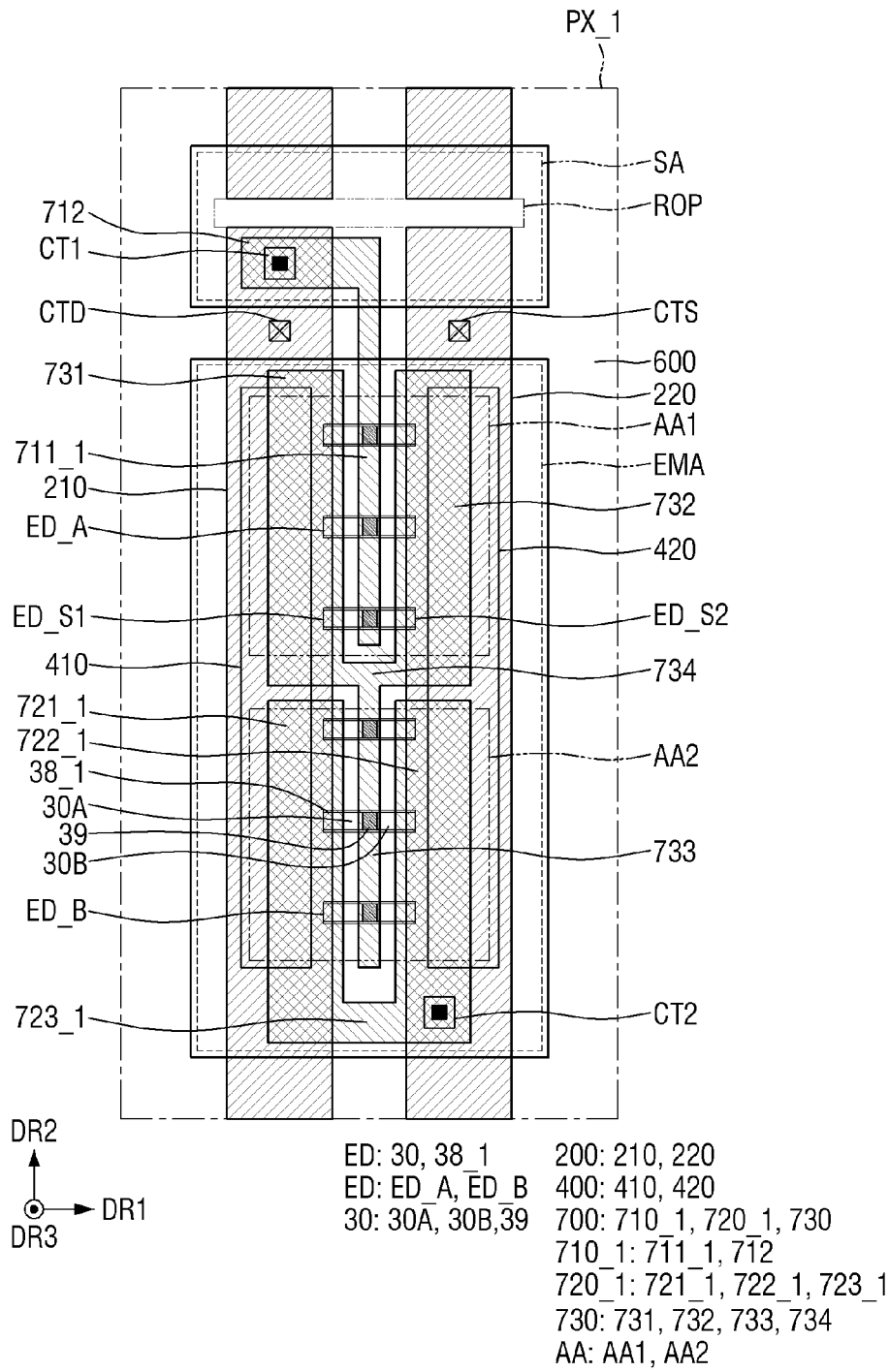
FIG. 21 is a schematic plan view illustrating another example of one pixel of a display device according to one embodiment.

FIG. 21 is a schematic plan view illustrating another example of one pixel of a display device according to one embodiment.

Referring to FIG. 21, one pixel PX_1 of the display device 10 according to an embodiment may be different from an embodiment of FIG. 12 in that the light emitting elements ED include a first light emitting element ED_A and a second light emitting element ED_B connected in series, and a connection electrode 700_1 further may include a third connection electrode 730 for connecting the first light emitting element ED_A to the second light emitting element ED_B.

For example, the emission area EMA may include an alignment area AA and a non-alignment area. The alignment area AA may include alignment areas spaced apart from each other. The non-alignment area may be disposed to surround the alignment area AA. For example, the non-alignment area may be the region other than the alignment area AA in the emission area EMA.

The alignment area AA may be the region in which the light emitting elements ED are concentrated, and the non-alignment area may be the region in which the degree of distribution of the light emitting elements ED is relatively low. Since the light emitted from the light emitting element ED arranged or disposed in the alignment area AA reaches the non-alignment area as well as the alignment area AA, the emission area EMA may include the alignment area AA and the non-alignment area. The alignment area AA and the non-alignment area may be distinguished depending on the number of the light emitting elements ED per unit area, the distribution or the density of the light emitting elements ED per unit area, or the like within the spirit and the scope of the disclosure.

The alignment area AA may include a first alignment area AA1 and a second alignment area AA2. The first alignment area AA1 and the second alignment area AA2 may be arranged or disposed along the fourth direction DR2. The first alignment area AA1 and the second alignment area AA2 may be spaced apart from each other along the fourth direction DR2.

The first alignment area AA1 may include the region between the first electrode 210 and the second electrode 220 and may be disposed on the upper side in a plan view in the emission area EMA. The second alignment area AA2 may include the region between the first electrode 210 and the second electrode 220 and may be disposed on the lower side in a plan view in the emission area EMA.

The light emitting elements ED arranged or disposed in the alignment areas AA spaced apart from each other may be connected in series. For example, the light emitting element ED disposed in the first alignment area AA1 (hereinafter, referred to as the first light emitting element ED_A) and the light emitting element ED disposed in the second alignment area AA2 (hereinafter, referred to as the second light emitting element ED_B) may be connected in series. Although not limited to the following, the light emitting elements ED disposed in the same alignment area AA may be connected in parallel to each other, and the light emitting elements ED disposed in the adjacent alignment areas AA may be connected in series. For example, the light emitting element ED of the display device 10 according to an embodiment may include the first light emitting element ED_A and the second light emitting element EDB connected in series.

The non-alignment area may be disposed to surround the first alignment area AA1 and the second alignment area AA2. The non-alignment area may include at least the region located between the first alignment area AA1 and the second alignment area AA2. The first light emitting element ED_A disposed in the first alignment area AA1 and the second light emitting element ED_B disposed in the second alignment area AA2 may be connected in series in the non-alignment area located between the first alignment area AA1 and the second alignment area AA2.

Each of the first electrode 210 and the second electrode 220 may be disposed across the first alignment area AA1 and the second alignment area AA2.

The first light emitting element ED_A may be disposed between the first electrode 210 and the second electrode 220 in the first alignment area AA1. The second light emitting element ED_B may be disposed between the first electrode 210 and the second electrode 220 in the second alignment area AA2. The first light emitting element ED_A and the second light emitting element ED_B may be connected in series through the third connection electrode 730 to be described later.

The first electrode 210 may be electrically connected to the first light emitting element ED_A through a first connection electrode 710_1, and a voltage may be applied so that the light emitting elements ED emit light. The second electrode 220 may be electrically connected to the second light emitting element ED_B through a second connection electrode 720_1, and a voltage may be applied so that the light emitting elements ED emit light.

In an embodiment, the connection electrode 700 may include the first connection electrode 710_1, the second connection electrode 720_1, and the third connection electrode 730.

The first connection electrode 710_1 may include a first contact electrode 711_1 and the first electrode contact pattern 712. The first contact electrode 711_1 of the first connection electrode 710_1 may be disposed in the first alignment area AA1, but may not be disposed in the second alignment area AA2. For example, the first contact electrode 711_1 of the first connection electrode 710_1 may extend in the fourth direction DR2 in the first alignment area AA1, and may be terminated to be separated from the lower side of the first alignment area AA1 so as not to extend toward the second alignment area AA2. The first electrode contact pattern 712 of the first connection electrode 710_1 may be disposed in the sub-region SA.

The first contact electrode 711_1 of the first connection electrode 710_1 may overlap the bonding layers 39 of first light emitting elements ED_A. The first contact electrode 711_1 of the first connection electrode 710_1 may be the region in contact with the bonding layer 39 of the first light emitting element ED_A, and the first electrode contact pattern 712 of the first connection electrode 710_1 may be the region in contact with the first electrode 210 through the first contact portion CT1.

The second connection electrode 720_1 may be spaced apart from the first connection electrode 710_1. The second connection electrode 720_1 may include a first sub-contact electrode 721_1, a second sub-contact electrode 722_1, and a connection pattern 723_1.

The first sub-contact electrode 721_1 of the second connection electrode 720_1 may be disposed on the first electrode 210 in the second alignment area AA2. The first sub-contact electrode 721_1 of the second connection electrode 720_1 may extend in the fourth direction DR2 in the second alignment area AA2, and may be terminated to be separated from the upper side of the second alignment area AA2 so as not to extend toward the first alignment area AA1. The first sub-contact electrode 721_1 of the second connection electrode 720_1 may be in contact with the first end ED_S1 of the second light emitting element ED_B.

The second sub-contact electrode 722_1 of the second connection electrode 720_1 may be spaced apart from the first sub-contact electrode 721_1 of the second connection electrode 720_1. The second sub-contact electrode 722_1 of the second connection electrode 720_1 may be disposed on the second electrode 220 in the second alignment area AA2. The second sub-contact electrode 722_1 of the second connection electrode 720_1 may extend in the fourth direction DR2 in the second alignment area AA2, and may be terminated to be separated from the upper side of the second alignment area AA2 so as not to extend toward the first alignment area AA1. The second sub-contact electrode 722_1 of the second connection electrode 720_1 may be in contact with the second end ED_S2 of the second light emitting element ED_B.

The connection pattern 723_1 of the second connection electrode 720_1 may be disposed between the first sub-contact electrode 721_1 of the second connection electrode 720_1 and the second sub-contact electrode 722_1 of the second connection electrode 720_1. The connection pattern 723_1 of the second connection electrode 720_1 may connect the first sub-contact electrode 721_1 of the second connection electrode 720_1 and the second sub-contact electrode 722_1 of the second connection electrode 720_1. The connection pattern 723_1 of the second connection electrode 720_1 may be disposed in the non-alignment area. A portion of the connection pattern 723_1 of the second connection electrode 720_1 may be in contact with the second electrode 220 through the second contact portion CT2. Although it is illustrated in the drawing that the second contact portion CT2 is disposed in the emission area EMA, the position of the second contact portion CT2 is not limited thereto. For example, the second contact portion CT2 may be disposed in the sub-region SA. A portion of the second connection electrode 720_1 may be disposed in the sub-region SA, and a portion of the second connection electrode 720_1 and the second electrode 220 may be in contact with each other through the second contact portion CT2 in the sub-region SA.

The first sub-contact electrode 721_1 and the second sub-contact electrode 722_1 of the second connection electrode 720_1 may be the contact electrodes in contact with the light emitting element ED in the alignment area AA, and the connection pattern 723_1 of the second connection electrode 720_1 may be the connection electrode for electrically connecting them.

The third connection electrode 730 may be spaced apart from the first connection electrode 710_1 and the second connection electrode 720_1. The third connection electrode 730 may include a first region 731, a second region 732, a third region 733, and a fourth region 734.

The first region 731 of the third connection electrode 730 may be disposed on the first electrode 210 in the first alignment area AA1. The first region 731 of the third connection electrode 730 may extend in the fourth direction DR2 in the first alignment area AA1, and may be terminated to be separated from the lower side of the first alignment area AA1 so as not to extend toward the second alignment area AA2. The first region 731 of the third connection electrode 730 may be in contact with the first end ED_S1 of the first light emitting element ED_A.

The second region 732 of the third connection electrode 730 may be spaced apart from the first region 731 of the third connection electrode 730. The second region 732 of the third connection electrode 730 may be disposed on the second electrode 220 in the first alignment area AA1. The second region 732 of the third connection electrode 730 may extend in the fourth direction DR2 in the first alignment area AA1, and may be terminated to be separated from the lower side of the first alignment area AA1 so as not to extend toward the second alignment area AA2. The second region 732 of the third connection electrode 730 may be in contact with the second end ED_S2 of the first light emitting element ED_A.

The third region 733 of the third connection electrode 730 may be disposed between the first sub-contact electrode 721_1 of the second connection electrode 720_1 and the second sub-contact electrode 722_1 of the second connection electrode 720_1 in the second alignment area AA2. The third region 733 of the third connection electrode 730 may extend in the fourth direction DR2 in the second alignment area AA2, and may be terminated to be separated from the upper side of the second alignment area AA2 so as not to extend toward the first alignment area AA1. Further, the third region 733 of the third connection electrode 730 may be terminated to be separated from the lower side of the second alignment area AA2 to be spaced apart from the connection pattern 723 of the second connection electrode 720.

The third region 733 of the third connection electrode 730 may overlap the bonding layers 39 of second light emitting elements ED_B. The third region 733 of the third connection electrode 730 may be in contact with the bonding layer 39 of the second light emitting element ED_B.

The fourth region 734 of the third connection electrode 730 may be disposed in the non-alignment area located between the first alignment area AA1 and the second alignment area AA2. The fourth region 734 of the third connection electrode 730 may be disposed between the first to third regions 731, 732, and 733 of the third connection electrode 730. The fourth region 734 of the third connection electrode 730 may be disposed between the first to third regions 731, 732, and 733 of the third connection electrode 730 to connect them. The fourth region 734 of the third connection electrode 730 may be the connection electrode for connecting the first light emitting element ED_A and the second light emitting element ED_B in series.

The first to third regions 731, 732, and 733 of the third connection electrode 730 may be the contact electrodes in contact with the light emitting element ED in the alignment area AA, and the fourth region 734 of the third connection electrode 730 may be the series connection electrode for electrically connecting them.

Figure 22:
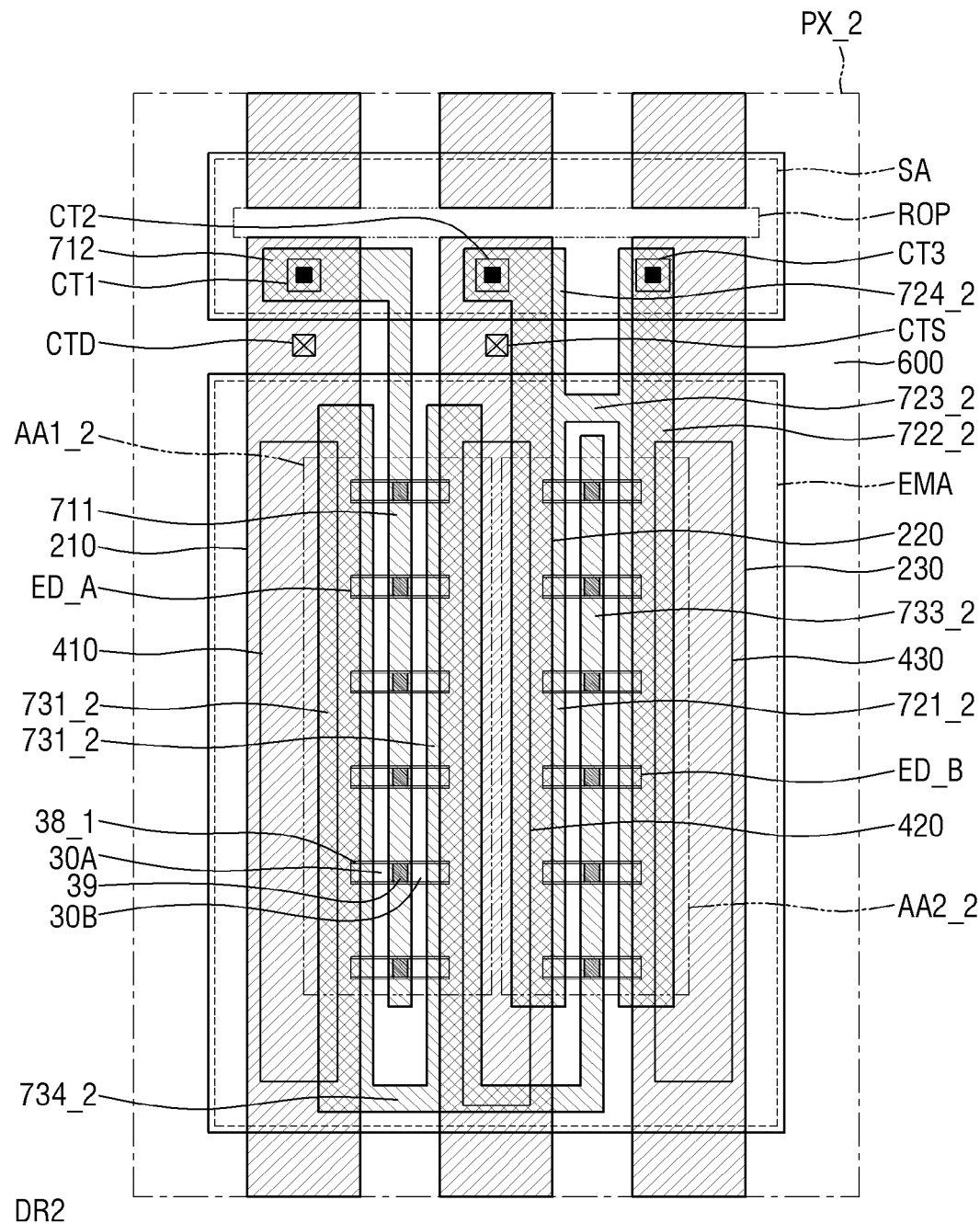
FIG. 22 is a schematic plan view illustrating another example of one pixel of a display device according to one embodiment.

FIG. 22 is a schematic plan view illustrating another example of one pixel of a display device according to one embodiment.

Referring to FIG. 22, one pixel PX_2 of the display device 10 according to an embodiment may be different from an embodiment of FIG. 12 in that an electrode layer 200_2 further may include a third electrode 230, the light emitting elements ED further include the second light emitting element ED_B disposed between the second electrode 220_2 and the third electrode 230, and a connection electrode 700_2 further may include a third connection electrode 730_2 for connecting the first light emitting element ED_A and the second light emitting element ED_B.

For example, in an embodiment, a first bank 400_2 may further include a third sub-bank 430 spaced apart from the first sub-bank 410 and the second sub-bank 420. The third sub-bank 430 may be spaced apart from the first sub-bank 410 and the second sub-bank 420 in the third direction DR1. For example, the second sub-bank 420 may be disposed between the first sub-bank 410 and the third sub-bank 430.

The electrode layer 200_2 may further include the third electrode 230 spaced apart from the first electrode 210 and the second electrode 220. The third electrode 230 may be spaced apart from the first electrode 210 and the second electrode 220 in the third direction DR1. The second electrode 220 may be disposed between the first electrode 210 and the third electrode 230. The third electrode 230 may be disposed on the third sub-bank 430. The third electrode 230 may not be electrically connected to the circuit element layer CCL unlike the first electrode 210 and the second electrode 220.

The first electrode 210 may be electrically connected to the first light emitting element ED_A through the first connection electrode 710, and a voltage may be applied so that the light emitting elements ED emit light. The second electrode 220 may be electrically connected to the second light emitting element ED_B through a second connection electrode 720_2, and a voltage may be applied so that the light emitting elements ED emit light. As will be described later, the first electrode 210 may be electrically connected to the bonding layer 39 of the first light emitting element ED_A through the first connection electrode 710, and the second electrode 220 may be electrically connected to both ends ED_S1 and ED_S2 of the second light emitting element ED_B through the second connection electrode 720_2.

An alignment area AA_2 may include a first alignment area AA1_2 and a second alignment area AA2_2 arranged or disposed along the third direction DR1. The first alignment area AA1_2 and the second alignment area AA2_2 may be spaced apart from each other along the third direction DR1.

The first alignment area AA1_2 may include the region between the first electrode 210 and the second electrode 220, and may be disposed on the left side in a plan view in the emission area EMA. The second alignment area AA2_2 may include the region between the second electrode 220 and the third electrode 230, and may be disposed on the right side in a plan view in the emission area EMA.

The light emitting elements ED disposed in the alignment areas AA_2 spaced apart from each other may be connected in series. For example, the first light emitting element ED_A disposed in the first alignment area AA1_2 and the second light emitting element ED_B disposed in the second alignment area AA2_2 may be connected in series.

The light emitting element ED may include the first light emitting element ED_A disposed in the first alignment area AA1_2 and the second light emitting element ED_B disposed in the second alignment area AA2_2. The first light emitting element ED_A may be disposed between the first electrode 210 and the second electrode 220, and the second light emitting element ED_B may be disposed between the second electrode 220 and the third electrode 230.

The connection electrode 700_2 may include the first connection electrode 710, the second connection electrode 720_2, and the third connection electrode 730_2 that are spaced apart from one another.

The first connection electrode 710 may include the first contact electrode 711 and the first electrode contact pattern 712.

The first contact electrode 711 of the first connection electrode 710 may be disposed in the first alignment area AA1_2. The first contact electrode 711 of the first connection electrode 710 may overlap the bonding layers 39 of the first light emitting elements ED_A in the first alignment area AA1_2. The first contact electrode 711 of the first connection electrode 710 may extend in the fourth direction DR2 in the first alignment area AA1_2. The first contact electrode 711 of the first connection electrode 710 may be in contact with the bonding layers 39 of the first light emitting elements ED_A.

The first electrode contact pattern 712 of the first connection electrode 710 may be electrically connected to the first electrode 210 through the first contact portion CT1 in the sub-region SA.

The first connection electrode 710 may transmit the electrical signal applied from the first contact portion CT1 to the first electrode 210 to the bonding layer 39 of the first light emitting element ED_A.

The second connection electrode 720_2 may include a first sub-contact electrode 721_2, a second sub-contact electrode 722_2, a connection pattern 723_2, and a second electrode contact pattern 724_2.

The first sub-contact electrode 721_2 of the second connection electrode 720_2 may be disposed in the second alignment area AA2_2. The first sub-contact electrode 721_2 of the second connection electrode 720_2 may be disposed on the second electrode 220 in the second alignment area AA2_2. The first sub-contact electrode 721_2 of the second connection electrode 720_2 may extend in the fourth direction DR2 in the second alignment area AA2_2. The first sub-contact electrode 721_2 of the second connection electrode 720_2 may be in contact with the first end ED_S1 of the second light emitting element ED_B.

The second sub-contact electrode 722_2 of the second connection electrode 720_2 may be disposed in the second alignment area AA2_2 and the sub-region SA.

The second sub-contact electrode 722_2 of the second connection electrode 720_2 may be spaced apart from the first sub-contact electrode 721_2 of the second connection electrode 720_2 in the second alignment area AA2_2. The second sub-contact electrode 722_2 of the second connection electrode 720_2 may be disposed on the third electrode 230 in the second alignment area AA2_2. The second sub-contact electrode 722_2 of the second connection electrode 720_2 may extend in the fourth direction DR2 in the second alignment area AA2_2. The second sub-contact electrode 722_2 of the second connection electrode 720_2 may be in contact with the second end ED_S2 of the second light emitting element ED_B.

The second sub-contact electrode 722_2 of the second connection electrode 720_2 may be disposed in a portion of the sub-region SA while extending from the second alignment area AA2_2 to the sub-region SA. The second sub-contact electrode 722_2 of the second connection electrode 720_2 may be electrically connected to the third electrode 230 through a third contact portion CT3 in the sub-region SA. For example, the second sub-contact electrode 722_2 of the second connection electrode 720_2 may be in contact with the third electrode 230 exposed by the third contact portion CT3. Since the second sub-contact electrode 722_2 of the second connection electrode 720_2 and the third electrode 230 are brought into contact with each other through the third contact portion CT3, it is possible to minimize occurrence of a parasitic capacitance between the second connection electrode 720_2 and the third electrode 230. Although it is illustrated in the drawing that the second connection electrode 720_2 is in contact with the third electrode 230, the disclosure is not limited thereto. For example, the third electrode 230 and the second connection electrode 720_2 may not be in contact with each other.

The connection pattern 723_2 of the second connection electrode 720_2 may be disposed between the first sub-contact electrode 721_2 of the second connection electrode 720_2 and the second sub-contact electrode 722_2 of the second connection electrode 720_2. The connection pattern 723_2 of the second connection electrode 720_2 may be disposed between the first sub-contact electrode 721_2 of the second connection electrode 720_2 and the second sub-contact electrode 722_2 of the second connection electrode 720_2 to connect them. Since the first sub-contact electrode 721_2 of the second connection electrode 720_2 and the second sub-contact electrode 722_2 of the second connection electrode 720_2 are connected by the connection pattern 723_2 of the second connection electrode 720_2, the electrical signal applied from the second electrode 220 may be equally transmitted to both ends ED_S1 and ED_S2 of the second light emitting element ED_B.

A second electrode contact pattern 724_1 of the second connection electrode 720_2 may be disposed in the sub-region SA. The second electrode contact pattern 724_1 of the second connection electrode 720_2 may be electrically connected to the second electrode 220 through the second contact portion CT2 in the sub-region SA.

The third connection electrode 730_2 may include a first region 731_2, a second region 732_2, a third region 733_2, and a fourth region 734_2.

The first region 731_2 of the third connection electrode 730_2 may be disposed in the first alignment area AA1_2. The first region 731_2 of the third connection electrode 730_2 may be disposed on the first electrode 210 in the first alignment area AA1_2. The first region 731_2 of the third connection electrode 730_2 may extend in the fourth direction DR2 in the first alignment area AA1_2. The first region 731_2 of the third connection electrode 730_2 may be in contact with the first end ED_S1 of the first light emitting element ED_A.

The second region 732_2 of the third connection electrode 730_2 may be disposed in the first alignment area AA1_2. The second region 732_2 of the third connection electrode 730_2 may be spaced apart from the first region 731_2 of the third connection electrode 730_2 in the first alignment area AA1_2. The second region 732_2 of the third connection electrode 730_2 may be disposed on the second electrode 220 in the first alignment area AA1_2. The second region 732_2 of the third connection electrode 730_2 may be spaced apart from the first sub-contact electrode 721_2 of the second connection electrode 720_2 on the second electrode 220.

The second region 732_2 of the third connection electrode 730_2 may extend in the fourth direction DR2 in the first alignment area AA1_2. The second region 732_2 of the third connection electrode 730_2 may be in contact with the second end ED_S2 of the first light emitting element ED_A.

The third region 733_2 of the third connection electrode 730_2 may be disposed in the second alignment area AA2_2. The third region 733_2 of the third connection electrode 730_2 may overlap the bonding layers 39 of the second light emitting elements ED_B in the second alignment area AA2_2. The third region 733_2 of the third connection electrode 730_2 may extend in the fourth direction DR2 in the second alignment area AA2_2. The third region 733_2 of the third connection electrode 730_2 may be in contact with the bonding layers 39 of the second light emitting elements ED_B.

The fourth region 734_2 of the third connection electrode 730_2 may be disposed in the non-alignment area. The fourth region 734_2 of the third connection electrode 730_2 may connect the lower ends of the first to third regions 731_2, 732_2, and 733_2 of the third connection electrode 730_2. The fourth region 734_2 of the third connection electrode 730_2 may be disposed between the first to third regions 731_2, 732_2, and 733_2 of the third connection electrode 730_2 to connect them. The fourth region 734_2 of the third connection electrode 730_2 may be the connection electrode for connecting the first light emitting element ED_A and the second light emitting element ED_B in series.

Figure 23:
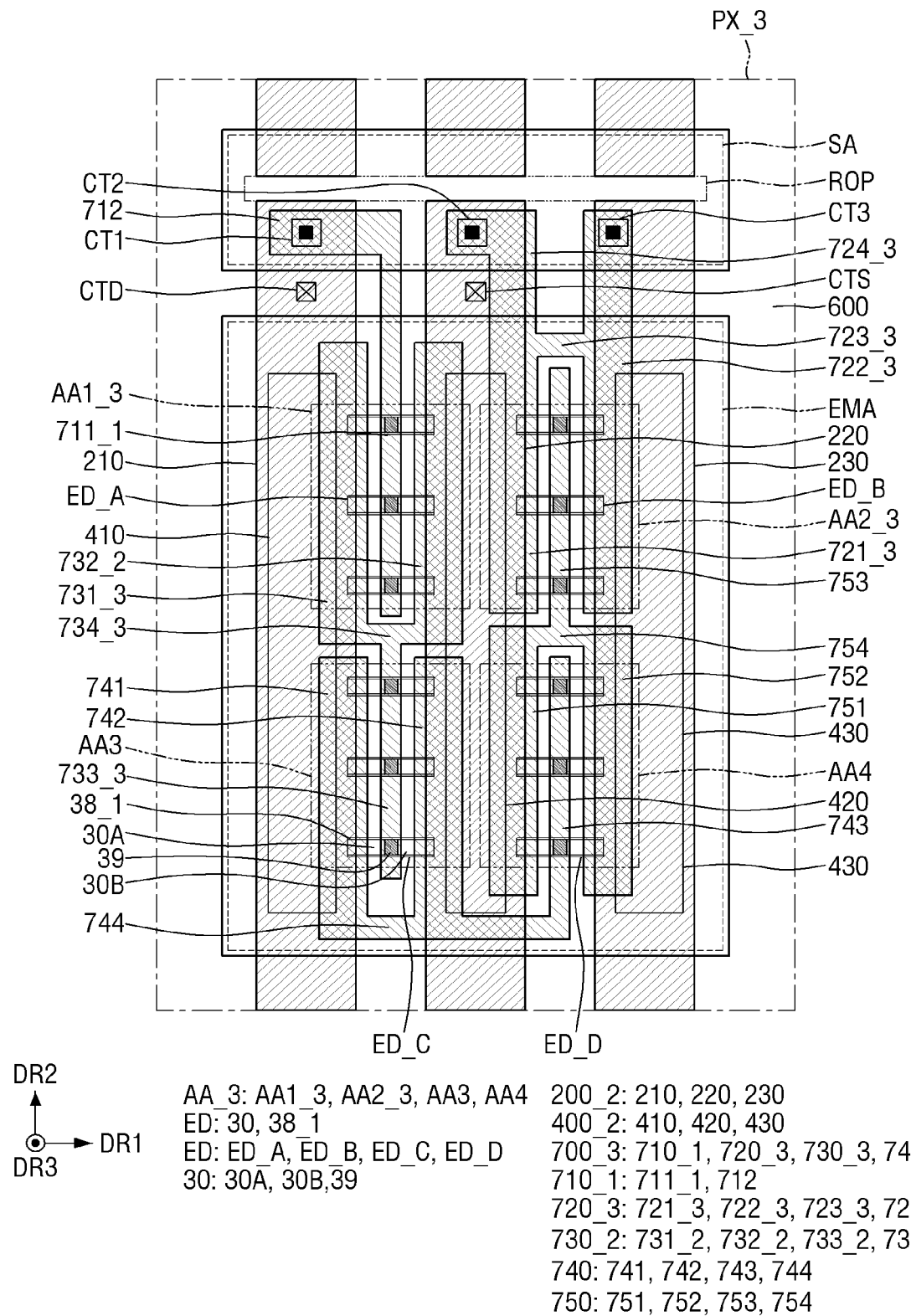
FIG. 23 is a schematic plan view showing another example of one pixel of a display device according to one embodiment.

FIG. 23 is a schematic plan view showing another example of one pixel of a display device according to one embodiment.

Referring to FIG. 23, one pixel PX_3 of the display device 10 according to an embodiment may be different from an embodiment of FIG. 22 in that the light emitting elements ED may further include third and fourth light emitting elements ED_C and ED_D and a connection electrode 700_3 further may include fourth and fifth connection electrodes 740 and 750.

For example, in an embodiment, the alignment area AA_3 may include a first alignment area AA1_3, a second alignment area AA2_3, a third alignment area AA3, and a fourth alignment area AA4.

The first alignment area AA1_3 may include the region between the first electrode 210 and the second electrode 220, and may be disposed on the upper left side in a plan view in the emission area EMA. The second alignment area AA2_3 may include the region between the second electrode 220 and the third electrode 230, and may be disposed on the upper right side in a plan view in the emission area EMA.

The third alignment area AA3 may include the region between the first electrode 210 and the second electrode 220, and may be disposed on the lower left side in a plan view in the emission area EMA. The fourth alignment area AA4 may include the region between the second electrode 220 and the third electrode 230, and may be disposed on the lower right side in a plan view in the emission area EMA.

The light emitting elements ED may include the first light emitting element ED_A disposed in the first alignment area AA1_3, the second light emitting element ED_B disposed in the second alignment area AA2_3, the third light emitting element ED_C disposed in the third alignment area AA3, and the fourth light emitting element ED_D disposed in the fourth alignment area AA4. The light emitting elements ED disposed in different alignment areas AA_3 may be connected in series, and the light emitting elements ED disposed in the same alignment area AA_3 may be connected in parallel. For example, the first light emitting element ED_A disposed in the first alignment area AA1_3, the second light emitting element ED_B disposed in the second alignment area AA2_3, the third light emitting element ED_C disposed in the third alignment area AA3, and the fourth light emitting element ED_D disposed in the fourth alignment area AA4 may be connected in series.

The first light emitting element ED_A may be disposed between the first electrode 210 and the second electrode 220 in the first alignment area AA1_3. The second light emitting element ED_B may be disposed between the second electrode 220 and the third electrode 230 in the second alignment area AA2_3. The third light emitting element ED_C may be disposed between the first electrode 210 and the second electrode 220 in the third alignment area AA3. The fourth light emitting element ED_D may be disposed between the second electrode 220 and the third electrode 230 in the fourth alignment area AA4.

The connection electrode 700_3 may include the first connection electrode 710_1, a second connection electrode 720_3, a third connection electrode 730_3, a fourth connection electrode 740, and a fifth connection electrode 750.

The first connection electrode 710_1 may include the first contact electrode 711_1 and the first electrode contact pattern 712. The first contact electrode 711_1 of the first connection electrode 710_1 may extend in the fourth direction DR2 in the first alignment area AA3, and may be terminated to be separated from the lower side of the first alignment area AA1_3 so as not to extend toward the third alignment area AA3.

The second connection electrode 720_3 may include a first sub-contact electrode 721_3, a second sub-contact electrode 722_3, a connection pattern 723_3, and a second electrode contact pattern 724_3. The first sub-contact electrode 721_3 and the second sub-contact electrode 722_3 of the second connection electrode 720_3 may extend in the fourth direction DR2 in the second alignment area AA2_3, and may be terminated to be separated from the lower side of the second alignment area AA2_3 so as not to extend toward the fourth alignment area AA4.

The second sub-contact electrode 722_3 of the second connection electrode 720_3 may be disposed in a portion of the sub-region SA while extending from the second alignment area AA2_3 to the sub-region SA. The second sub-contact electrode 722_3 of the second connection electrode 720_3 may be electrically connected to the third electrode 230 through the third contact portion CT3. Since the second sub-contact electrode 722_3 of the second connection electrode 720_3 and the third electrode 230 are brought into contact with each other through the third contact portion CT3, it is possible to minimize occurrence of a parasitic capacitance between the second connection electrode 720_2 and the third electrode 230.

The third connection electrode 730_3 may include a first region 731_3, a second region 732_3, a third region 733_3, and a fourth region 734_3.

The first region 731_3 of the third connection electrode 730_3 may be disposed on the first electrode 210 in the first alignment area AA1_3. The first region 731_3 of the third connection electrode 730_3 may extend in the fourth direction DR2 in the first alignment area AA1_3, and may be terminated to be separated from the lower side of the first alignment area AA1_3 so as not to extend toward the third alignment area AA3. The first region 731_3 of the third connection electrode 730_3 may be in contact with the first end ED_S1 of the first light emitting element ED_A.

The second region 732_3 of the third connection electrode 730_3 may be spaced apart from the first region 731_3 of the third connection electrode 730_3. The second region 732_3 of the third connection electrode 730_3 may be disposed on the second electrode 220 in the first alignment area AA1_3. The second region 732_3 of the third connection electrode 730_3 may be spaced apart from the first sub-contact electrode 721_3 of the second connection electrode 720_3 on the second electrode 220. The second region 732_3 of the third connection electrode 730_3 may extend in the fourth direction DR2 in the first alignment area AA1_3, and may be terminated to be separated from the lower side of the first alignment area AA1_3 so as not to extend toward the third alignment area AA3. The second region 732_3 of the third connection electrode 730_3 may be in contact with the second end ED_S2 of the first light emitting element ED_A.

The third region 733_3 of the third connection electrode 730_3 may be disposed in the third alignment area AA3. The third region 733_3 of the third connection electrode 730_3 may overlap the bonding layer 39 of the third light emitting element ED_C in the third alignment area AA3. The third region 733_3 of the third connection electrode 730_3 may be in contact with the bonding layer 39 of the third light emitting element ED_C in the third alignment area AA3. The third region 733_3 of the third connection electrode 730_3 may extend in the fourth direction DR2 in the third alignment area AA3, and may be terminated to be separated from the upper side of the second alignment area AA2 so as not to extend toward the first alignment area AA1.

The fourth region 734_3 of the third connection electrode 730_3 may connect the first to third regions 731_3, 732_3, and 733_3 of the third connection electrode 730_3.

The fourth connection electrode 740 may include a first region 741, a second region 742, a third region 743, and a fourth region 744.

The first region 741 of the fourth connection electrode 740 may be disposed on the first electrode 210 in the third alignment area AA3. The first region 741 of the fourth connection electrode 740 may extend in the fourth direction DR2 in the third alignment area AA3, and may be terminated to be separated from the upper side of the third alignment area AA3 so as not to extend toward the first alignment area AA1_3. The first region 741 of the fourth connection electrode 740 may be in contact with the first end ED_S1 of the third light emitting element ED_C.

The second region 742 of the fourth connection electrode 740 may be spaced apart from the first region 741 of the fourth connection electrode 740. The second region 742 of the fourth connection electrode 740 may be disposed on the second electrode 220 in the third alignment area AA3. The second region 742 of the fourth connection electrode 740 may extend in the fourth direction DR2 in the third alignment area AA3, and may be terminated to be separated from the upper side of the third alignment area AA3 so as not to extend toward the first alignment area AA1_3. The second region 742 of the fourth connection electrode 740 may be in contact with the second end ED_S2 of the third light emitting element ED_C.

The third region 743 of the fourth connection electrode 740 may be disposed between the second electrode 220 and the third electrode 230 in a plan view in the fourth alignment area AA4. The third region 743 of the fourth connection electrode 740 may be disposed between a first region 751 and a second region 752 of the fifth connection electrode 750 to be described later in the fourth alignment area AA4. The third region 743 of the fourth connection electrode 740 may extend in the fourth direction DR2 in the fourth alignment area AA4, and may be terminated to be separated from the upper side of the fourth alignment area AA4 so as not to extend toward the second alignment area AA2_3.

The third region 743 of the fourth connection electrode 740 may overlap the bonding layers 39 of fourth light emitting elements ED_D. The third region 743 of the fourth connection electrode 740 may be in contact with the bonding layer 39 of the fourth light emitting element ED_D.

The fourth region 744 of the fourth connection electrode 740 may be disposed in the non-alignment area. The fourth region 744 of the fourth connection electrode 740 may be disposed between the first to third regions 741, 742, and 743 of the fourth connection electrode 740. The fourth region 744 of the fourth connection electrode 740 may be disposed between the first to third regions 741, 742, and 743 of the fourth connection electrode 740 to connect them.

The first to third regions 741, 742, and 743 of the fourth connection electrode 740 may be the contact electrodes in contact with the light emitting element ED in the alignment area AA, and the fourth region 744 of the fourth connection electrode 740 may be the connection electrode for electrically connecting them.

The fifth connection electrode 750 may include the first region 751, the second region 752, a third region 753, and a fourth region 754.

The first region 751 of the fifth connection electrode 750 may be disposed on the second electrode 220 in the fourth alignment area AA4. The first region 751 of the fifth connection electrode 750 may be spaced apart from the second region 742 of the fourth connection electrode 740 on the second electrode 220. The first region 751 of the fifth connection electrode 750 may extend in the fourth direction DR2 in the fourth alignment area AA4, and may be terminated to be separated from the upper side of the fourth alignment area AA4 so as not to extend toward the second alignment area AA2_3. The first region 751 of the fifth connection electrode 750 may be in contact with the first end ED_S1 of the fourth light emitting element ED_D.

The second region 752 of the fifth connection electrode 750 may be spaced apart from the first region 751 of the fifth connection electrode 750. The second region 752 of the fifth connection electrode 750 may be spaced apart from the first region 751 of the fifth connection electrode 750 with the third region 743 of the fourth connection electrode 740 interposed between. The second region 752 of the fifth connection electrode 750 may be disposed on the third electrode 230 in the fourth alignment area AA4. The second region 752 of the fifth connection electrode 750 may extend in the fourth direction DR2 in the fourth alignment area AA4, and may be terminated to be separated from the upper side of the fourth alignment area AA4 so as not to extend toward the second alignment area AA2_3. The second region 752 of the fifth connection electrode 750 may be in contact with the second end ED_S2 of the fourth light emitting element ED_D.

The third region 753 of the fifth connection electrode 750 may be disposed between the second electrode 220 and the third electrode 230 in a plan view in the second alignment area AA2_3. The third region 753 of the fifth connection electrode 750 may be disposed between the first sub-contact electrode 721_3 and the second sub-contact electrode 722_3 of the second connection electrode 720_3 in the second alignment area AA2_3. The third region 753 of the fifth connection electrode 750 may extend in the fourth direction DR2 in the second alignment area AA2_3, and may be terminated to be separated from the upper side of the second alignment area AA2_3 to be spaced apart from the connection pattern 723_3 of the second connection electrode 720_3.

The fifth region 753 of the fifth connection electrode 750 may overlap the bonding layers 39 of the second light emitting elements ED_B. The third region 753 of the fifth connection electrode 750 may be in contact with the bonding layer 39 of the second light emitting element ED_B.

The fourth region 754 of the fifth connection electrode 750 may be disposed in the non-alignment area. The fourth region 754 of the fifth connection electrode 750 may be disposed between the first to third regions 751, 752, and 753 of the fifth connection electrode 750. The fourth region 754 of the fifth connection electrode 750 may be disposed between the first to third regions 751, 752, and 753 of the fifth connection electrode 750 to connect them.

The first to third regions 751, 752, and 753 of the fifth connection electrode 750 may be the contact electrodes in contact with the light emitting element ED in the alignment area AA, and the fourth region 754 of the fifth connection electrode 750 may be the connection electrode for electrically connecting them.

In an embodiment, the first light emitting element ED_A and the third light emitting element ED_C may be connected in series through the third connection electrode 730_3, the third light emitting element ED_C and the fourth light emitting element ED_D may be connected in series through the fourth connection electrode 740, and the fourth light emitting element ED_D and the second light emitting element ED_B may be connected in series through the fifth connection electrode 750. For example, the first region 731_3 of the third connection electrode 730_3 and the second region 732_3 of the third connection electrode 730_3 are connected to both ends ED_S1 and ED_S2 of the first light emitting element ED_A, respectively, and the third region 733_3 of the third connection electrode 730_3 is connected to the central portion of the third light emitting element ED_C, for example, the bonding layer 39 of the third light emitting element ED_C, so that the first light emitting element ED_A and the third light emitting element ED_C may be connected in series. Further, the first region 741 of the fourth connection electrode 740 and the second region 742 of the fourth connection electrode 740 are in contact with both ends ED_S1 and ED_S2 of the third light emitting element ED_C, respectively, and the third region 743 of the fourth connection electrode 740 is in contact with the central portion of the fourth light emitting element ED_D, for example, the bonding layer 39 of the fourth light emitting element ED_D, so that the third light emitting element ED_C and the fourth light emitting element ED_D may be connected in series. Further, the first region 751 of the fifth connection electrode 750 and the second region 752 of the fifth connection electrode 750 are in contact with both ends ED_S1 and ED_S2 of the fourth light emitting element ED_D, respectively, and the third region 753 of the fifth connection electrode 750 is in contact with the central portion of the second light emitting element ED_B, for example, the bonding layer 39 of the second light emitting element ED_B, so that the fourth light emitting element ED_D and the second light emitting element ED_B may be connected in series. Therefore, the electrical signal applied to the first electrode 210 may be transmitted to the first connection electrode 710 through the first contact portion CT1 and transmitted to the bonding layer 39 of the first light emitting element ED_A, and the electrical signal transmitted to the second electrode 220 may be transmitted to the second connection electrode 720 through the second contact portion CT2 and transmitted to both ends ED_S1 and ED_S2 of the second light emitting element ED_B, so that the first to fourth light emitting elements ED_A, ED_B, ED_C, and ED_D may be connected in series between the first electrode 210 and the second electrode 220.

Hereinafter, other embodiments of the light emitting element will be described with reference to other drawings. In the following embodiments, a description of the same components as those of the light emitting element according to the above-described embodiment will be omitted or simplified, and differences will be described.

Figure 24:
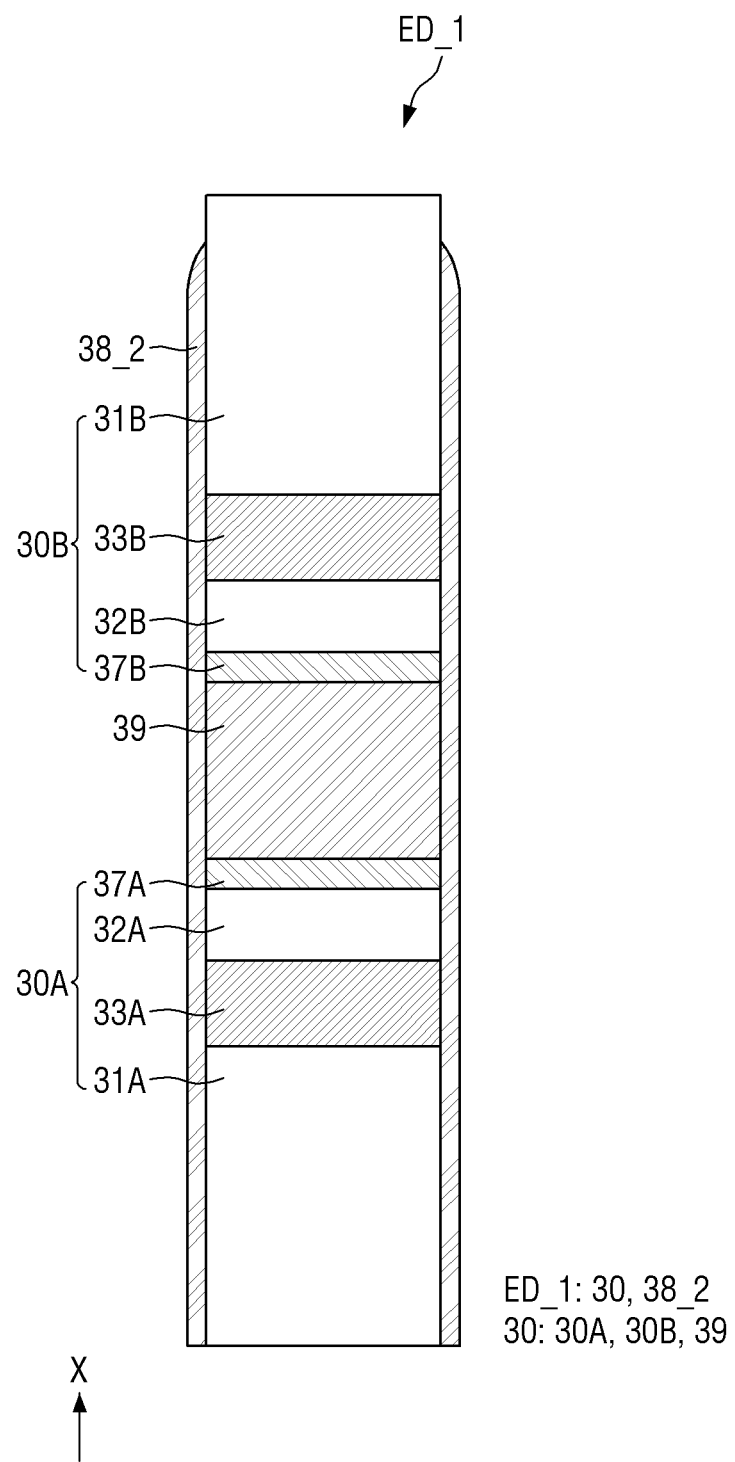
FIG. 24 is a schematic cross-sectional view of a light emitting element according to an embodiment.

FIG. 24 is a schematic cross-sectional view of a light emitting element according to an embodiment.

Referring to FIG. 24, a light emitting element ED 1 according to an embodiment may be different from the light emitting element ED of FIG. 2 in that an element insulating film 38_2 exposes a portion of the side surface of the core structure 30.

For example, the element insulating film 38_2 may expose the side surface of one of both ends ED_S1 and ED_S2 of the light emitting element ED_1. For example, the element insulating film 38_2 may expose the side surface of the second end ED_S2 of the light emitting element ED_1. The element insulating film 38_2 may completely surround the side surface of the first semiconductor layer 31A of the first light emitting element core 30A, and may expose a portion of the side surface of the first semiconductor layer 31B of the second light emitting element core 30B.

The light emitting element ED_1 according to an embodiment may be formed in the process of removing the insulating material layer 380 during the manufacturing process of the light emitting element ED_1 described with reference to FIGS. 8 and 9. For example, since the first light emitting element core 30A is disposed at the lower side and the second light emitting element core 30B is disposed at the upper side on the first base substrate 1000A, the insulating material layer 380 disposed at the upper side may be over-etched in the etching process of removing a portion of the insulating material layer 380, thereby forming the light emitting element ED_1 of FIG. 24. For example, since the first light emitting element core 30A is disposed at the lower side and the second light emitting element core 30B is disposed at the upper side on the first base substrate 1000A, the insulating material layer 380 surrounding the side surface of the first semiconductor layer 31B of the second light emitting element core 30B disposed at the upper side may be over-etched, thereby forming the light emitting element ED_1 of an embodiment.

Figure 25:
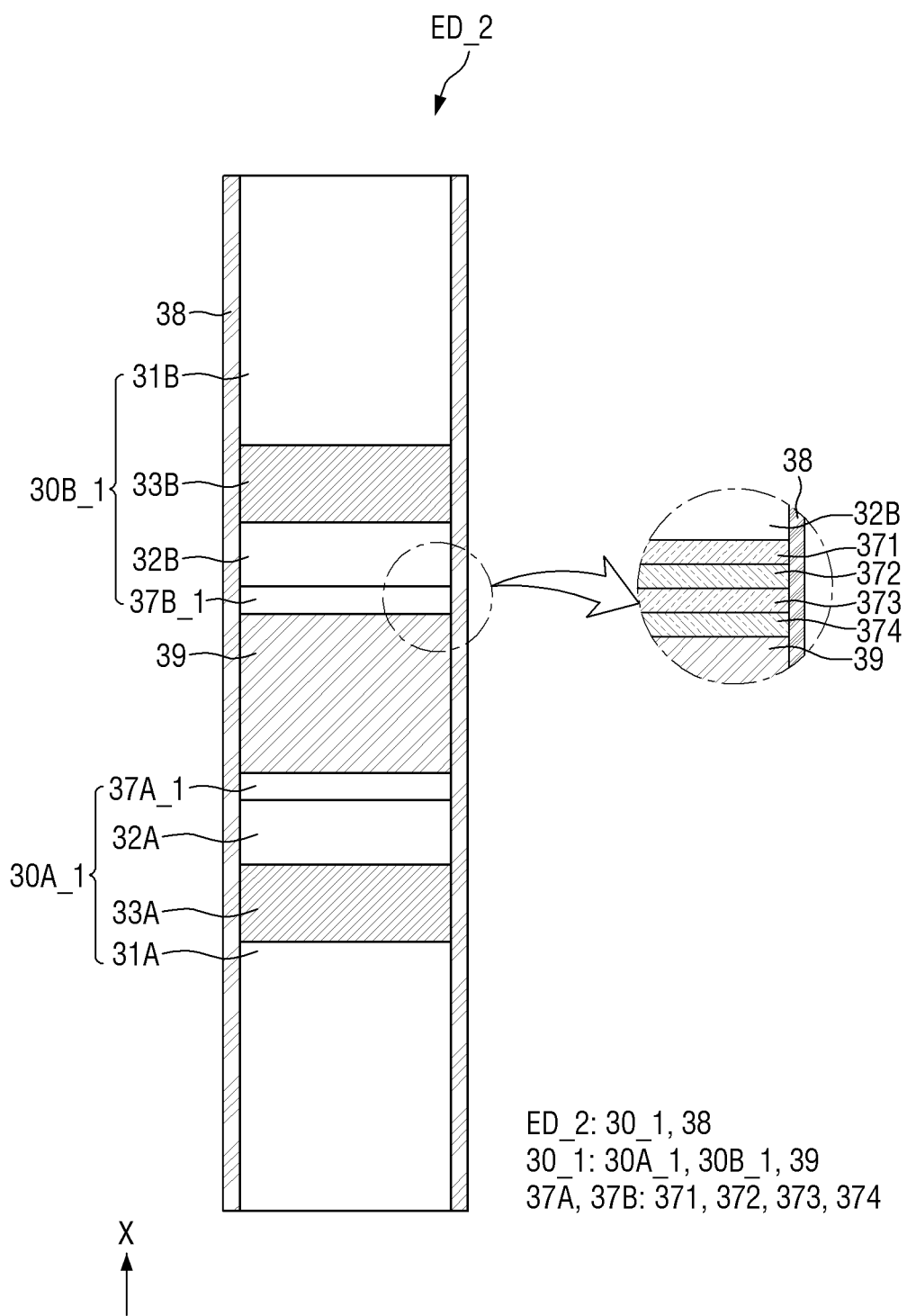
FIG. 25 is a schematic cross-sectional view of a light emitting element according to an embodiment.

FIG. 25 is a schematic cross-sectional view of a light emitting element according to an embodiment.

Referring to FIG. 25, a light emitting element ED 2 according to an embodiment may be different from the light emitting element ED of FIG. 2 in that a reflective electrode layer 37A_1 included in the first light emitting element core 30A and a reflective electrode layer 37B_1 included in the second light emitting element core 30B contain a distributed Bragg reflector (DBR) instead of a metal material having high reflectivity.

For example, a first reflective electrode layer 37A_1 included in the first light emitting element core 30A and a second reflective electrode layer 37B_1 included in the second light emitting element core 30B may serve to reflect the light generated from the first and second element active layers 33A and 33B and traveling to the central portion of a core structure 30_1 toward both ends of the core structure 30_1, respectively. For example, the first reflective electrode layer 37A_1 of the first light emitting element core 30A_1 may serve to adjust transmission and reflection of the light emitted from the first element active layer 33A of the first light emitting element core 30A_1 and incident on the first reflective electrode layer 37A_1. Further, the second reflective electrode layer 37B_1 of the second light emitting element core 30B_1 may serve to adjust transmission and reflection of the light emitted from the second element active layer 33B of the second light emitting element core 30B_1 and incident on the second reflective electrode layer 37B_1.

The structure of the first reflective electrode layer 37A_1 and the structure of the second reflective electrode layer 37B_1 may be substantially the same. The first reflective electrode layer 37A_1 and the second reflective electrode layer 37B_1 may contain the same material or a similar material. Each of the first reflective electrode layer 37A_1 and the second reflective electrode layer 37B_1 may contain the distributed Bragg reflector (DBR). The first reflective electrode layer 37A_1 and the second reflective electrode layer 37B_1 may have a structure in which optical layers including oxide films having different refractive indices may be repeatedly stacked each other.

The first reflective electrode layer 37A_1 and the second reflective electrode layer 37B_1 may have a structure in which oxide films 371, 372, 373, and 374 having different refractive indices may be stacked each other. For example, each of the first reflective electrode layer 37A_1 and the second reflective electrode layer 37B_1 may include a first oxide film 371 having a first refractive index n1, a second oxide film 372 having a second refractive index n2 different from the first refractive index n1, a third oxide film 373 having the first refractive index n1, and a fourth oxide film 374 having the second refractive index n2. The first oxide film 371 and the third oxide film 373 may be the same, and the second oxide film 372 and the fourth oxide film 374 may be the same, but the disclosure is not limited thereto. The first to fourth oxide films 371, 372, 373, and 374 may be sequentially stacked each other along one direction X that is the extension direction of the core structure 30_1. For example, each of the first reflective electrode layer 37A_1 and the second reflective electrode layer 37B_1 may have a structure in which the first oxide film 371 having the first refractive index n1 and the second oxide film 372 having the second refractive index n2 different from the first refractive index n1 may be alternately and repeatedly stacked each other.

Although the first reflective electrode layer 37A_1 and the second reflective electrode layer 37B_1, each including the first to fourth oxide films 371, 372, 373, and 374, are illustrated in the drawing, the disclosure is not limited thereto. For example, each of the first reflective electrode layer 37A_1 and the second reflective electrode layer 37B_1 may be formed by stacking a larger number of oxide films.

In accordance with the light emitting element ED_2 of an embodiment, although the first reflective electrode layer 37A_1 and the second reflective electrode layer 37B_1 do not contain a metal material having high reflectivity, since each of the first reflective electrode layer 37A_1 and the second reflective electrode layer 37B_1 contains the distributed Bragg reflector (DBR), the light emitted from the first and second light emitting element cores 30A_1 and 30B_1 may be reflected to both ends of the light emitting element ED_2. Further, since each of the first reflective electrode layer 37A_1 and the second reflective electrode layer 37B_1 may include the oxide films, the electrical signal applied from the bonding layer 39 may be transmitted to the second semiconductor layer 32A of the first light emitting element core 30A_1 and the second semiconductor layer 33B of the second light emitting element core 30B_1.

Figure 26:
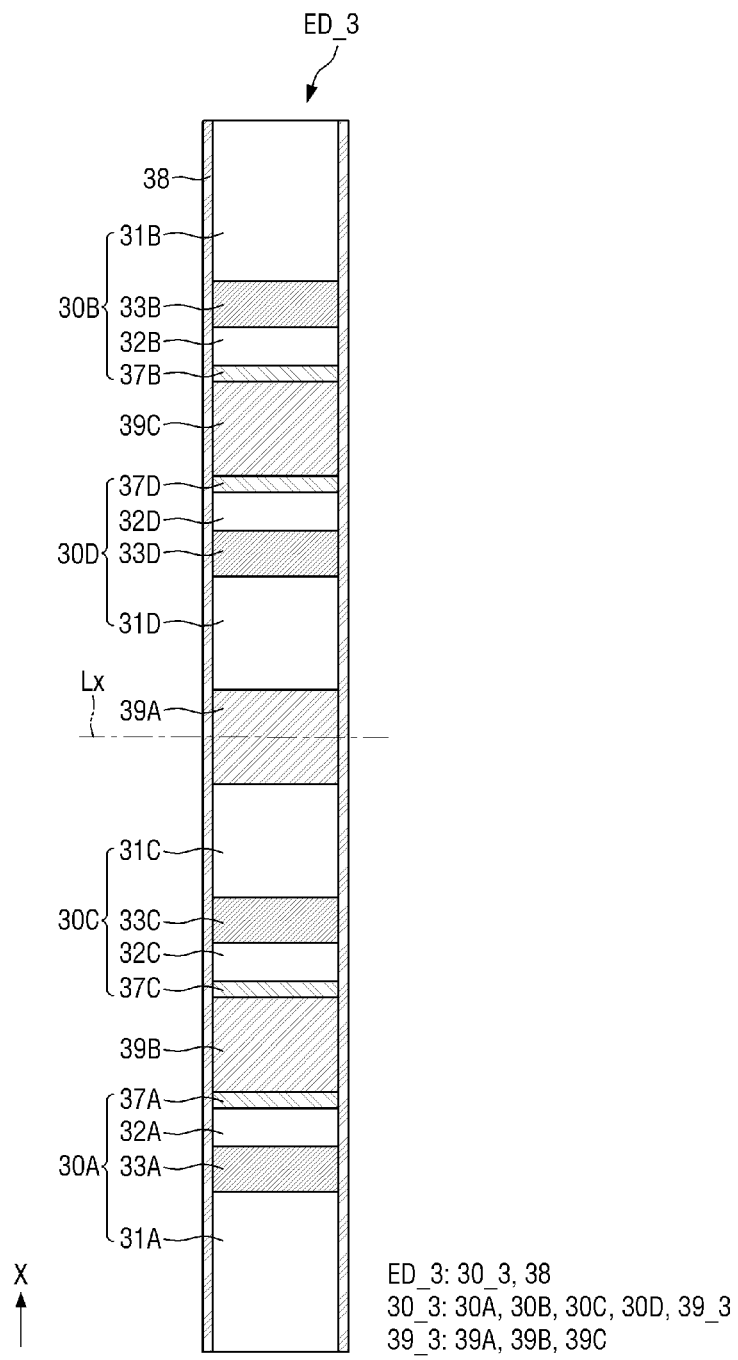
FIG. 26 is a schematic cross-sectional view of a light emitting element according to an embodiment.

FIG. 26 is a schematic cross-sectional view of a light emitting element according to an embodiment.

Referring to FIG. 26, a light emitting element ED_3 according to an embodiment may be different from an embodiment of FIG. 2 in that a core structure 30_3 may include a third light emitting element core 30C, a fourth light emitting element core 30D, and bonding layers 39A, 39B, and 39C.

For example, the core structure 30_3 of the light emitting element ED_3 according to an embodiment may further include the third light emitting element core 30C and the fourth light emitting element core 30D.

The third light emitting element core 30C may be disposed between the first light emitting element core 30A and the second light emitting element core 30B. The third light emitting element core 30C may be spaced apart from each of the first light emitting element core 30A and the second light emitting element core 30B in the one direction X between the first light emitting element core 30A and the second light emitting element core 30B.

The third light emitting element core 30C may have a shape extending in the one direction X. Similar to the first light emitting element core 30A and the second light emitting element core 30B, the third light emitting element core 30C may include a first semiconductor layer 31C, a second semiconductor layer 32C, and an element active layer 33C disposed between the first semiconductor layer 31C and the second semiconductor layer 32C. The third light emitting element core 30C may further include a reflective electrode layer 37C disposed on the second semiconductor layer 32C. The second semiconductor layer 32C of the third light emitting element core 30C may be disposed between the reflective electrode layer 37C of the third light emitting element core 30C and the element active layer 33C of the third light emitting element core 30C. As described above, the first semiconductor layer may be a first conductivity type (for example, n-type) semiconductor layer, and the second semiconductor layer may be a second conductivity type (for example, p-type) semiconductor layer. Therefore, hereinafter, the first semiconductor layer 31C of the third light emitting element core 30C may also be referred to as a third n semiconductor layer 31C, the second semiconductor layer 32C of the third light emitting element core 30C may also be referred to as a third p semiconductor layer 32C, the element active layer 33C of the third light emitting element core 30C may also be referred to as a third element active layer 33C, and the reflective electrode layer 37C of the third light emitting element core 30C may also be referred to as a third reflective electrode layer 37C.

The third n semiconductor layer 31C, the third element active layer 33C, the third p semiconductor layer 32C, and the third reflective electrode layer 37C of the third light emitting element core 30C may be sequentially arranged or disposed along the opposite direction to the one direction X. For example, the stacking direction of the first semiconductor layer 31C, the element active layer 33C, the second semiconductor layer 32C, and the reflective electrode layer 37C of the third light emitting element core 30C may be opposite to the stacking direction of the first semiconductor layer 31A, the element active layer 33A, the second semiconductor layer 32A, and the reflective electrode layer 37A of the first light emitting element core 30A, and may be the same as the stacking direction of the first semiconductor layer 31B, the element active layer 33B, the second semiconductor layer 32B, and the reflective electrode layer 37B of the second light emitting element core 30B.

The fourth light emitting element core 30D may be disposed between the second light emitting element core 30B and the third light emitting element core 30C. The fourth light emitting element core 30D may be spaced apart from each of the second light emitting element core 30B and the third light emitting element 30C in the one direction X between the second light emitting element core 30B and the third light emitting element core 30C.

The fourth light emitting element core 30D may have a shape extending in the one direction X. Similar to the first to third light emitting element cores 30A, 30B, and 30C, the fourth light emitting element core 30D may include a first semiconductor layer 31D, a second semiconductor layer 32D, and an element active layer 33D disposed between the first semiconductor layer 31D and the second semiconductor layer 32D. The fourth light emitting element core 30D may further include a reflective electrode layer 37D disposed on the second semiconductor layer 32D. The second semiconductor layer 32D of the fourth light emitting element core 30D may be disposed between the reflective electrode layer 37D of the fourth light emitting element core 30D and the element active layer 33D of the fourth light emitting element core 30D. Hereinafter, the first semiconductor layer 31D of the fourth light emitting element core 30D may also be referred to as a fourth n semiconductor layer 31D, the second semiconductor layer 32D of the fourth light emitting element core 30D may also be referred to as a fourth p semiconductor layer 32D, the element active layer 33D of the fourth light emitting element core 30D may also be referred to as a fourth element active layer 33D, and the reflective electrode layer 37D of the fourth light emitting element core 30D may also be referred to as a fourth reflective electrode layer 37D.

The fourth n semiconductor layer 31D, the fourth element active layer 33D, the fourth p semiconductor layer 32D, and the fourth reflective electrode layer 37D of the fourth light emitting element core 30D may be sequentially arranged or disposed along the one direction X. For example, the stacking direction of the second semiconductor layer 32D, the element active layer 33D, the second semiconductor layer 32D, and the reflective electrode layer 37D of the fourth light emitting element core 30D may be the same as the stacking direction of the first semiconductor layer 31A, the element active layer 33A, the second semiconductor layer 32A, and the reflective electrode layer 37A of the first light emitting element core 30A, and may be opposite to the stacking direction of the first semiconductor layer 31B, the element active layer 33B, the second semiconductor layer 32B, and the reflective electrode layer 37B of the second light emitting element core 30B.

The core structure 30_3 may include a first type light emitting element core and a second type light emitting element core depending on the stacking direction of the semiconductor layers and the element active layer. The first type light emitting element core may be the light emitting element core in which the first conductivity type semiconductor layer (or the first semiconductor layer or the n-type semiconductor layer), the element active layer, and the second conductivity type semiconductor layer (or the second semiconductor layer or the p-type semiconductor layer) may be stacked each other in the one direction X. The second type light emitting element core may be the light emitting element core in which the first conductivity type semiconductor layer (or the first semiconductor layer or the n-type semiconductor layer), the element active layer, and the second conductivity type semiconductor layer (or the second semiconductor layer or the p-type semiconductor layer) may be stacked each other in the opposite direction to the one direction X. For example, the first light emitting element core 30A and the fourth light emitting element core 30D may be the first type light emitting element cores, and the second light emitting element core 30B and the third light emitting element core 30C may be the second type light emitting element cores.

In the core structure 30_3, the first type light emitting element core and the second type light emitting element core may be arranged or disposed alternately along the one direction X. On the other hand, the core structure 30_3 may be formed such that the first type light emitting element core and the second type light emitting element core may be alternately arranged or disposed along the one direction X, and the first conductivity type semiconductor layers (or the first semiconductor layers or the n-type semiconductor layers) face both ends of the light emitting element ED_3. Therefore, in the core structure 30_3, the first light emitting element core 30A that is the first type light emitting element core, the third light emitting element core 30C that is the second type light emitting element core, the fourth light emitting element core 30D that is the first type light emitting element core, and the second light emitting element core 30B that is the second type light emitting element core may be sequentially arranged or disposed along the one direction X. Further, the first n semiconductor layer 31A of the first light emitting element core 30A may be disposed at one end of the light emitting element ED_3, and the second n semiconductor layer 31B of the second light emitting element core 30B may be disposed at the other end of the light emitting element ED_3.

A bonding layer 39_3 may include bonding layers spaced apart from each other. The bonding layer 39_3 may include a first bonding layer 39A, a second bonding layer 39B, and a third bonding layer 39C. The first bonding layer 39A, the second bonding layer 39B, and the third bonding layer 39C may be spaced apart from each other along the one direction X.

The first bonding layer 39A may be disposed between the third light emitting element core 30C and the fourth light emitting element core 30D. The first bonding layer 39A may physically fix the third light emitting element core 30C and the fourth light emitting element core 30D, and also may electrically connect the third light emitting element core 30C and the fourth light emitting element core 30D. For example, the first bonding layer 39A may be disposed between the third n semiconductor layer 31C of the third light emitting element core 30C and the fourth n semiconductor layer 31D of the fourth light emitting element core 30D to fix and electrically connect them.

The second bonding layer 39B may be disposed between the third light emitting element core 30C and the first light emitting element core 30A. The second bonding layer 39B may physically fix the third light emitting element core 30C and the first light emitting element core 30A, and also may electrically connect the third light emitting element core 30C and the first light emitting element core 30. For example, the second bonding layer 39B may be disposed between the third reflective electrode layer 37C of the third light emitting element core 30C and the first reflective electrode layer 37A of the first light emitting element core 30A to fix and electrically connect them.

The third bonding layer 39C may be disposed between the second light emitting element core 30B and the fourth light emitting element core 30D. The third bonding layer 39C may physically fix the second light emitting element core 30B and the fourth light emitting element core 30D, and also may electrically connect the second light emitting element core 30B and the fourth light emitting element core 30D. For example, the third bonding layer 39C may be disposed between the second reflective electrode layer 37B of the second light emitting element core 30B and the fourth reflective electrode layer 37D of the fourth light emitting element core 30D to fix and electrically connect them.

The element insulating film 38 may be disposed to surround the side surface of the core structure 30_3. The element insulating film 38 may be formed to surround the side surfaces of the first to fourth light emitting element cores 30A, 30B, 30C and 30D and the side surfaces of the first to third bonding layers 39A, 39B, and 39C of the core structure 30_3.

Also in an embodiment, the core structure 30_3 may have the symmetrical structure with respect to the reference line Lx passing through the center of the core structure 30_3 in the other direction intersecting the one direction X.

Hereinafter, the display device including the light emitting element ED_3 of FIG. 26 will be described with reference to other drawings. In the following embodiments, a description of the same components as those of the above-described light emitting element ED_3 will be omitted or simplified, and differences will be described.

Figure 27:
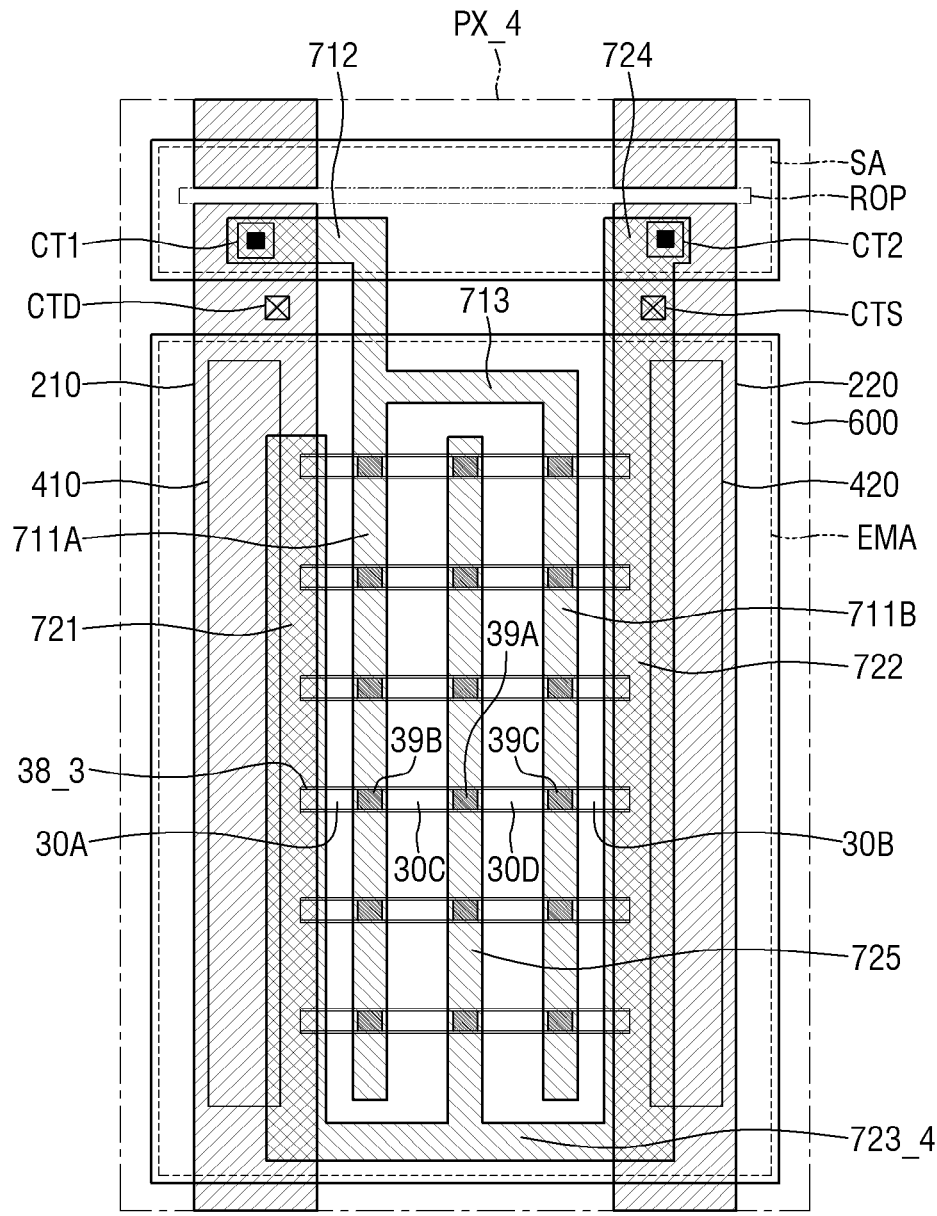
FIG. 27 is a schematic plan view illustrating an example of one pixel of a display device according to an embodiment.
Figure 28:
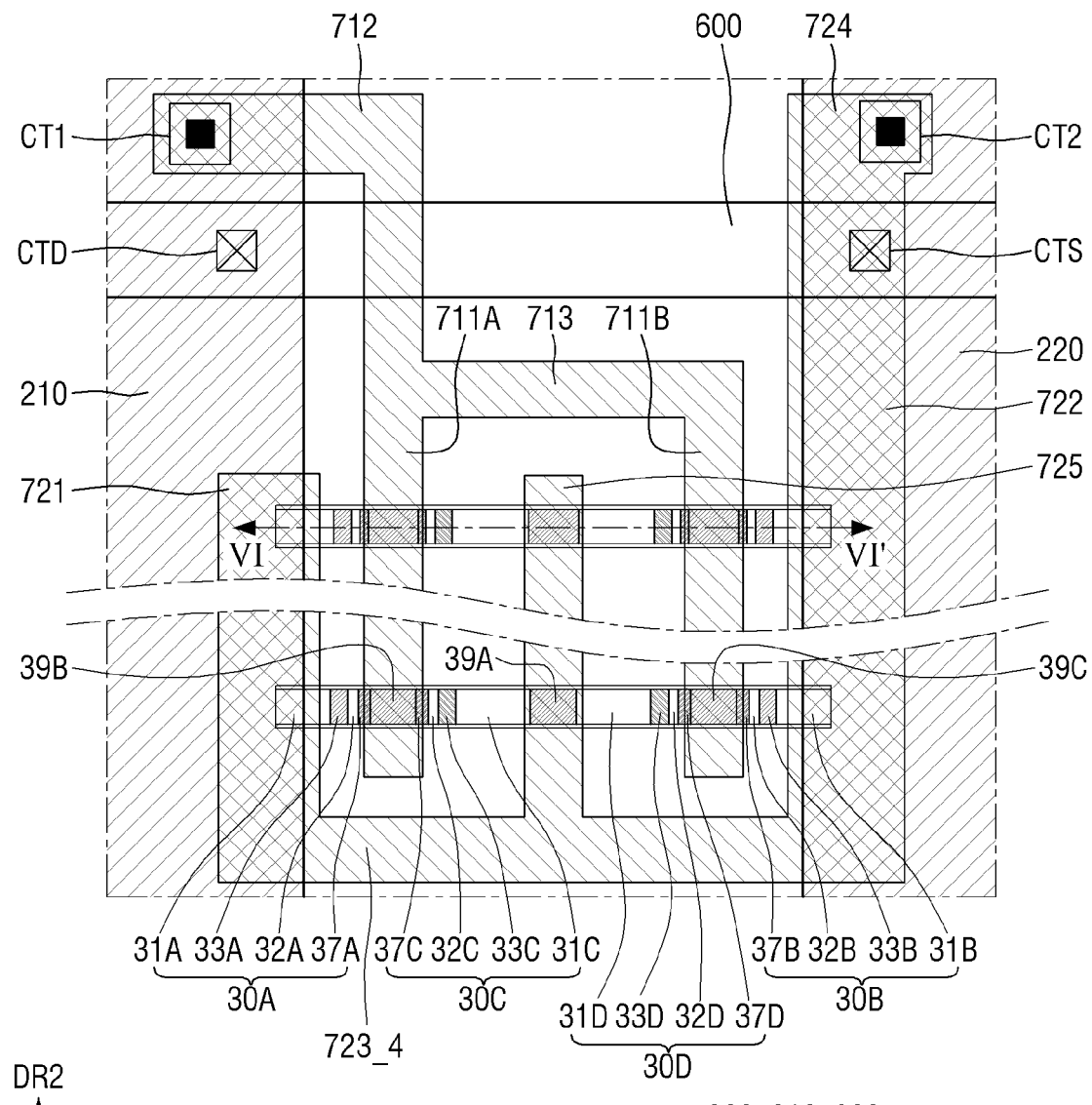
FIG. 28 is an enlarged schematic plan view showing a portion of one pixel of FIG. 27.
Figure 29:
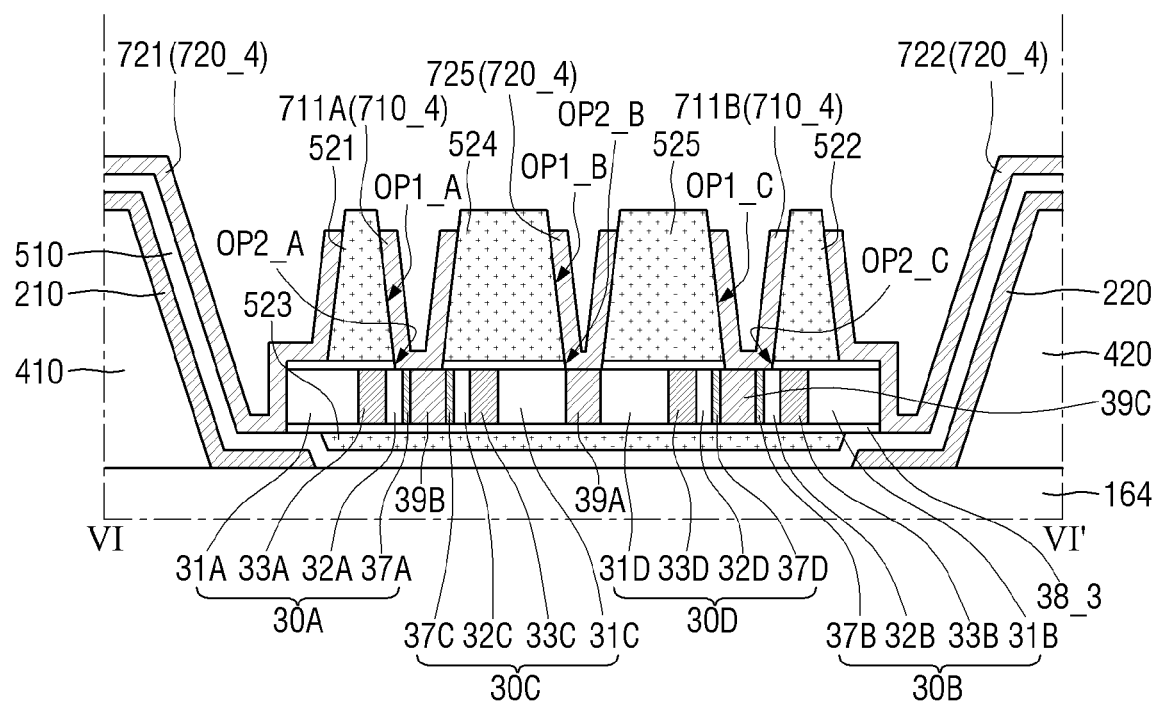
FIG. 29 is a schematic cross-sectional view illustrating an example taken along line VI-VI' of FIG. 28.

FIG. 27 is a schematic plan view illustrating an example of one pixel PX_4 of a display device according to an embodiment. FIG. 28 is an enlarged schematic plan view showing a portion of one pixel of FIG. 27. FIG. 29 is a schematic cross-sectional view illustrating an example taken along line VI-VI' of FIG. 28.

Referring to FIGS. 27 to 29, in the light emitting element ED_3 according to an embodiment, the first end ED_S1 of the light emitting element ED_3 may be disposed on the first electrode 210, and the second end ED_S2 of the light emitting element ED_3 may be disposed on the second electrode 220. In FIGS. 27 to 29, the connection electrode 700_4 may include the first connection electrode 710_4, and a second connection electrode 720_4. For example, the first n semiconductor layer 31A of the first light emitting element core 30A located at the first end ED_S1 of the light emitting element ED_3 may be disposed on the first electrode 210, and the second n semiconductor layer 31B of the second light emitting element core 30B located at the second end ED_S2 of the light emitting element ED_3 may be disposed on the second electrode 220.

The third light emitting element core 30C and the fourth light emitting element core 30D may be spaced apart from each other with the first bonding layer 39A interposed therebetween. The third n semiconductor layer 31C of the third light-emitting element core 30C and the fourth n semiconductor layer 31D of the fourth light emitting element core 30D may face each other with the first bonding layer 39A interposed therebetween. The third n semiconductor layer 31C of the third light emitting element core 30C and the fourth n semiconductor layer 31D of the fourth light emitting element core 30D may be in contact with one surface or a surface and the other surface or another surface of the first bonding layer 39A, respectively.

The first light emitting element core 30A and the third light emitting element core 30C may be spaced apart from each other with the second bonding layer 39B interposed therebetween. The first reflective electrode layer 37A of the first light emitting element core 30A and the third reflective electrode layer 37C of the third light emitting element core 30C may face each other with the second bonding layer 39B interposed therebetween. The first reflective electrode layer 37A of the first light emitting element core 30A and the third reflective electrode layer 37C of the third light emitting element core 30C may be in contact with one surface or a surface and the other surface or another surface of the second bonding layer 39B, respectively.

The second light emitting element core 30B and the fourth light emitting element core 30D may be spaced apart from each other with the third bonding layer 39C interposed therebetween. The second reflective electrode layer 37B of the second light emitting element core 30B and the fourth reflective electrode layer 37D of the fourth light emitting element core 30D may face each other with the third bonding layer 39C interposed therebetween. The second reflective electrode layer 37B of the second light emitting element core 30B and the fourth reflective electrode layer 37D of the fourth light emitting element core 30D may be in contact with one surface or a surface and the other surface or another surface of the third bonding layer 39C, respectively.

A second insulating layer 520_1 may be disposed on the light emitting element ED_3. The second insulating layer 520_1 may be disposed on the light emitting element ED_3, and both ends ED_S1 and ED_S2 of the light emitting element ED_3 and portions of the first to third bonding layers 39A, 39B, and 39C of the light emitting element ED_3 may be exposed.

The second insulating layer 520_1 may include first to fourth fixing patterns 521, 522, 524, and 525, and a filling pattern 523. The first to fourth fixing patterns 521, 522, 524, and 525 may be spaced apart from one another.

The first fixing pattern 521 may be formed on the first light emitting element core 30A to surround the outer surface of the first light emitting element core 30A. The first fixing pattern 521 may be disposed on the first light emitting element core 30A, and one end of the first light emitting element core 30A (for example, the first end ED_S1 of the light emitting element ED_3) and a portion of the second bonding layer 39B may be exposed.

The second fixing pattern 522 may be formed on the second light emitting element core 30B to surround the outer surface of the second light emitting element core 30B. The second fixing pattern 522 may be disposed on the second light emitting element core 30B, and one end of the second light emitting element core 30B (for example, the second end ED_S2 of the light emitting element ED_3) and a portion of the third bonding layer 39C may be exposed.

The third fixing pattern 524 may be formed on the third light emitting element core 30C to surround the outer surface of the third light emitting element core 30C. The third fixing pattern 524 may be disposed on the third light emitting element core 30C, and a portion of the second bonding layer 39B and a portion of the first bonding layer 39A may be exposed.

The fourth fixing pattern 525 may be formed on the fourth light emitting element core 30D to surround the outer surface of the fourth light emitting element core 30D. The fourth fixing pattern 525 may be disposed on the fourth light emitting element core 30D, and a portion of the third bonding layer 39C and a portion of the first bonding layer 39A may be exposed.

An opening OP1_A formed by the sidewalls of the first fixing pattern 521 and the third fixing pattern 524 facing each other while being spaced apart from each other may overlap an opening OP2_A formed by the sidewall of an element insulating film 38_3 exposing the second bonding layer 39B.

An opening OP1_B formed by the sidewalls of the third fixing pattern 524 and the fourth fixing pattern 525 facing each other while being spaced apart from each other may overlap an opening OP2_B formed by the sidewall of the element insulating film 38_3 exposing the first bonding layer 39A. OP1_1 may include opening OP1_A and OP1_B. OP2_1 may include opening OP2_A, OP2_B, and OP2_C.

An opening OP1_C formed by the sidewalls of the fourth fixing pattern 525 and the second fixing pattern 522 facing each other while being spaced apart from each other may overlap an opening OP2_C formed by the sidewall of the element insulating film 38_3 exposing the third bonding layer 39C.

In this manner, the connection electrode 700_3 and the light emitting element ED 3 may be electrically connected through the openings OP1_A, OP1_B, and OP1_C penetrating the second insulating layer 520_1 and the openings OP2_A, OP2_B, and OP2_C penetrating the element insulating film 38_3 and respectively exposing portions of the first to third bonding layers 39A, 39B, and 39C.

A first connection electrode 710_4 may be electrically connected to the second conductivity type (for example, p-type) semiconductor layer of the light emitting element ED_3. The first connection electrode 710_4 may be electrically connected to the reflective electrode layers 37A, 37B, 37C, and 37D of the respective first to fourth light emitting element cores 30A, 30B, 30C, and 30D. For example, the first connection electrode 710_4 may be electrically connected to the second bonding layer 39B and the third bonding layer 39C disposed to be in contact with the first to fourth reflective electrode layers 37A, 37B, 37C, and 37D. The first connection electrode 710_4 may be in contact with a portion of the second bonding layer 39B and a portion of the third bonding layer 39C through the openings OP2_A and OP2_C of the element insulating film 38_3 respectively exposing the second bonding layer 39B and the third bonding layer 39C.

The first connection electrode 711_4 may include a first sub-contact electrode 711A, a second sub-contact electrode 711B, a connection pattern 713, and the first electrode contact pattern 712. Although not limited to the following, the first sub-contact electrode 711A, the second sub-contact electrode 711B, the connection pattern 713, and the first electrode contact pattern 712 of the first connection electrode 710_4 may be integrated to form one pattern.

The first sub-contact electrode 711A of the first connection electrode 710_4 may extend in the fourth direction DR2, and may overlap the second bonding layers 39B of light emitting elements ED 3. The first sub-contact electrode 711A of the first connection electrode 710_4 may be in contact with the second insulating layer 520_1 and the second bonding layer 39B exposed by the element insulating films 38_3 of the light emitting elements ED_3.

The second sub-contact electrode 711B of the first connection electrode 710_4 may be spaced apart from the first sub-contact electrode 711A of the first connection electrode 710_4 in the third direction DR1. The second sub-contact electrode 711B of the first connection electrode 710_4 may extend in the fourth direction DR2, and may overlap the third bonding layers 39C of the light emitting elements ED_3. The second sub-contact electrode 711B of the first connection electrode 710_4 may be in contact with the second insulating layer 520_1 and the third bonding layer 39C exposed by the element insulating films 38_3 of the light emitting elements ED_3.

The connection pattern 713 of the first connection electrode 710_4 may be disposed between the first sub-contact electrode 711A of the first connection electrode 710_4 and the second sub-contact electrode 711B of the first connection electrode 710_4 to connect them.

The first electrode contact pattern 712 of the first connection electrode 710_4 may be electrically connected to the first electrode 210 through the first contact portion CT1.

Since the first connection electrode 710_4 is in contact with each of the second bonding layer 39B and the third bonding layer 39C of the light emitting element ED_3, the electrical signal applied to the first electrode 210 may be transmitted to the first to fourth reflective electrode layers 37A, 37B, 37C, and 37D of the respective first to fourth light emitting element cores 30A, 30B, 30C, and 30D.

The second connection electrode 720_4 may be electrically connected to the first conductivity type (for example, n-type) semiconductor layer of the light emitting element ED_3. The second connection electrode 720_4 may be electrically connected to the first n to fourth n semiconductor layers 31A, 31B, 31C, and 31D of the respective first to fourth light emitting element cores 30A, 30B, 30C, and 30D. For example, the second connection electrode 720_4 may be electrically connected to both ends ED_S1 and ED_S2 of the light emitting element ED_3 where the first n semiconductor layer 31A and the second n semiconductor layer 31B are located, respectively, and the first bonding layer 39A disposed to be in contact with the third n semiconductor layer 31C and the fourth n semiconductor layer 31D. The second connection electrode 720_4 may be in contact with a portion of the first bonding layer 39A through the opening OP2_B of the element insulating film 38_3 exposing the first bonding layer 39A.

The second connection electrode 720_4 may include the first sub-contact electrode 721, the second sub-contact electrode 722, a third sub-contact electrode 725, a connection pattern 723_4, and the second electrode contact pattern 724. Although not limited to the following, the first sub-contact electrode 721, the second sub-contact electrode 722, the third sub-contact electrode 725, the connection pattern 723_4, and the second electrode contact pattern 724 of the second connection electrode 720_4 may be integrated to form one pattern.

The first sub-contact electrode 721 of the second connection electrode 720_4 may be disposed on the first electrode 210, and may extend in the fourth direction DR2. The first sub-contact electrode 721 of the second connection electrode 720_4 may be in contact with the first end ED_S1 of the light emitting element ED_3 exposed by the second insulating layer 520_1.

The second sub-contact electrode 722 of the second connection electrode 720_4 may be spaced apart from the first sub-contact electrode 721 of the second connection electrode 720_4 in the third direction DR1. The second sub-contact electrode 722 of the second connection electrode 720_4 may be disposed on the second electrode 220, and may extend in the fourth direction DR2. The second sub-contact electrode 722 of the second connection electrode 720_4 may be in contact with the second end ED_S2 of the light emitting element ED_3 exposed by the second insulating layer 520_1.

The third sub-contact electrode 725 of the second connection electrode 720_4 and the first and second sub-contact electrodes 721 and 722 of the second connection electrode 720_4 may be spaced apart from each other in the third direction DR1. The third sub-contact electrode 725 of the second connection electrode 720_4 may extend in the fourth direction DR2, and may overlap the first bonding layers 39A of the light emitting elements ED_3. The third sub-contact electrode 725 of the second connection electrode 720_4 may be in contact with the second insulating layer 520_1 and the first bonding layer 39A exposed by the element insulating films 38_3 of the light emitting elements ED_3.

The connection pattern 723 of the second connection electrode 720_4 may connect the first to third sub-contact electrodes 721, 722, and 725 of the second connection electrode 720_4.

The second electrode contact pattern 724 of the second connection electrode 720_4 may be electrically connected to the second electrode 220 through the second contact portion CT2.

Since the second connection electrode 720_4 is in contact with both ends ED_S1 and ED_S2 of the light emitting element ED_3 and the first bonding layer 39A, the electrical signal applied to the second electrode 210 may be transmitted to the first n to fourth n semiconductor layers 31A, 31B, 31C, and 31D of the respective first to fourth light emitting element cores 30A, 30B, 30C, and 30D.

Although it is illustrated in FIG. 29 that the first connection electrode 710_4 and the second connection electrode 720_4 are formed on a same layer, the disclosure is not limited thereto. For example, the first connection electrode 710_4 and the second connection electrode 720_4 may be formed on different layers, and an insulating layer may be formed between the first connection electrode 710_4 and the second connection electrode 720_4 to insulate them. Since the first connection electrode 710_4 and the second connection electrode 720_4 are formed by different processes and the process of forming the insulating layer is added, the processing efficiency of the display device 10 may be reduced. However, it is possible to minimize the problem that the first connection electrode 710_4 and the second connection electrode 720_4 are short-circuited in the manufacturing process of the display device 10.

Figure 30:
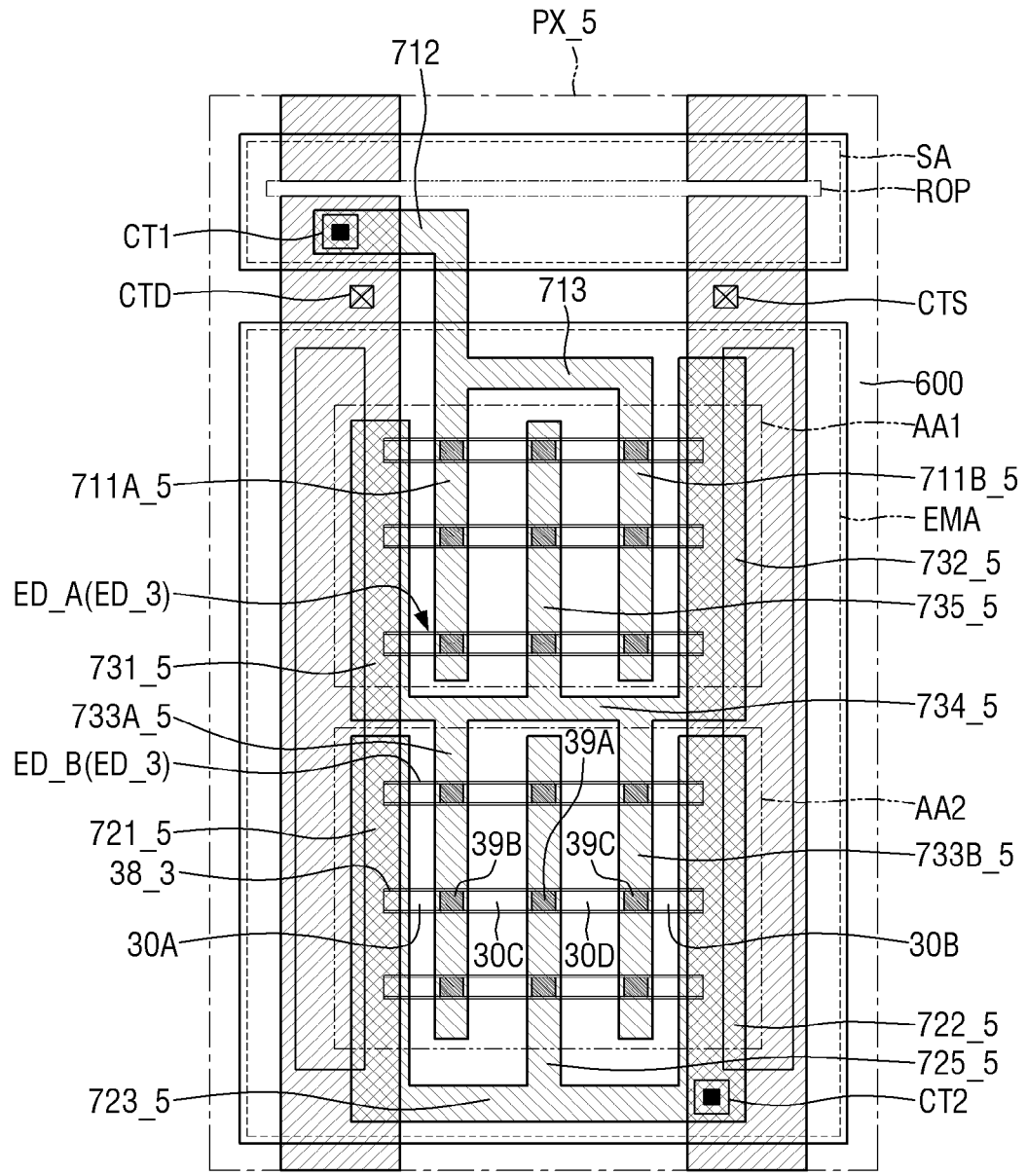
FIG. 30 is a schematic plan view illustrating another example of one pixel of a display device according to an embodiment.

FIG. 30 is a schematic plan view illustrating another example of one pixel PX_5 of a display device according to an embodiment.

Referring to FIG. 30, an embodiment may be different from an embodiment of FIG. 29 in that a third connection electrode 730_5 is further included to connect the first light emitting element ED_A disposed in the first alignment area AA1 and the second light emitting element ED_B disposed in the second alignment area AA2 in series. A first connection electrode 710_5 and a second connection electrode 720_5 of a connection electrode 700_5, a first sub-contact electrode 711A_5 and a second sub-contact electrode 711B_5 of the first connection electrode 710_5, a first sub-contact electrode 721_5, a second sub-contact electrode 722_5, a third sub-contact electrode 725_5, and a connection pattern 723_5 of the second connection electrode 720_5, are substantially the same as the embodiments.

For example, some or a number of regions 731_5, 732_5, and 735_5 of the third connection electrode 730_5 may be in contact with both ends ED_S1 and ED_S2 of the first light emitting element ED_A and the first bonding layer 39A, some or a number of other regions 733A_5 and 733B_5 of the third connection electrode 730_5 may be in contact with the second and third bonding layers 39B and 39C of the second light emitting element ED_B, and another region 734_5 of the third connection electrode 730_5 may connect them. Therefore, the first light emitting element ED_A and the second light emitting element ED_B may be connected in series through the third connection electrode 730_5.

In concluding the detailed description, those skilled in the art will appreciate that many variations and modifications can be made to the described embodiments without substantially departing from the principles of the disclosure. Therefore, the disclosed embodiments are used in a generic and descriptive sense only and not for purposes of limitation.

What is claimed is:

1. A light emitting element comprising:
a core structure extending in a first direction, the core structure including:
a first light emitting element core extending in the first direction;
a second light emitting element core spaced apart from the first light emitting element core and extending in the first direction; and
a first bonding layer disposed between the first light emitting element core and the second light emitting element core, wherein
each of the first light emitting element core, the first bonding layer and the second light emitting element core have a same cross-sectional area and a same cross-sectional shape,
each of the first light emitting element core and the second light emitting element core includes:
a first semiconductor layer;
a second semiconductor layer spaced apart from the first semiconductor layer; and
an element active layer disposed between the first semiconductor layer and the second semiconductor layer, and
a stacking direction of the first semiconductor layer, the element active layer, and the second semiconductor layer of the first light emitting element core is opposite to a stacking direction of the first semiconductor layer, the element active layer and the second semiconductor layer of the second light emitting element core.

2. The light emitting element of claim 1, wherein
the first semiconductor layer, the element active layer, and the second semiconductor layer in the first light emitting element core are sequentially disposed in the first direction, and
the first semiconductor layer, the element active layer, and the second semiconductor layer in the second light emitting element core are sequentially disposed in a direction opposite to the first direction.

3. The light emitting element of claim 1, wherein
the second light emitting element core is spaced apart from the first light emitting element core in the first direction, and
each of the first light emitting element core, the first bonding layer and the second light emitting element core have a circular cross section having a same diameter.

4. The light emitting element of claim 3, wherein
the first semiconductor layer of each of the first light emitting element core and the second light emitting element core is doped with a first conductivity type dopant, and
the second semiconductor layer of each of the first light emitting element core and the second light emitting element core is doped with a second conductivity type dopant.

5. The light emitting element of claim 4, wherein the first conductivity type is an n type, and the second conductivity type is a p type.

6. The light emitting element of claim 5, wherein
the first semiconductor layer of the first light emitting element core is disposed at a first end of the light emitting element, and
the first semiconductor layer of the second light emitting element core is disposed at a second end of the light emitting element.

7. The light emitting element of claim 1, wherein the core structure has a symmetrical structure with respect to a reference line passing through a center of the core structure in a second direction intersecting the first direction.

8. The light emitting element of claim 1, further comprising:
an element insulating film surrounding a side surface of the core structure.

9. The light emitting element of claim 1, wherein
each of the first light emitting element core and the second light emitting element core includes a reflective electrode layer,
the reflective electrode layer of the first light emitting element core is disposed between and directly contacts the second semiconductor layer of the first light emitting element core and the first bonding layer, and
the reflective electrode layer of the second light emitting element core is disposed between and directly contacts the second semiconductor layer of the second light emitting element core and the first bonding layer.

10. The light emitting element of claim 9, wherein
each of the reflective electrode layers include a reflective metal selected from aluminum and silver or include a distributed Bragg reflector (DBR) layer,
the light emitting element includes a first end opposite a second end,
the first semiconductor layer of the first light emitting element core is disposed at the first end,
the first semiconductor layer of the second light emitting element core is disposed at the second end,
the reflective electrode of the first light emitting element core redirects light produced by the element active layer of the first light emitting element core and traveling towards the bonding layer back towards the first end, and
the reflective electrode of the second light emitting element core redirects light produced by the element active layer of the second light emitting element core and traveling towards the bonding layer back towards the second end.

11. The light emitting element of claim 1, wherein the first bonding layer includes a eutectic metal alloy or a fusible metal alloy.

12. The light emitting element of claim 11, wherein the first bonding layer electrically connects the first light emitting element core to the second light emitting element core.

13. The light emitting element of claim 1, wherein the core structure further includes:
a third light emitting element core disposed between the first light emitting element core and the first bonding layer;
a fourth light emitting element core disposed between the second light emitting element core and the first bonding layer;
a second bonding layer disposed between the first light emitting element core and the third light emitting element core; and
a third bonding layer disposed between the second light emitting element core and the fourth light emitting element core.

14. The light emitting element of claim 13, wherein each of the third light emitting element core and the fourth light emitting element core includes:
a first semiconductor layer;
a second semiconductor layer spaced apart from the first semiconductor layer; and
an element active layer disposed between the first semiconductor layer and the second semiconductor layer.

15. The light emitting element of claim 14, wherein
a stacking direction of the first semiconductor layer, the element active layer, and the second semiconductor layer of the third light emitting element core is same as a stacking direction of the second light emitting element core, and
a stacking direction of the first semiconductor layer, the element active layer, and the second semiconductor layer of the fourth light emitting element core is same as a stacking direction of the first light emitting element core.

16. The light emitting element of claim 1, wherein
a length of the first semiconductor layer of the first light emitting element core is greater than a length of the second semiconductor layer of the first light emitting element core,
a length of the first semiconductor layer of the second light emitting element core is greater than a length of the second semiconductor layer of the second light emitting element core, and
the first semiconductor layer of the first light emitting element core and the first semiconductor layer of the second light emitting element core are disposed at both ends of the light emitting element, respectively.

17. A display device comprising:
a first electrode and a second electrode disposed on a substrate and spaced apart from each other; and
a light emitting element including a core structure extending in a first direction, wherein
the core structure includes:
a first light emitting element core extending in the first direction;
a second light emitting element core spaced apart from the first light emitting element core and extending in the first direction; and
a bonding layer disposed between the first light emitting element core and the second light emitting element core, wherein
side surfaces of each of the first light emitting element core, the bonding layer, and the second light emitting element core are aligned with each other,
each of the first light emitting element core and the second light emitting element core includes:
a first semiconductor layer;
a second semiconductor layer spaced apart from the first semiconductor layer; and an element active layer disposed between the first semiconductor layer and the second semiconductor layer, and a stacking direction of the first semiconductor layer, the element active layer, and the second semiconductor layer of the first light emitting element core is opposite to a stacking direction of the first semiconductor layer, the element active layer and the second semiconductor layer of the second light emitting element core.

18. The display device of claim 17, wherein the first semiconductor layer, the element active layer, and the second semiconductor layer in the first light emitting element core are sequentially disposed in the first direction, and the first semiconductor layer, the element active layer, and the second semiconductor layer in the second light emitting element core are sequentially disposed in a direction opposite to the first direction.

19. The display device of claim 18, wherein the first semiconductor layer of the first light emitting element core is disposed at a first end of the light emitting element, and the first semiconductor layer of the second light emitting element core is disposed at a second end of the light emitting element.

20. A display device comprising:

a first electrode and a second electrode disposed on a substrate and spaced apart from each other; and a light emitting element including a core structure extending in a first direction, wherein the core structure includes:
- a first light emitting element core extending in the first direction;
- a second light emitting element core spaced apart from the first light emitting element core and extending in the first direction; and
- a bonding layer disposed between the first light emitting element core and the second light emitting element core, each of the first light emitting element core and the second light emitting element core includes:
- a first semiconductor layer:
- a second semiconductor layer spaced apart from the first semiconductor layer; and
- an element active layer disposed between the first semiconductor layer and the second semiconductor layer, and a stacking direction of the first semiconductor layer, the element active layer and the second semiconductor layer of the first light emitting element core is opposite to a stacking direction of the first semiconductor laver, the element active layer and the second semiconductor layer of the second light emitting element core;

a first connection electrode electrically connected to the first electrode and the bonding layer; and a second connection electrode electrically connected to the second electrode and ends of the light emitting element.

21. The display device of claim 20, wherein the first connection electrode electrically contacts a portion of the first electrode and a portion of the bonding layer, and the second connection electrode electrically contacts a portion of the second electrode and ends of the light emitting element.

22. The display device of claim 21, wherein the light emitting element includes an element insulating film surrounding a side surface of the core structure.

23. The display device of claim 22, wherein the element insulating film exposes at least a portion of the bonding layer.

24. The display device of claim 23, wherein the first connection electrode contacts the bonding layer exposed by the element insulating film.

* * * * *